(12) United States Patent
Okumura

(10) Patent No.: US 12,349,350 B2
(45) Date of Patent: Jul. 1, 2025

(54) SEMICONDUCTOR MEMORY DEVICE

(71) Applicant: KIOXIA CORPORATION, Tokyo (JP)

(72) Inventor: Yusuke Okumura, Yokkaichi (JP)

(73) Assignee: KIOXIA CORPORATION, Tokyo (JP)

( * ) Notice: Subject to any disclaimer, the term of this patent is extended or adjusted under 35 U.S.C. 154(b) by 567 days.

(21) Appl. No.: 17/694,009

(22) Filed: Mar. 14, 2022

(65) Prior Publication Data

US 2023/0082844 A1      Mar. 16, 2023

(30) Foreign Application Priority Data

Sep. 16, 2021   (JP) ................. 2021-151613

(51) Int. Cl.
| | |
|---|---|
| H10B 43/27 | (2023.01) |
| G11C 16/04 | (2006.01) |
| H10B 41/10 | (2023.01) |
| H10B 41/27 | (2023.01) |
| H10B 41/40 | (2023.01) |
| H10B 43/10 | (2023.01) |
| H10B 43/40 | (2023.01) |

(52) U.S. Cl.
CPC ......... *H10B 43/27* (2023.02); *G11C 16/0483* (2013.01); *H10B 41/10* (2023.02); *H10B 41/27* (2023.02); *H10B 41/40* (2023.02); *H10B 43/10* (2023.02); *H10B 43/40* (2023.02)

(58) Field of Classification Search
CPC ........ H10B 43/27; H10B 41/10; H10B 41/27; H10B 41/40; H10B 43/10; H10B 43/40; H10B 43/50; G11C 16/0483
See application file for complete search history.

(56) References Cited

U.S. PATENT DOCUMENTS

| | | | |
|---|---|---|---|
| 10,804,286 B2 | 10/2020 | Takamura et al. | |
| 2015/0255386 A1* | 9/2015 | Lee | H10B 43/27 |
| | | | 257/774 |
| 2016/0268269 A1 | 9/2016 | Ichinose | |
| 2017/0271256 A1 | 9/2017 | Inatsuka | |

(Continued)

FOREIGN PATENT DOCUMENTS

JP          2019-153735 A      9/2019

*Primary Examiner* — Joseph C. Nicely
*Assistant Examiner* — Alvin L Lee
(74) *Attorney, Agent, or Firm* — Oblon, McClelland, Maier & Neustadt, L.L.P.

(57) ABSTRACT

A semiconductor memory device includes a substrate including a first region and a second region arranged in a first direction, conductive layers arranged in a second direction and extending in the first direction, a semiconductor layer disposed in the first region and opposed to the conductive layers, contact electrodes disposed in the second region and electrically connected to the conductive layers, and a first structure connected to a first contact electrode in the contact electrodes and a terrace portion of a first conductive layer in the conductive layers. The first structure includes a first conductive portion, a second conductive portion, and a third conductive portion. The first conductive portion extends in the first direction. The second conductive portion and the third conductive portion are connected to one end portion or the other end portion of the first conductive portion in the first direction and the first conductive layer.

20 Claims, 71 Drawing Sheets

(56) References Cited

U.S. PATENT DOCUMENTS

2018/0130701 A1\* 5/2018 Chun .................... H10B 41/27
2019/0043876 A1\* 2/2019 van Schravendijk ........................
                                                           G11C 16/0466

\* cited by examiner

SEMICONDUCTOR MEMORY DEVICE

CROSS-REFERENCE TO RELATED APPLICATIONS

This application is based upon and claims the benefit of Japanese Patent Application No. 2021-151613, filed on Sep. 16, 2021, the entire contents of which are incorporated herein by reference.

BACKGROUND

Field

Embodiments described herein relate generally to a semiconductor memory device.

Description of the Related Art

There has been known a semiconductor memory device that includes a substrate, a plurality of conductive layers stacked in a direction intersecting with a surface of this substrate, a semiconductor layer opposed to these plurality of conductive layers, and a gate insulating layer disposed between the plurality of conductive layers and the semiconductor layer. The gate insulating layer includes a memory unit that can store data, and the memory unit is, for example, an insulating electric charge accumulating film of silicon nitride (SiN) or the like and a conductive electric charge accumulating film, such as a floating gate.

DETAILED DESCRIPTION

Figure 1:
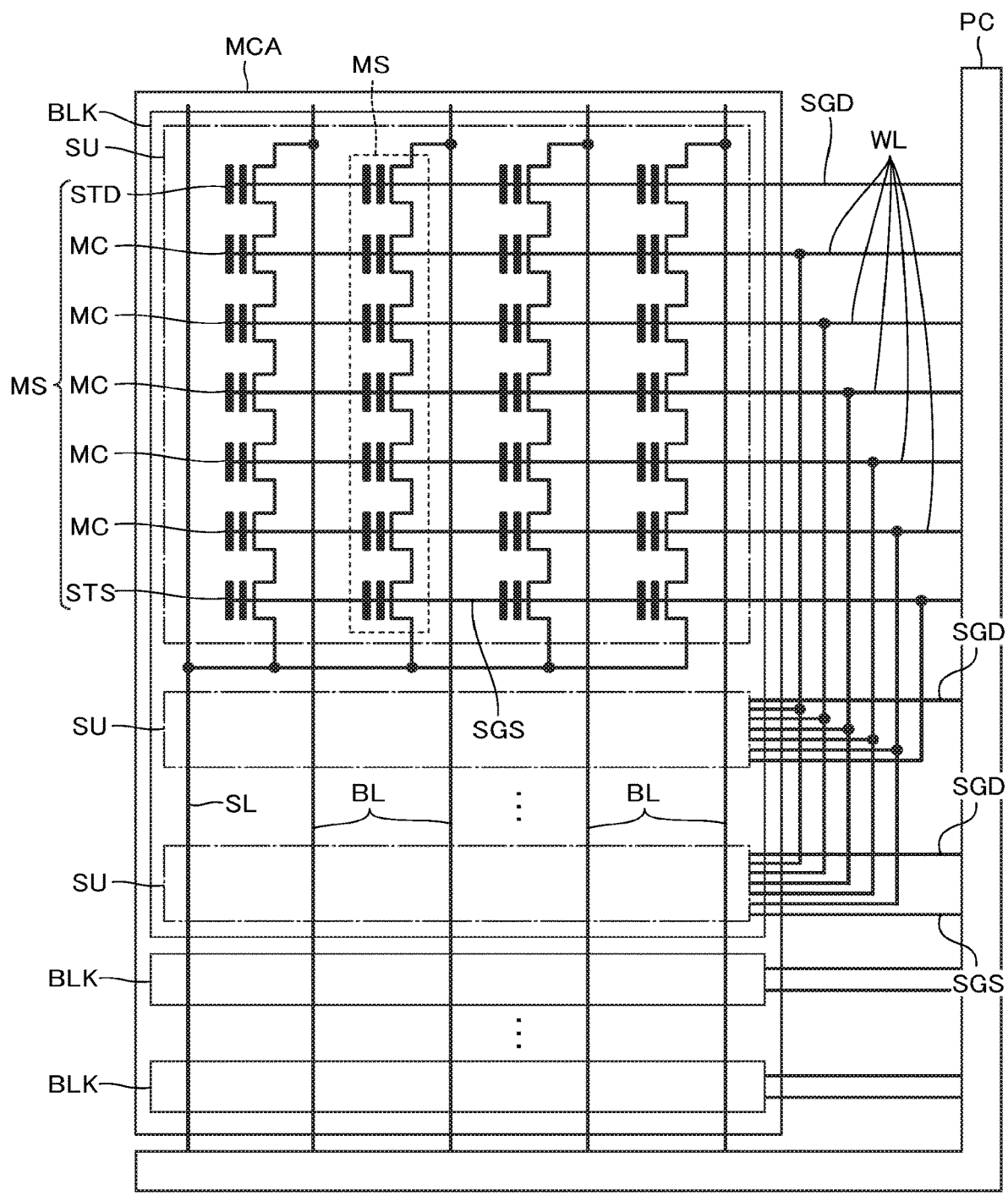
FIG. 1 is a schematic circuit diagram illustrating a configuration of a semiconductor memory device according to a first embodiment.

A semiconductor memory device according to one embodiment comprises: a substrate including a first region and a second region arranged in a first direction; a plurality of conductive layers arranged in a second direction intersecting with a surface of the substrate and extending in the first direction across the first region and the second region; a semiconductor layer disposed in the first region, extending in the second direction, and opposed to the plurality of conductive layers; an electric charge accumulating film disposed between the plurality of conductive layers and the semiconductor layer; a plurality of contact electrodes disposed in the second region, extending in the second direction, and electrically connected to the plurality of conductive layers; and a first structure connected to one end portion in the second direction of a first contact electrode which is one of the plurality of contact electrodes and connected to a terrace portion of a first conductive layer which is one of the plurality of conductive layers. The first structure includes a first conductive portion, a second conductive portion, and a third conductive portion. The first conductive portion extends in the first direction. The second conductive portion extends in the second direction and is connected to one end portion of the first conductive portion in the first direction and the first conductive layer. The third conductive portion extends in the second direction and is connected to the other end portion of the first conductive portion in the first direction and the first conductive layer.

Next, the semiconductor memory devices according to embodiments are described in detail with reference to the drawings. The following embodiments are only examples, and not described for the purpose of limiting the present invention. The following drawings are schematic, and for convenience of description, apart of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

A "control circuit" in this specification may mean a peripheral circuit, such as a sequencer, disposed in a memory die, may mean a controller die, a controller chip, or the like connected to a memory die, and may mean a configuration including both of them.

In this specification, when it is referred that a first configuration "is electrically connected" to a second configuration, the first configuration may be directly connected to the second configuration, or the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

In this specification, when referring to a "width", a "length", a "thickness", or the like in a predetermined direction of a configuration, a member, or the like, this may mean a width, a length, a thickness, or the like in a cross-section or the like observed with a Scanning electron microscopy (SEM), a Transmission electron microscopy (TEM), or the like.

First Embodiment

[Circuit Configuration]

FIG. 1 is a schematic circuit diagram illustrating a configuration of a semiconductor memory device according to the first embodiment. As illustrated in FIG. 1, the semiconductor memory device according to the first embodiment includes a memory cell array MCA and a peripheral circuit PC.

The memory cell array MCA includes a plurality of memory blocks BLK. These plurality of memory blocks BLK each include a plurality of string units SU. These plurality of string units SU each include a plurality of memory strings MS. These plurality of memory strings MS have one ends each connected to the peripheral circuit PC via a bit line BL. These plurality of memory strings MS have the other ends each connected to the peripheral circuit PC via a common source line SL.

The memory string MS includes a drain-side select transistor STD, a plurality of memory cells MC (memory transistors), and a source-side select transistor STS. The drain-side select transistor STD, the plurality of memory cells MC, and the source-side select transistor STS are connected in series between the bit line BL and the source line SL. Hereinafter, the drain-side select transistor STD and the source-side select transistor STS may be simply referred to as select transistors (STD, STS).

The memory cell MC is a field-effect type transistor. The memory cell MC includes a semiconductor layer, a gate insulating film, and a gate electrode. The semiconductor layer functions as a channel region. The gate insulating film includes an electric charge accumulating film. A threshold voltage of the memory cell MC varies corresponding to an electric charge amount in the electric charge accumulating film. The memory cell MC stores data of 1 bit or a plurality of bits. The gate electrodes of the plurality of memory cells MC corresponding to one memory string MS are connected to respective word lines WL. Each of these word lines WL is commonly connected to all of the memory strings MS in one memory block BLK.

The select transistors (STD, STS) are field-effect type transistors. The select transistors (STD, STS) each include a semiconductor layer, a gate insulating film, and a gate electrode. The semiconductor layer functions as a channel region. The gate electrodes of the select transistors (STD, STS) are connected to select gate lines (SGD, SGS), respectively. One drain-side select gate line SGD is commonly connected to all of the memory strings MS in one string unit SU. One source-side select gate line SGS is commonly connected to all of the memory strings MS in a plurality of string units SU.

The peripheral circuit PC includes, for example, a voltage generation circuit that generates an operating voltage, a voltage transfer circuit that transfers the generated operating voltage to selected bit line BL, word line WL, source line SL, select gate lines (SGD, SGS), and the like, a sense amplifier module connected to the bit lines BL, and a sequencer that controls them.

[Structure]

Figure 2:
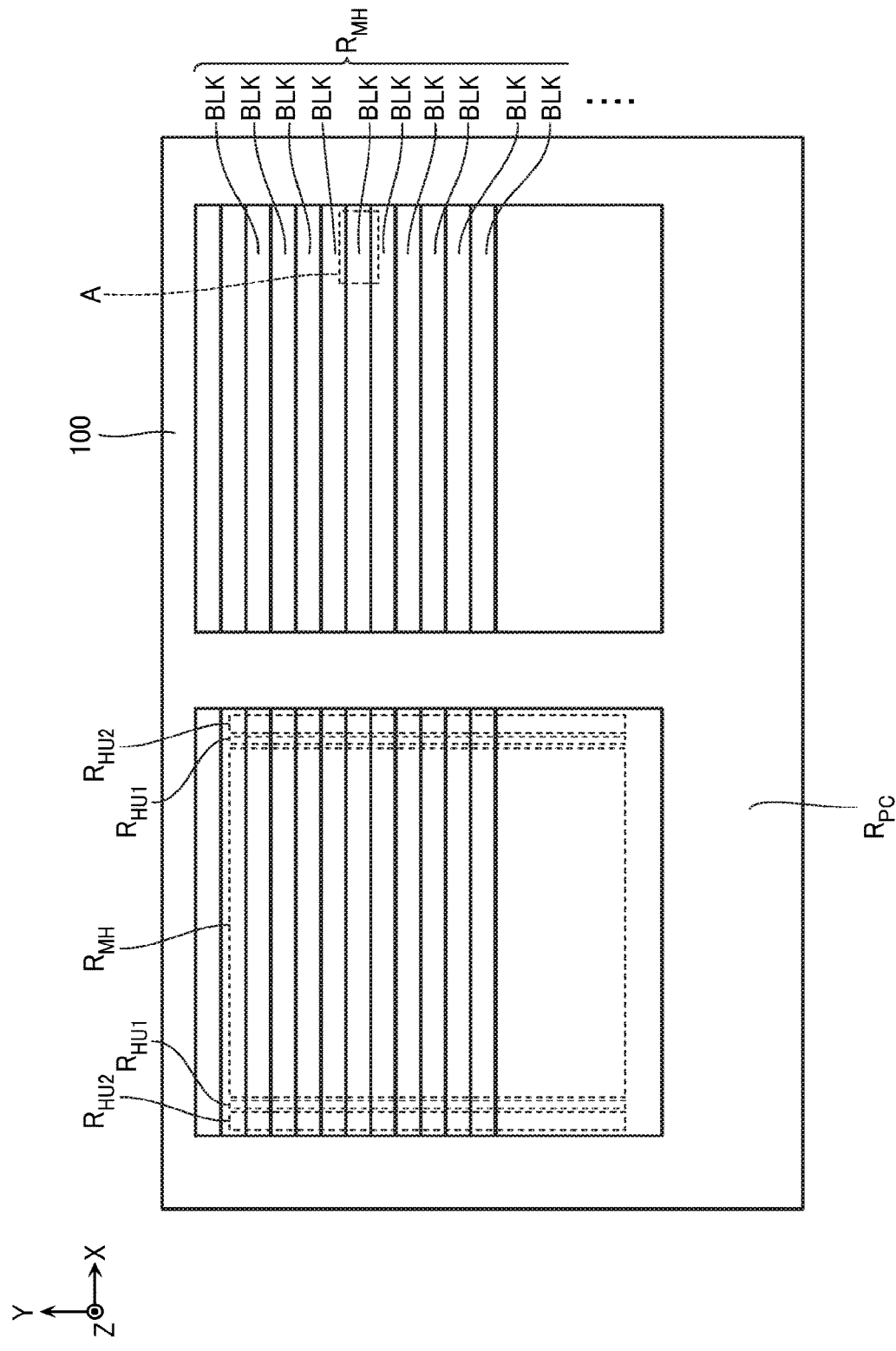
FIG. 2 is a schematic plan view of the semiconductor memory device.
Figure 3:
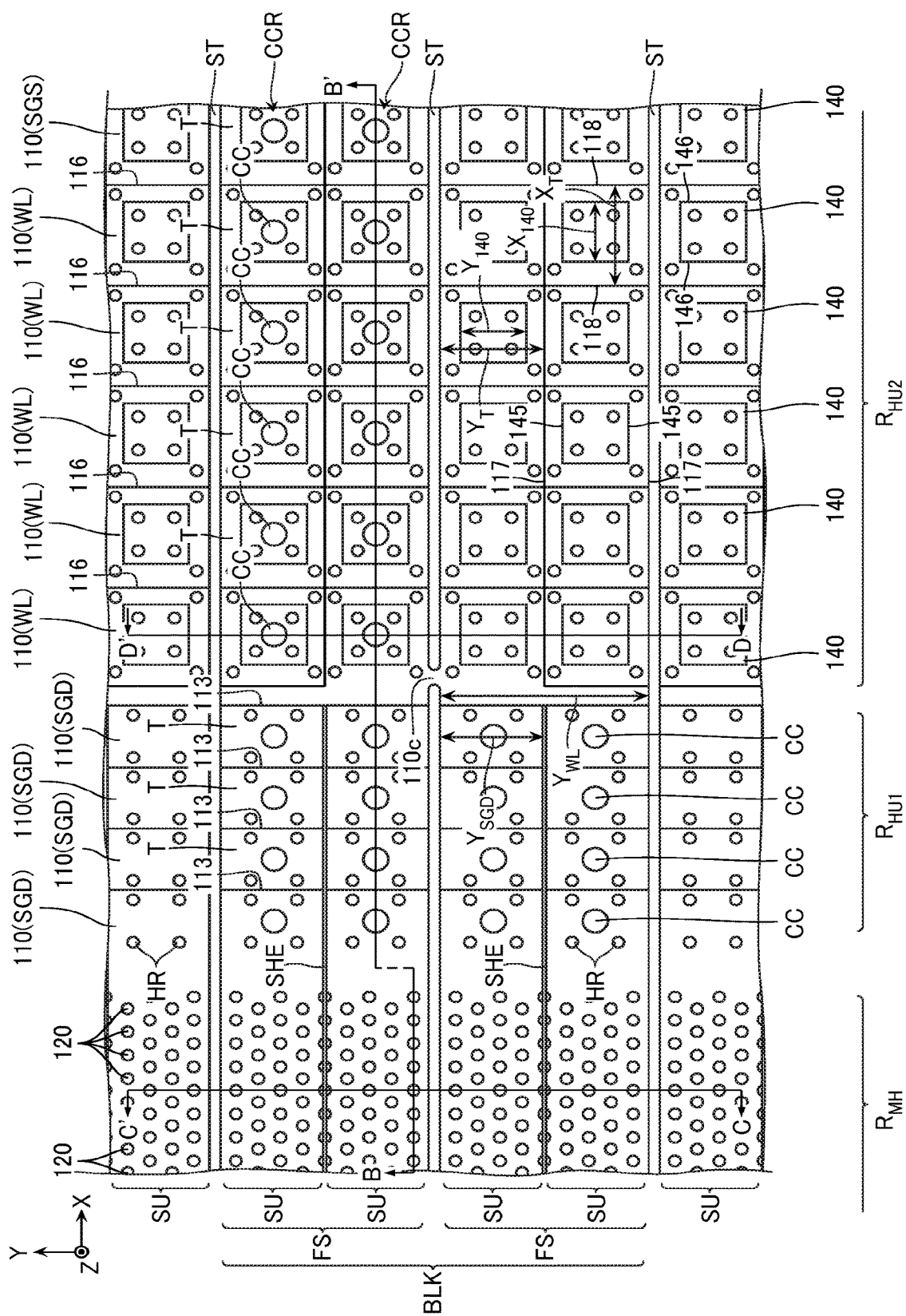
FIG. 3 is a schematic enlarged view of a part indicated by A in FIG. 2.
Figure 4:
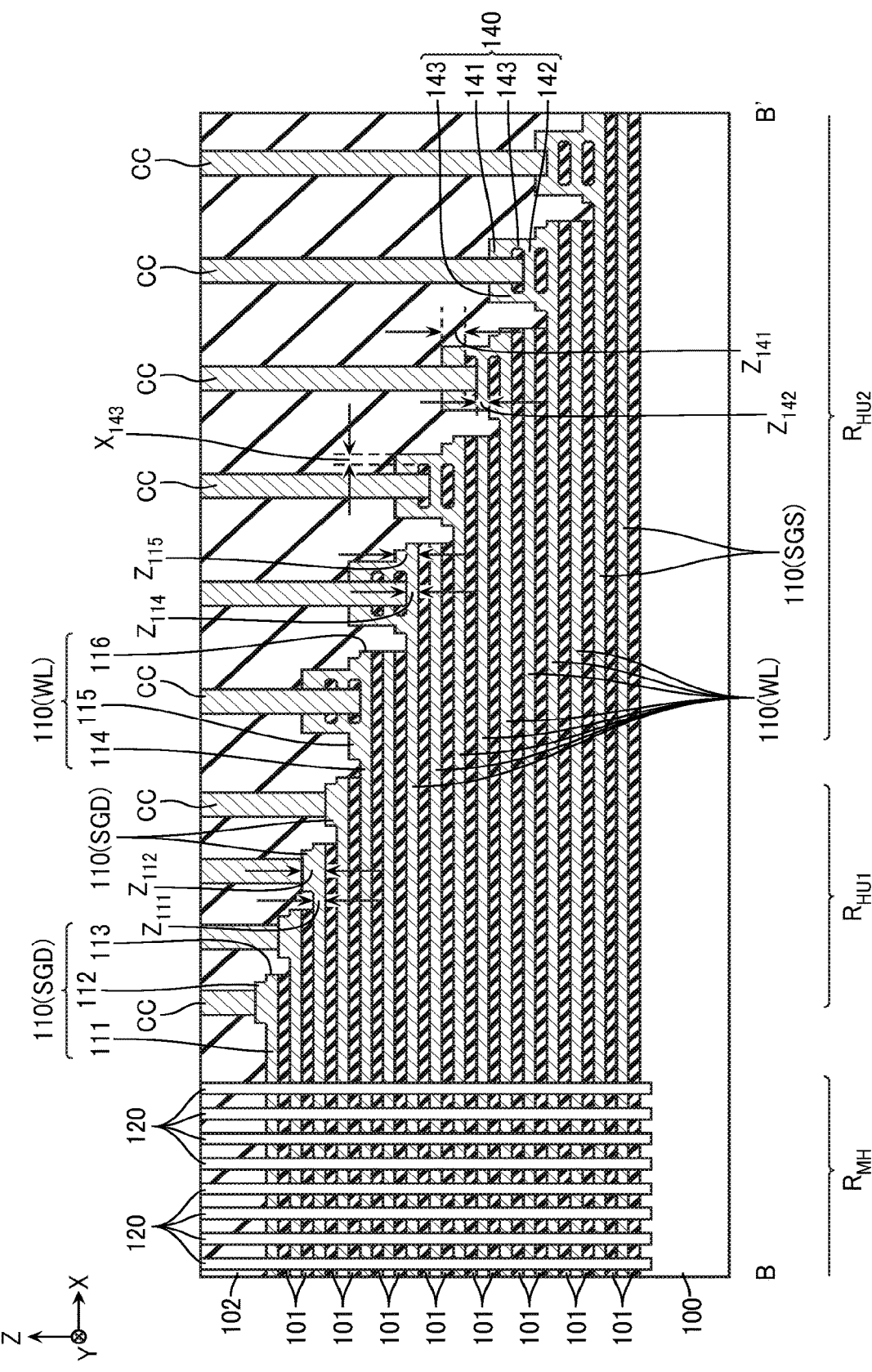
FIG. 4 is a schematic cross-sectional view of the structure illustrated in FIG. 3 taken along a line B-B' viewed in an arrow direction.
Figure 5:
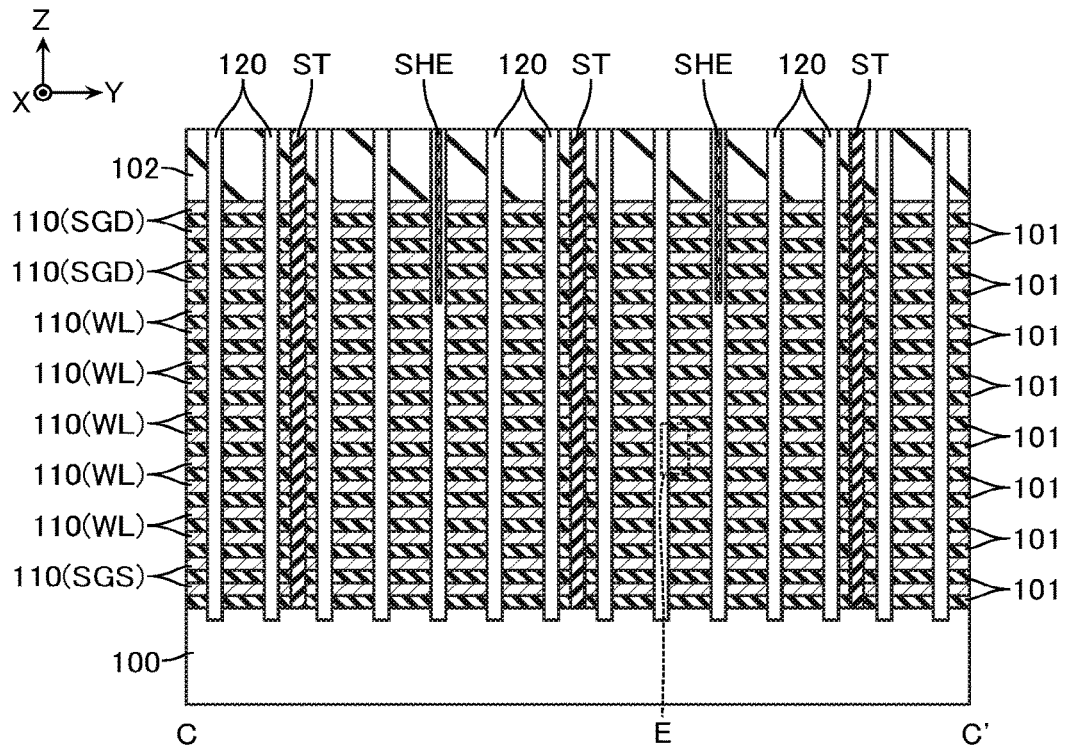
FIG. 5 is a schematic cross-sectional view of the structure illustrated in FIG. 3 taken along a line C-C' viewed in an arrow direction.
Figure 6:
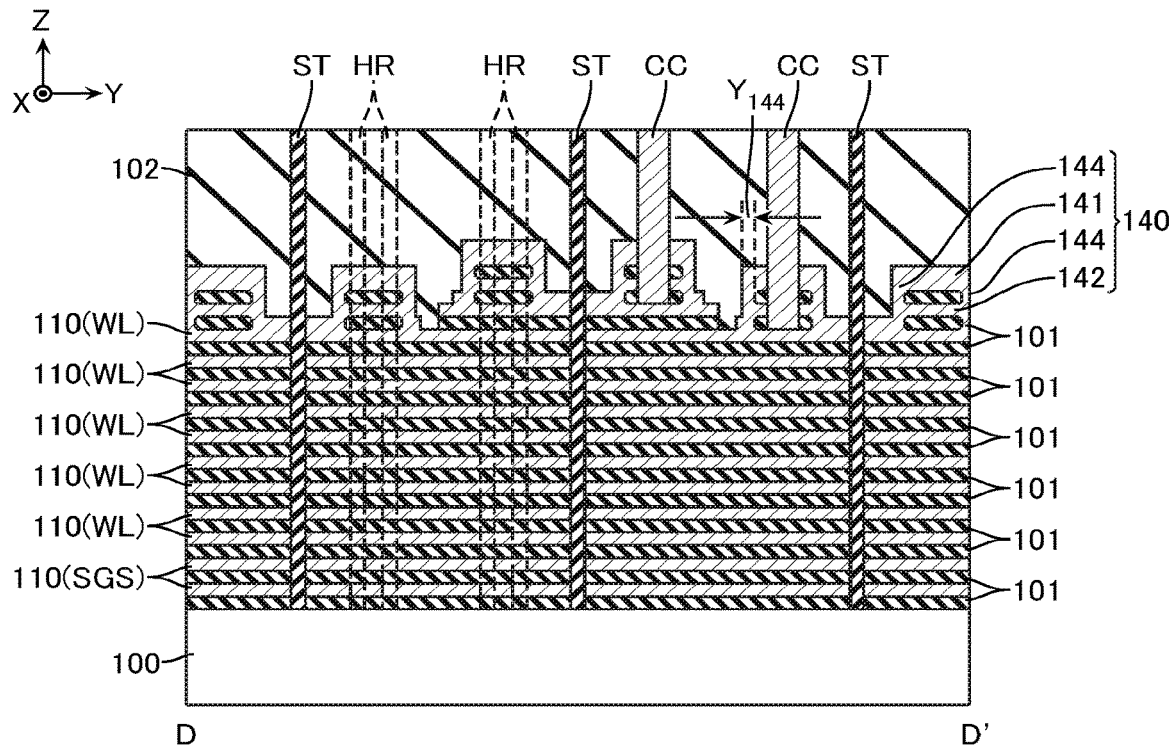
FIG. 6 is a schematic cross-sectional view of the structure illustrated in FIG. 3 taken along a line D-D' viewed in an arrow direction.
Figure 7:
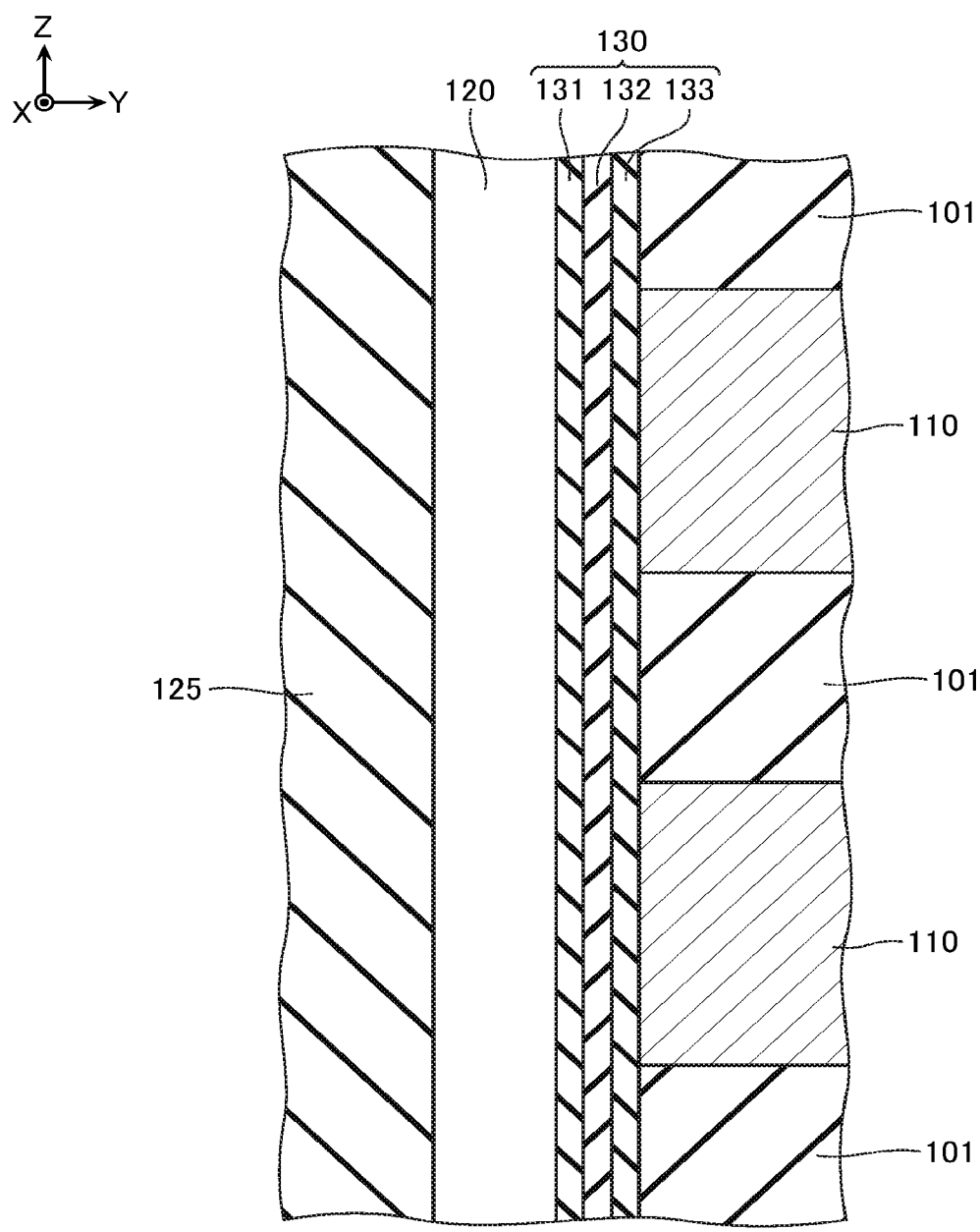
FIG. 7 is a schematic enlarged view of a part indicated by E in FIG. 5.

FIG. 2 is a schematic plan view of the semiconductor memory device. FIG. 3 is a schematic enlarged view of a part indicated by A in FIG. 2. FIG. 4 is a schematic cross-sectional view of the structure illustrated in FIG. 3 taken along a line B-B' viewed in an arrow direction. FIG. 5 is a schematic cross-sectional view of the structure illustrated in FIG. 3 taken along a line C-C' viewed in an arrow direction. FIG. 6 is a schematic cross-sectional view of the structure illustrated in FIG. 3 taken along a line D-D' viewed in an arrow direction. FIG. 7 is a schematic enlarged view of a part indicated by E in FIG. 5. While FIG. 7 illustrates a YZ cross-section, the structure similar to FIG. 7 is observed when a cross-section (for example, an XZ cross-section) along the center axis of a semiconductor layer 120 other than the YZ cross-section is observed.

As illustrated in FIG. 2, the semiconductor memory device includes a semiconductor substrate 100. The semiconductor substrate 100 contains, for example, P-type silicon (Si) containing P-type impurities, such as boron (B). On a surface of the semiconductor substrate 100, for example, an N-type well region containing N-type impurities, such as phosphorus (P), a P-type well region containing P-type impurities, such as boron (B), and a semiconductor substrate region in which the N-type well region or the P-type well region is not disposed, and an insulating region are disposed. The N-type well region, the P-type well region, and the semiconductor substrate region each function as parts of a plurality of transistors, a plurality of capacitors, and the like constituting the peripheral circuit PC.

In the illustrated example, the semiconductor substrate 100 includes two memory hole regions $R_{MH}$ arranged in the X-direction. A first hook-up region $R_{HU1}$ and a second hook-up region $R_{HU2}$ farther from the memory hole region $R_{MH}$ than the first hook-up region $R_{HU1}$ are disposed in each of regions in an X-direction positive side and an X-direction negative side with respect to each memory hole region $R_{MH}$.

A peripheral circuit region $R_{PC}$ is disposed at an end portion of the semiconductor substrate 100 in the Y-direction.

[Structure of Memory Hole Region $R_{MH}$]

The memory hole region $R_{MH}$ includes a plurality of memory blocks BLK arranged in the Y-direction. For example, as illustrated in FIG. 3, the memory block BLK includes two finger structures FS arranged in the Y-direction. An inter-finger structure ST is disposed between the two finger structures FS mutually adjacent in the Y-direction. The inter-finger structure ST is also disposed between the two memory blocks BLK mutually adjacent in the Y-direction.

For example, as illustrated in FIG. 5, the memory hole region $R_{MH}$ includes a plurality of conductive layers 110 arranged in the Z-direction and a plurality of semiconductor layers 120 extending in the Z-direction. For example, as illustrated in FIG. 7, the memory hole region $R_{MH}$ includes a plurality of gate insulating films 130 disposed between the plurality of conductive layers 110 and the respective plurality of semiconductor layers 120.

The conductive layer 110 has an approximately plate shape extending in the X-direction. The conductive layer 110 may include, for example, a stacked film of a barrier conductive film of titanium nitride (TiN) or the like and a metal film of tungsten (W) or the like. The conductive layer 110 may contain, for example, polycrystalline silicon containing impurities, such as phosphorus (P) or boron (B). Between the respective adjacent conductive layers 110 arranged in the Z-direction, insulating layers 101 of silicon oxide ($SiO_2$) or the like are disposed. An insulating layer 102 of silicon oxide ($SiO_2$) or the like covers above the plurality of conductive layers 110 arranged in the Z-direction.

A plurality of the conductive layers 110 function as the word lines WL (FIG. 1) and the gate electrodes of the plurality of memory cells MC (FIG. 1) connected thereto. In the following description, such conductive layers 110 are referred to as conductive layers 110 (WL) in some cases. These plurality of conductive layers 110 (WL) are each electrically independent for each memory block BLK. For example, as illustrated in FIG. 3, the inter-finger structure ST disposed between the memory blocks BLK extends in the X-direction across the memory hole region $R_{MH}$, the two first hook-up regions $R_{HU1}$ arranged in the X-direction, and the two second hook-up regions $R_{HU2}$ arranged in the X-direction. Therefore, side surfaces of the conductive layer 110 (WL) in a Y-direction positive side or a Y-direction negative side are electrically insulated from configurations in other memory blocks BLK via the inter-finger structure ST disposed between the memory blocks BLK. Meanwhile, the inter-finger structure ST disposed in the memory block BLK is interrupted at a position corresponding to a terrace portion T described later in the uppermost conductive layer 110 (WL). At the position at which the inter-finger structure ST is interrupted, a plurality of connecting portions 110c arranged in the Z-direction are disposed corresponding to the plurality of conductive layers 110 (WL) arranged in the Z-direction. Two conductive layers 110 (WL) arranged in the Y-direction in the memory block BLK are mutually connected via this connecting portion 110c. These plurality of conductive layers 110 (WL) extend in the X-direction across the memory hole region $R_{MH}$, the two first hook-up regions $R_{HU1}$ arranged in the X-direction, and the two second hook-up regions $R_{HU2}$ arranged in the X-direction.

One or a plurality of conductive layers 110 positioned below the plurality of conductive layers 110 (WL) function as the source-side select gate line SGS (FIG. 1) and gate electrodes of the plurality of source-side select transistors STS (FIG. 1) connected thereto. In the following description, such conductive layers 110 are referred to as conductive layers 110 (SGS) in some cases. This one or plurality of conductive layers 110 (SGS) are electrically independent for each memory block BLK. For example, this one or plurality of conductive layers 110 (SGS) are electrically insulated from configurations in other memory blocks BLK by the inter-finger structures ST disposed between the memory blocks BLK. Two conductive layers 110 (SGS) arranged in the Y-direction in the memory block BLK are mutually connected via the connecting portion 110c as illustrated in FIG. 3. The one or plurality of conductive layers 110 (SGS) extend in the X-direction across the memory hole region $R_{MH}$, the two first hook-up regions $R_{HU1}$ arranged in the X-direction, and the two second hook-up regions $R_{HU2}$ arranged in the X-direction.

One or a plurality of conductive layers 110 positioned above the plurality of conductive layers 110 (WL) function as the drain-side select gate line SGD (FIG. 1) and gate electrodes of the plurality of drain-side select transistors STD (FIG. 1) connected thereto. In the following description, such conductive layers 110 are referred to as conductive layers 110 (SGD) in some cases. As illustrated in FIG. 3, these plurality of conductive layers 110 (SGD) each have a width $Y_{SGD}$ in the Y-direction smaller than a width $Y_{WL}$ of the conductive layer 110 (WL) in the Y-direction. For example, as illustrated in FIG. 3 and FIG. 5, an inter-string unit insulating layer SHE is disposed between the two conductive layers 110 (SGD) mutually adjacent in the Y-direction in one finger structure FS. These plurality of conductive layers 110 (SGD) are each electrically independent for each string unit SU. For example, in each memory block BLK, the conductive layers 110 (SGD) corresponding to the first and fourth string units SU counting from one side in the Y-direction (for example, negative side in the Y-direction) are electrically insulated from configurations in other memory blocks BLK via the inter-finger structures ST disposed between the memory blocks BLK. The conductive layers 110 (SGD) corresponding to the second and third string units SU counting from one side in the Y-direction (for example, negative side in the Y-direction) are mutually electrically insulated via the inter-finger structure ST disposed in the memory block BLK. The two conductive layers 110 (SGD) mutually adjacent in the Y-direction in one finger structure FS are mutually electrically insulated via the inter-string unit insulating layer SHE. These plurality of conductive layers 110 (SGD) extend in the X-direction across the memory hole region $R_{MH}$ and the two first hook-up regions $R_{HU1}$ arranged in the X-direction.

For example, as illustrated in FIG. 3, the semiconductor layers 120 are arranged in the X-direction and the Y-direction in a predetermined pattern. Each of the semiconductor layers 120 functions as the channel regions of the plurality of memory cells MC and the select transistors (STD, STS) included in one memory string MS (FIG. 1). The semiconductor layer 120 contains polycrystalline silicon (Si) or the like. The semiconductor layer 120 has an approximately cylindrical shape extending in the Z-direction. For example, as illustrated in FIG. 7, an insulating layer 125 of silicon oxide or the like is disposed in the center of the semiconductor layer 120. Outer peripheral surfaces of the semiconductor layers 120 are each surrounded by the conductive layers 110 and opposed to the conductive layers 110.

In the example of FIG. 4, lower end portions of the semiconductor layers 120 are connected to the semiconductor substrate 100. In this case, the semiconductor substrate 100 functions as a part of the source line SL. The lower end portions of the semiconductor layers 120 may be connected to the semiconductor substrate 100 via other semiconductor layers or the like, and may be connected to a conductive layer, a semiconductor layer, or the like that functions as the source line SL disposed above the semiconductor substrate 100.

The gate insulating film 130 has an approximately cylindrical shape covering the outer peripheral surface of the semiconductor layer 120. For example, as illustrated in FIG. 7, the gate insulating film 130 includes a tunnel insulating film 131, an electric charge accumulating film 132, and a block insulating film 133, which are stacked between the semiconductor layer 120 and the conductive layers 110. The tunnel insulating film 131 and the block insulating film 133 contain, for example, silicon oxide ($SiO_2$). The electric charge accumulating film 132 includes, for example, a film that can accumulate an electric charge of silicon nitride (SiN) or the like. The tunnel insulating film 131, the electric charge accumulating film 132, and the block insulating film 133 each have an approximately cylindrical shape, and extend in the Z-direction along the outer peripheral surface of the semiconductor layer 120.

FIG. 7 illustrates an example in which the gate insulating film 130 includes the electric charge accumulating film 132 of silicon nitride or the like. However, for example, the gate insulating film 130 may include a floating gate of polycrystalline silicon or the like containing N-type or P-type impurities.

For example, as illustrated in FIG. 3 and FIG. 5, the inter-finger structure ST extends in the Z-direction and the X-direction. The inter-finger structure ST may contain silicon oxide ($SiO_2$) or the like. The inter-finger structure ST may include a conductive layer extending in the Z-direction and insulating layers disposed on both side surfaces of this conductive layer in the Y-direction. When the inter-finger structure ST includes the conductive layer, this conductive layer may function as a part of the source line SL (FIG. 1).

[Structure of First Hook-Up Region $R_{HU1}$]

As illustrated in FIG. 3, in the first hook-up region $R_{HU1}$, terrace portions T of the plurality of conductive layers 110 (SGD) are disposed. For example, the terrace portions T are portions of the upper surfaces of the conductive layers 110 not overlapping with the other conductive layers 110 viewed from above. In the example of FIG. 3, the terrace portions T are disposed at end portions of the conductive layers 110 (SGD) in the X-direction. In the example of FIG. 3, a plurality of contacts CC are disposed corresponding to the terrace portions T of the plurality of conductive layers 110 (SGD) included in the even-numbered memory blocks BLK counting from one side in the Y-direction (for example, negative side in the Y-direction) among the plurality of memory blocks BLK arranged in the Y-direction. In the example of FIG. 3, a plurality of supporting structures HR are disposed corresponding to each terrace portion T of the plurality of conductive layers 110 (SGD).

FIG. 3 illustrates the first hook-up region $R_{HU1}$ disposed in the positive side in the X-direction with respect to the memory hole region $R_{MH}$. While the illustration is omitted, in the first hook-up region $R_{HU1}$ (see FIG. 2) disposed in the negative side in the X-direction with respect to the memory hole region $R_{MH}$, a plurality of contacts CC are disposed corresponding to the terrace portions T of the plurality of conductive layers 110 (SGD) included in the odd-numbered memory blocks BLK counting from the one side in the Y-direction among the plurality of memory blocks BLK arranged in the Y-direction.

As illustrated in FIG. 4, the end portion of the conductive layer 110 (SGD) in the X-direction includes a part 111, a part 112, and an edge portion 113. The part 111 is continuous with a part disposed in the memory hole region $R_{MH}$ of the conductive layer 110 (SGD). The part 112 has a length $Z_{112}$ in the Z-direction larger than a length $Z_{111}$ of the part 111 in the Z-direction. Each of the parts 112 is disposed at a position corresponding to the terrace portion T. In the illustrated example, the edge portion 113 is a side surface of the conductive layer 110 (SGD) in the X-direction, and as illustrated in FIG. 3, extends in the Y-direction.

The contacts CC are arranged in the X-direction via the plurality of edge portions 113 corresponding to the plurality of conductive layers 110 (SGD). The contact CC extends in the Z-direction, and its lower end portion is connected to a position at which the part 112 is disposed in the terrace portion T of the conductive layer 110 (SGD). The contact CC may include, for example, a stacked film of a barrier conductive film of titanium nitride (TiN) or the like and a metal film of tungsten (W) or the like. The contacts CC are each disposed to a current path between the conductive layer 110 (SGD) and the peripheral circuit PC (FIG. 1).

In the illustrated example, the contact CC closest to the memory hole region $R_{MH}$ among the plurality of contacts CC arranged in the X-direct ion is connected to the first conductive layer 110 (SGD) counting from above. The contact CC second closest to the memory hole region $R_{MH}$ is connected to the second conductive layer 110 (SGD) counting from above. In the following, similarly, the contact CC that is a-th (a is an integer of 1 or more) closest to the memory hole region $R_{MH}$ is connected to the a-th conductive layer 110 (SGD) counting from above.

The supporting structure HR has an approximately columnar shape extending in the Z-direction (see FIG. 6). Outer peripheral surfaces of the supporting structures HR are each surrounded by the conductive layers 110 and the insulating layers 101, and connected to the conductive layers 110 and the insulating layers 101. For example, the supporting structure HR may have a configuration similar to the structure including the semiconductor layer 120, the insulating layer 125 (FIG. 7), and the gate insulating film 130 (FIG. 7). The supporting structure HR may contain silicon oxide ($SiO_2$) or the like.

[Structure of Second Hook-Up Region $R_{HU2}$]

As illustrated in FIG. 3, in the second hook-up region $R_{HU2}$, terrace portions T of the plurality of conductive layers 110 (WL) and the plurality of conductive layers 110 (SGS) are disposed. In the example of FIG. 3, the terrace portions T are disposed at end portions of the plurality of conductive layers 110 (WL) and the plurality of conductive layers 110 (SGS) in the X-direction. In the example of FIG. 3, a plurality of structures 140 are disposed at the terrace portions T of the plurality of conductive layers 110 (WL) and the plurality of conductive layers 110 (SGS). In the example of FIG. 3, a plurality of contacts CC are disposed corresponding to the plurality of conductive layers 110 (WL) and the plurality of conductive layers 110 (SGS) included in the even-numbered memory blocks BLK counting from the one side in the Y-direction among the plurality of memory blocks BLK arranged in the Y-direction. In the illustrated example, the plurality of contacts CC are disposed to the plurality of conductive layers 110 in the finger structure FS disposed in the positive side in the Y-direction in the two finger structures FS included in the memory block BLK. However, the plurality of contacts CC may be disposed to the plurality of conductive layers 110 in the finger structure FS disposed in the negative side in the Y-direction. In the example of FIG.

3, a plurality of supporting structures HR are disposed corresponding to each terrace portion T of the plurality of conductive layers 110 (WL) and the plurality of conductive layers 110 (SGS).

FIG. 3 illustrates the second hook-up region $R_{HU2}$ disposed in the positive side in the X-direction with respect to the memory hole region $R_{MH}$. While the illustration is omitted, in the second hook-up region $R_{HU2}$ (see FIG. 2) disposed in the negative side in the X-direction with respect to the memory hole region $R_{MH}$, a plurality of contacts CC are disposed corresponding to the terrace portions T of the plurality of conductive layers 110 (WL) and the plurality of conductive layers 110 (SGS) included in the odd-numbered memory blocks BLK counting from the one side in the Y-direction among the plurality of memory blocks BLK arranged in the Y-direction. In this case, the plurality of contacts CC may be disposed corresponding to the terrace portions T of the plurality of conductive layers 110 (WL) and the plurality of conductive layers 110 (SGS) included in any of the two finger structures FS in the positive side and the negative side in the Y-direct ion included in the memory block BLK.

As illustrated in FIG. 4, the end portions of the conductive layers 110 (WL) and the conductive layers 110 (SGS) in the X-direction each include a part 114, a part 115, and an edge portion 116. The parts 114 are continuous with respective parts disposed in the memory hole region $R_{MH}$ of the conductive layers 110 (WL) and the conductive layers 110 (SGS). The part 115 has a length $Z_{115}$ in the Z-direction larger than a length $Z_{114}$ of the part 114 in the Z-direction. Each of the parts 115 is disposed at a position corresponding to the terrace portion T. In the illustrated example, the edge portions 116 are respective side surfaces of the conductive layers 110 (WL) and conductive layers 110 (SGS) in the X-direction, and as illustrated in FIG. 3, extend in the Y-direction.

For example, as illustrated in FIG. 4 and FIG. 6, the structure 140 includes an approximately plate-shaped conductive portion 141, a conductive portion 142 (intermediate conductive portion) disposed between the conductive portion 141 and the conductive layer 110, an insulating layer 101 disposed between the conductive portions 141, 142, an insulating layer 101 disposed between the conductive portion 142 and the conductive layer 110, a pair of conductive portions 143 (FIG. 4) connected to respective both end portions of the conductive portions 141, 142 and the insulating layer 101 in the X-direction and the terrace portion T of the conductive layer 110, and a pair of conductive portions 144 (FIG. 6) connected to respective both end portions of the conductive portions 141, 142 and the insulating layer 101 in the Y-direction and the terrace portion T of the conductive layer 110.

The conductive portion 141 extends in the X-direction and the Y-direction. A length $Z_{141}$ of the conductive portion 141 in the Z-direction may be larger than the length $Z_{111}$ of the part 111 in the Z-direction. A length $Z_{141}$ of the conductive portion 141 in the Z-direction may be larger than the length $Z_{114}$ of the part 114 in the Z-direction. A lower surface of the conductive portion 141 may be disposed at a height position corresponding to a lower surface of the conductive layer 110 two layers above the conductive layer 110 electrically connected to this conductive portion 141 in the Z-direction.

The conductive portion 142 extends in the X-direction and the Y-direction. A length $Z_{142}$ of the conductive portion 142 in the Z-direction may be the same as the length $Z_{111}$ of the part 111 in the Z-direction, and may be larger than the length $Z_{111}$. The length $Z_{142}$ of the conductive portion 142 in the Z-direction may be the same as the length $Z_{114}$ of the part 114 in the Z-direction, and may be larger than the length $Z_{114}$. The length $Z_{142}$ of the conductive portion 142 in the Z-direction may be smaller than the length $Z_{141}$ of the conductive portion 141 in the Z-direction. A lower surface of the conductive portion 142 may be disposed at a height position corresponding to a lower surface of the conductive layer 110 one layer above the conductive layer 110 electrically connected to this conductive portion 142 in the Z-direction. An upper surface of the conductive portion 142 may be disposed at a height position corresponding to an upper surface of the conductive layer 110 one layer above the conductive layer 110 electrically connected to this conductive portion 142 in the Z-direction.

The conductive portion 143 (FIG. 4) extends in the Y-direction and the Z-direction. A length $X_{143}$ of the conductive portion 143 in the X-direction may be smaller than the length $Z_{141}$ of the conductive portion 141 in the Z-direction.

The conductive portion 144 (FIG. 6) extends in the X-direction and the Z-direction. A length $Y_{144}$ (FIG. 6) of the conductive portion 144 in the Y-direction may be smaller than the length $Z_{141}$ (FIG. 4) of the conductive portion 141 in the Z-direction. The length $Y_{144}$ (FIG. 6) of the conductive portion 144 in the Y-direction may be the same as the length $X_{143}$ of the conductive portion 143 in the X-direction.

As illustrated in FIG. 3, a length $Y_{140}$ of the structure 140 in the Y-direction is smaller than a length $Y_T$ of the terrace portion T in the Y-direction. Both end portions 145 of the structure 140 in the Y-direction are disposed between both end portions 117 of the terrace portion T of the corresponding conductive layer 110 in the Y-direction.

A length $X_{140}$ of the structure 140 in the X-direction is smaller than a length $X_T$ of the terrace portion T in the X-direction. Both end portions 146 of the structure 140 in the X-direction are disposed between both end portions 118 of the terrace portion T of the corresponding conductive layer 110 in the X-direction.

The contacts CC are arranged in the X-direction via the plurality of edge portions 116 corresponding to the plurality of conductive layers 110 (WL) and the plurality of conductive layers 110 (SGS). As illustrated in FIG. 4, the contacts CC extend in the Z-direction. A lower end portion of the contact CC is connected to the conductive portion 141. The lower end portion of the contact CC may be further connected to the conductive portion 142 and the conductive layer 110 (WL) or the conductive layer 110 (SGS). The contact CC may include, for example, a stacked film of a barrier conductive film of titanium nitride (TiN) or the like and a metal film of tungsten (W) or the like. The contacts CC are each disposed to the current path between the conductive layer 110 (WL) or the conductive layer 110 (SGS) and the peripheral circuit PC (FIG. 1).

In the example of FIG. 3, two contact rows CCR arranged in the Y-direction are disposed corresponding to one finger structure FS. These two contact rows CCR each include a plurality of contacts CC arranged in the X-direction.

In these two contact rows CCR, among the plurality of contacts CC included in the contact row CCR disposed in the negative side in the Y-direction, the contact CC closest to the memory hole region $R_{MH}$ is connected to the first conductive layer 110 (WL) counting from above. The contact CC second closest to the memory hole region $R_{MH}$ is connected to the third conductive layer 110 (WL) counting from above. In the following, similarly, the contact CC that is a-th (a is an integer of 1 or more) closest to the memory hole region $R_{MH}$ is connected to the 2a-1-th conductive layer 110 (WL) counting from above. The contact CC farthermost from the memory hole region $R_{MH}$ is connected to the conductive layer 110 (SGS) in the upper layer side.

In these two contact rows CCR, among the plurality of contacts CC included in the contact row CCR disposed in the positive side in the Y-direction, the contact CC closest to the memory hole region $R_{MH}$ is connected to the second conductive layer 110 (WL) counting from above. The contact CC second closest to the memory hole region $R_{MH}$ is connected to the fourth conductive layer 110 (WL) counting from above. In the following, similarly, the contact CC that is a-th (a is an integer of 1 or more) closest to the memory hole region $R_{MH}$ is connected to the 2a-th conductive layer 110 (WL) counting from above. The contact CC farthermost from the memory hole region $R_{MH}$ is connected to the conductive layer 110 (SGS) in the lower layer side.

The plurality of supporting structures HR disposed in the second hook-up region $R_{HU2}$ are basically configured similarly to the plurality of supporting structures HR disposed in the first hook-up region $R_{HU1}$. However, for example, as indicated by dotted lines in FIG. 6, the outer peripheral surfaces of at least a part of the plurality of supporting structures HR disposed in the second hook-up region $R_{HU2}$ are connected to the conductive portions 141, 142 and insulating layers 101 included in the structures 140 in addition to the plurality of conductive layers 110.

[Manufacturing Method]

Next, with reference to FIG. 8 to FIG. 50, the method for manufacturing the semiconductor memory device according to the first embodiment will be described. FIG. 8, FIG. 10, FIG. 13, FIG. 17, FIG. 18, FIG. 20, FIG. 21, FIG. 23, FIG. 24, FIG. 26, FIG. 28, FIG. 29, FIG. 30, FIG. 32, FIG. 34, FIG. 36, FIG. 38, FIG. 40, FIG. 43, FIG. 47, and FIG. 50 are schematic cross-sectional views for describing the manufacturing method, and each illustrate a cross-section corresponding to that in FIG. 4. FIG. 9, FIG. 12, FIG. 16, FIG. 19, FIG. 22, FIG. 25, FIG. 27, FIG. 35, FIG. 42, and FIG. 44 are schematic plan views for describing the manufacturing method, and each illustrate a planar surface corresponding to that in FIG. 3. FIG. 11, FIG. 15, FIG. 31, FIG. 33, FIG. 37, FIG. 39, FIG. 41, FIG. 45, FIG. 46, FIG. 48, and FIG. 49 are schematic cross-sectional views for describing the manufacturing method, and each illustrate a cross-section corresponding to that in FIG. 6. FIG. 14 is a schematic cross-sectional view for describing the manufacturing method.

In the manufacture of the semiconductor memory device according to the embodiment, first, a plurality of transistors constituting the peripheral circuit PC are formed in the peripheral circuit region $R_{PC}$ of the semiconductor substrate 100.

Figure 8:
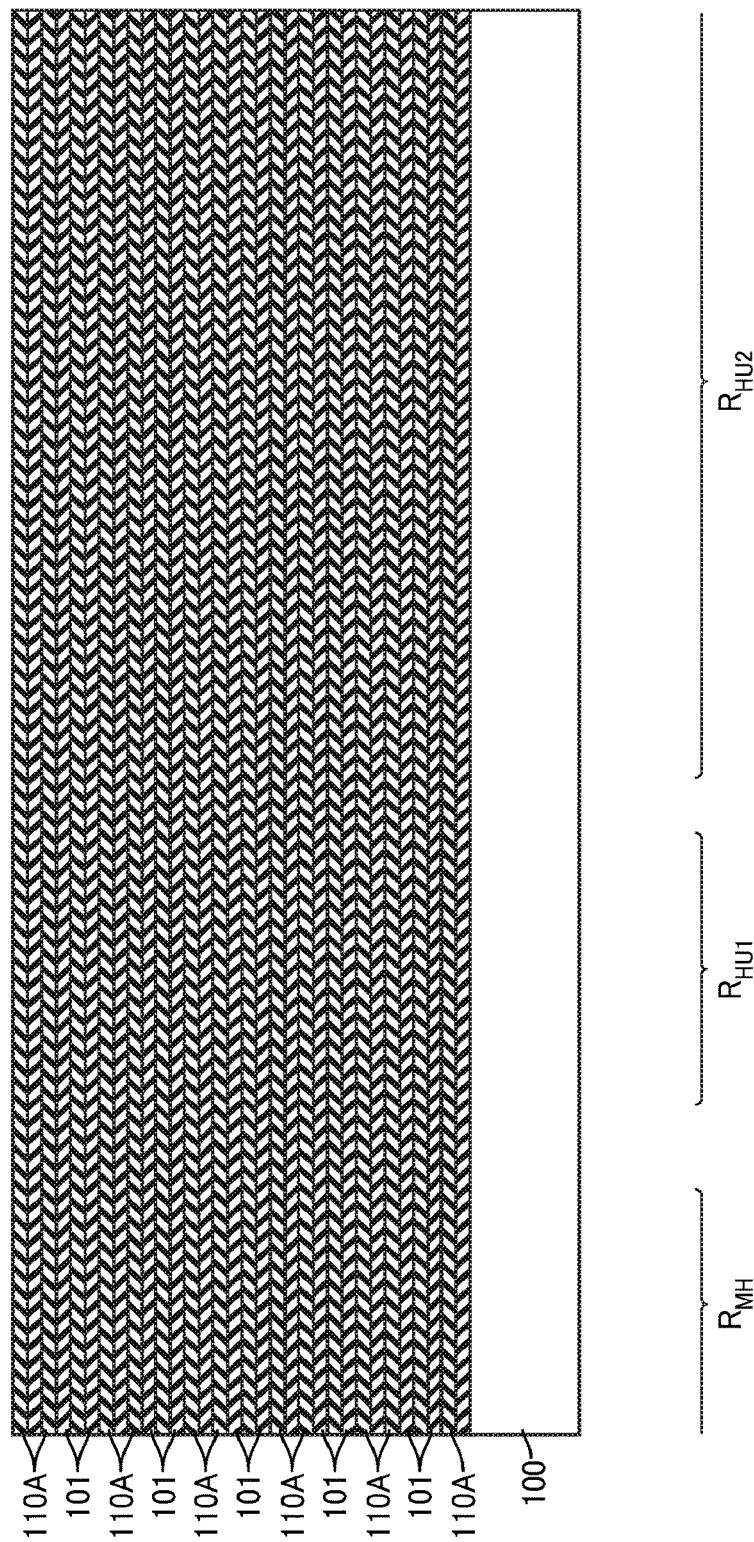
FIG. 8 is a schematic cross-sectional view illustrating a method for manufacturing the semiconductor memory device according to the first embodiment.

Next, for example, as illustrated in FIG. 8, a plurality of sacrifice layers 110A and a plurality of insulating layers 101 are formed on the semiconductor substrate 100. The sacrifice layer 110A contains silicon nitride (SiN) or the like. This process is performed by a method, such as Chemical Vapor Deposition (CVD). The plurality of sacrifice layers 110A and insulating layers 101 are formed in the memory hole region $R_{MH}$, the first hook-up region $R_{HU1}$, and the second hook-up region $R_{HU2}$ described with reference to FIG. 2.

Figure 9:
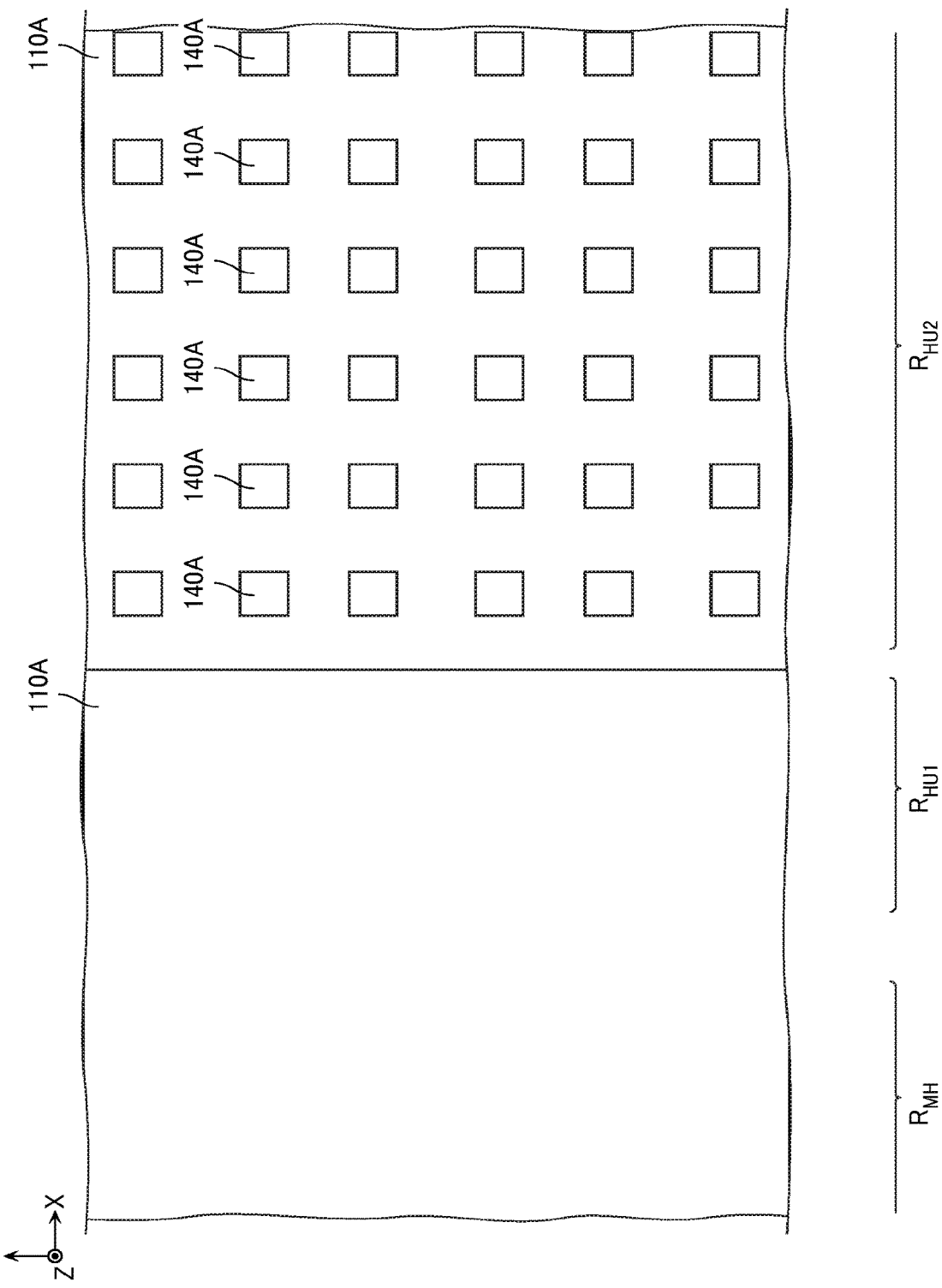
FIG. 9 is a schematic plan view illustrating the manufacturing method.
Figure 10:
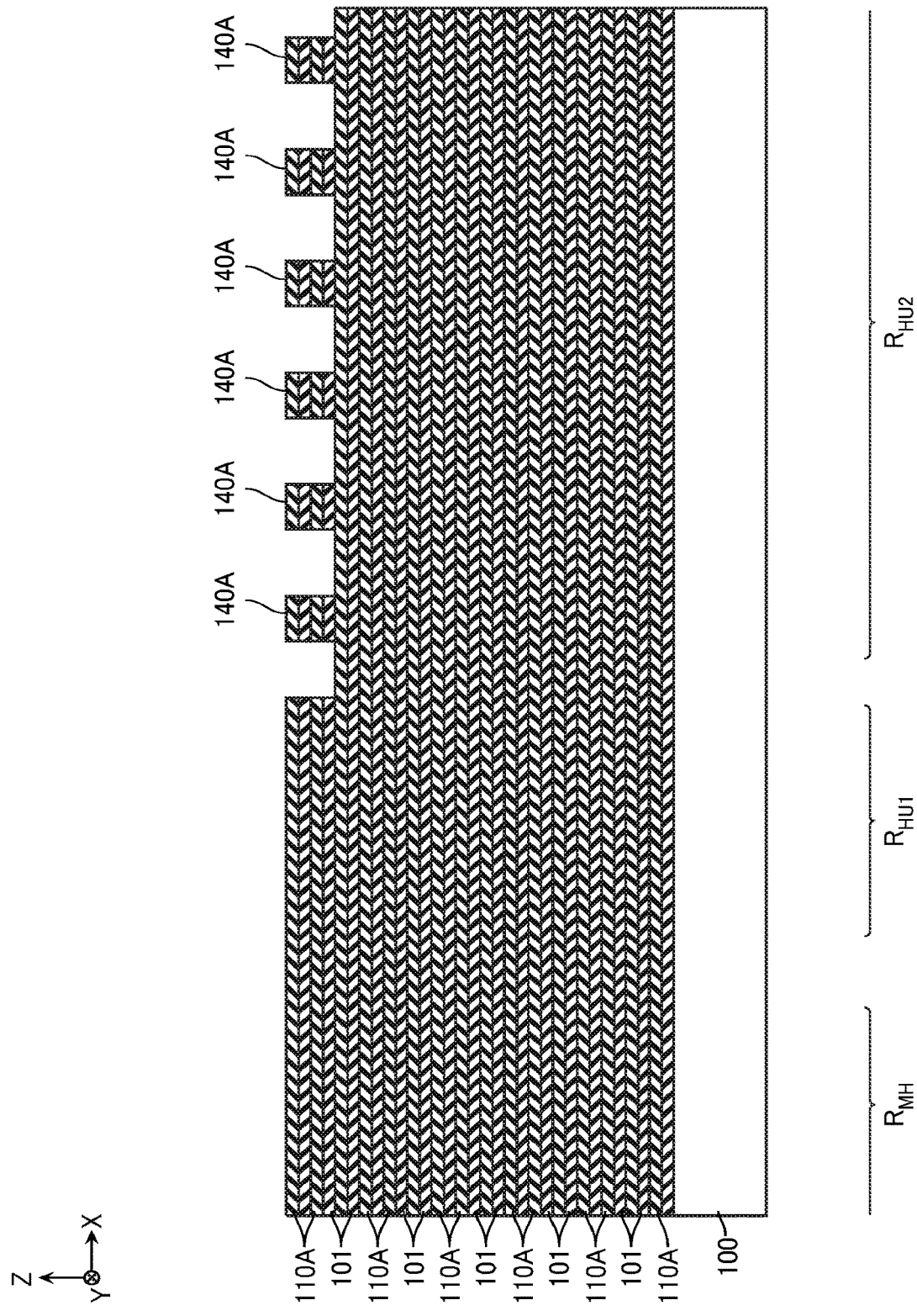
FIG. 10 is a schematic cross-sectional view illustrating the manufacturing method.
Figure 11:
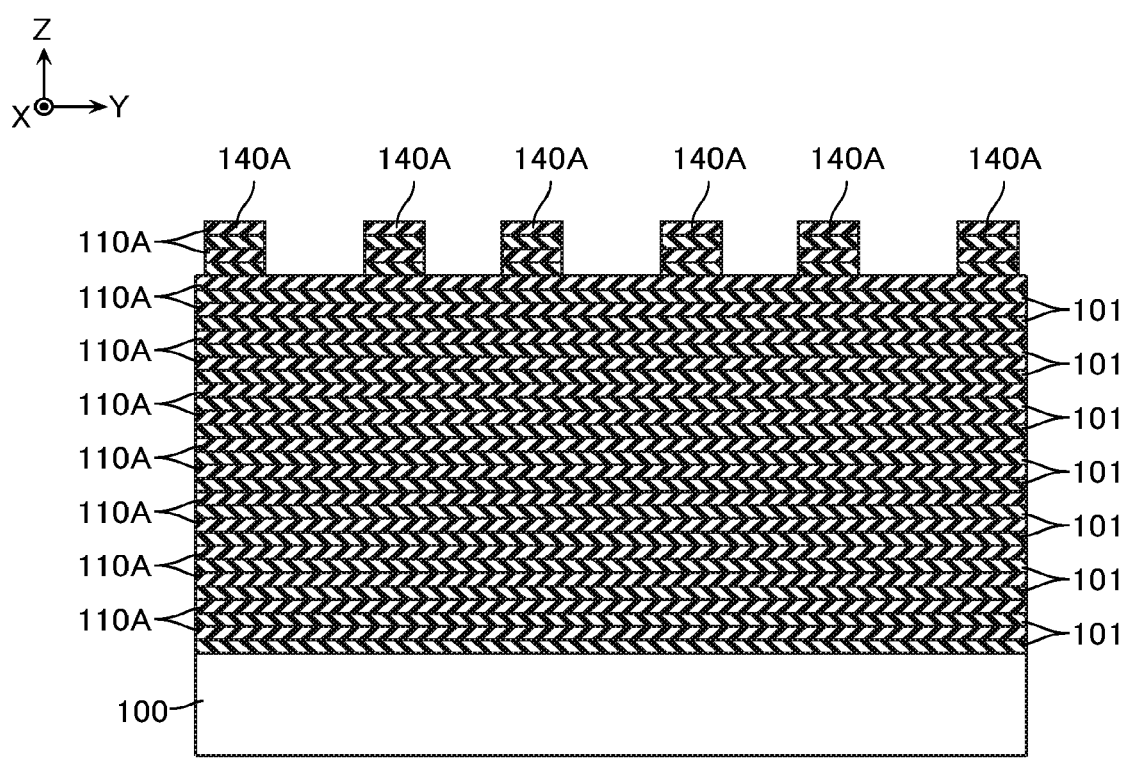
FIG. 11 is a schematic cross-sectional view illustrating the manufacturing method.
Figure 12:
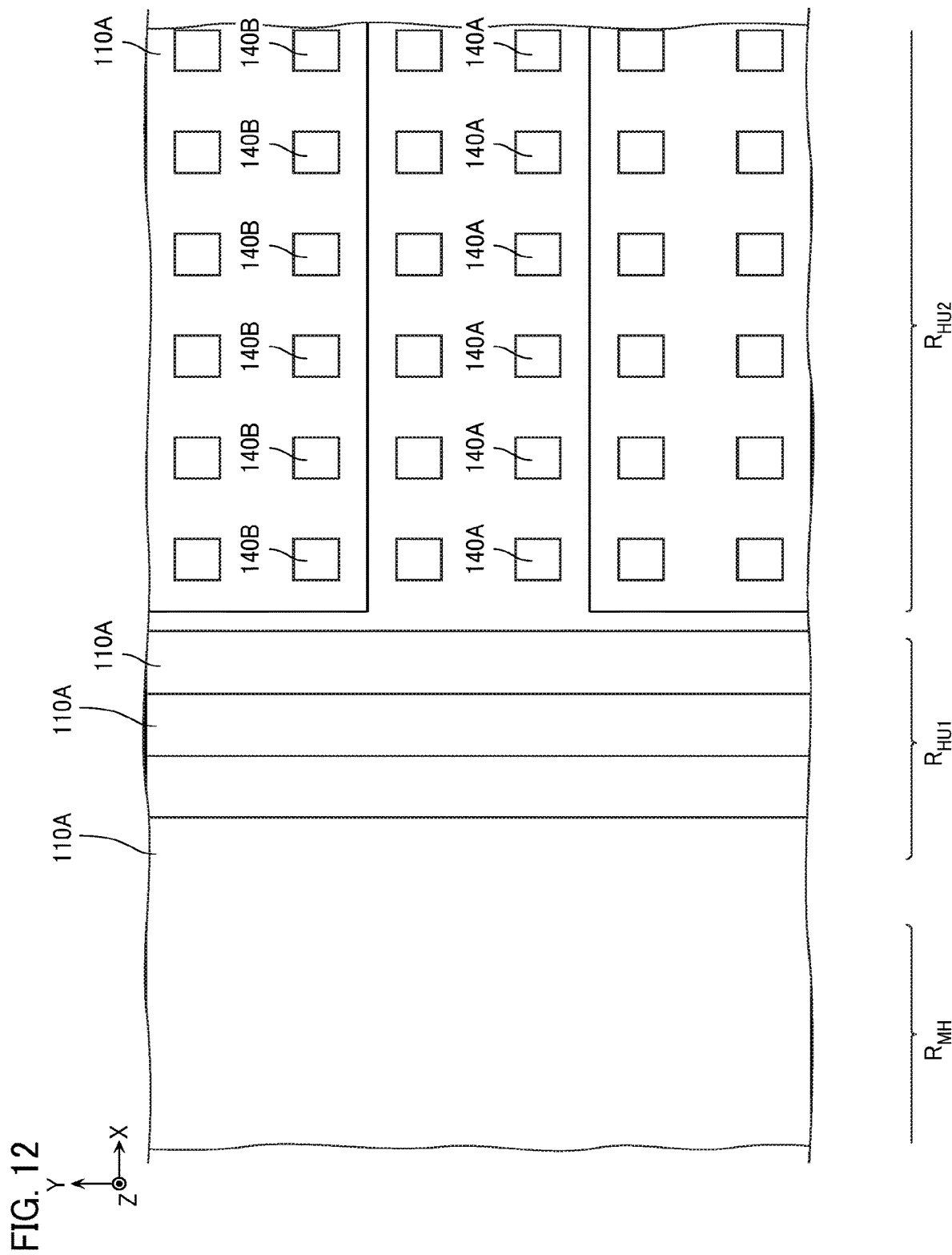
FIG. 12 is a schematic plan view illustrating the manufacturing method.

Next, for example, as illustrated in FIG. 9 to FIG. 11, a plurality of structures 140A are formed at positions corresponding to the plurality of structures 140. The plurality of structures 140A each include a part of the first and second sacrifice layers 110A counting from above and apart of the first and second insulating layers 101 counting from above.

In this process, for example, a resist that covers a part of the structure as illustrated in FIG. 8 is formed. This resist covers the whole of memory hole region $R_{MH}$ and first hook-up region $R_{HU1}$. This resist also covers a plurality of regions corresponding to the plurality of structures 140 in the second hook-up region $R_{HU2}$, and exposes the other regions in the second hook-up region $R_{HU2}$. Next, removal of the sacrifice layer 110A and removal of the insulating layer 101 are alternately performed twice for each. This process is performed by a method, such as wet etching or dry etching.

Next, for example, as illustrated in FIG. 12 to FIG. 15, a part of the sacrifice layer 110A and a part of the insulating layer 101 are removed. In this process, for example, a resist that covers a part of the structure as illustrated in FIG. 9 to FIG. 11 is formed. This resist covers the whole of the memory hole region $R_{MH}$. This resist covers regions corresponding to the terrace portions T of the odd-numbered conductive layers 110 counting from above, and exposes regions corresponding to the terrace portions T of the even-numbered conductive layers 110 counting from above in the first hook-up region $R_{HU1}$ and the second hook-up region $R_{HU2}$. Next, removal of the sacrifice layer 110A and removal of the insulating layer 101 are performed once for each. This process is performed by a method such as wet etching or dry etching.

Figure 14:
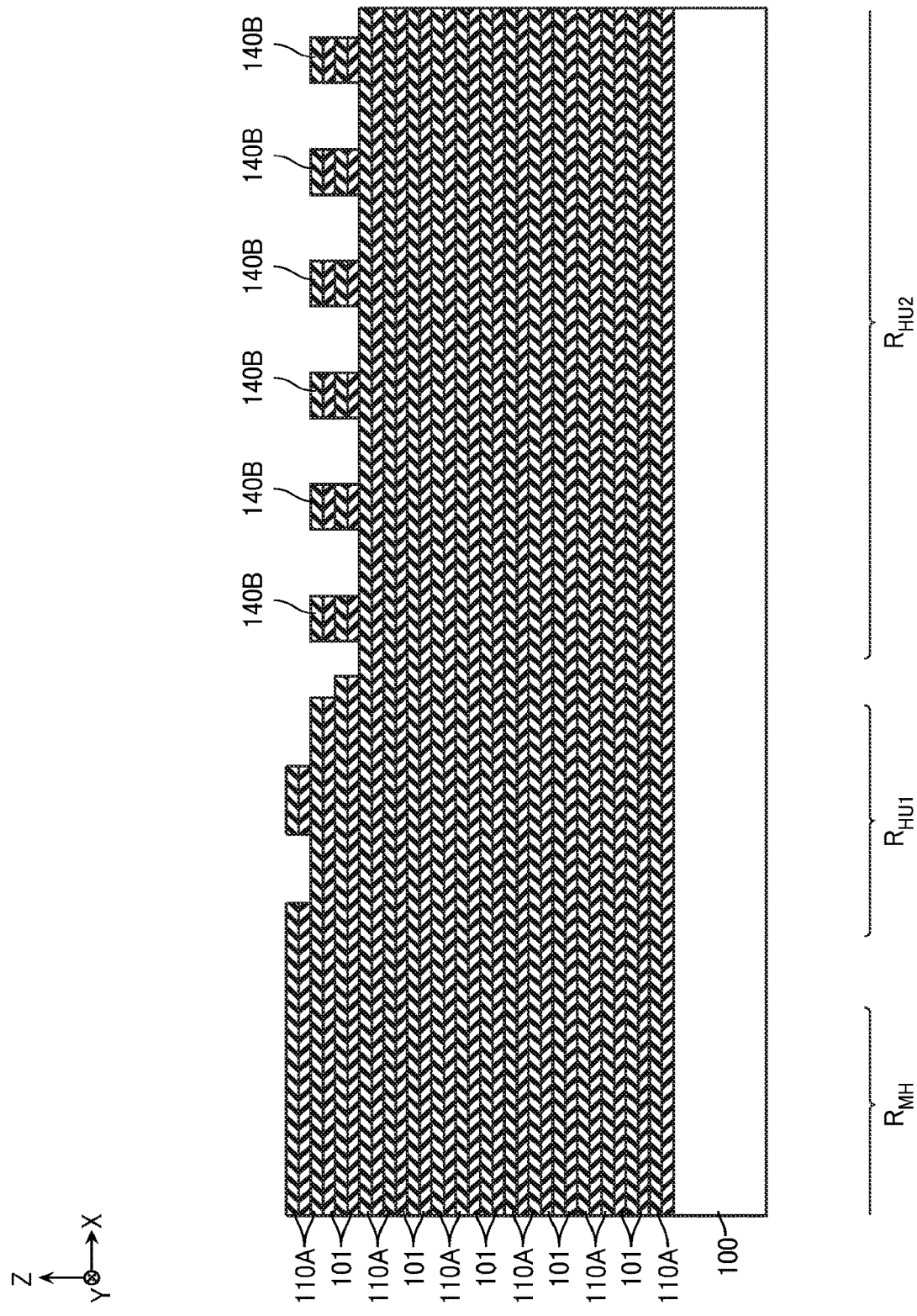
FIG. 14 is a schematic cross-sectional view illustrating the manufacturing method.
Figure 15:
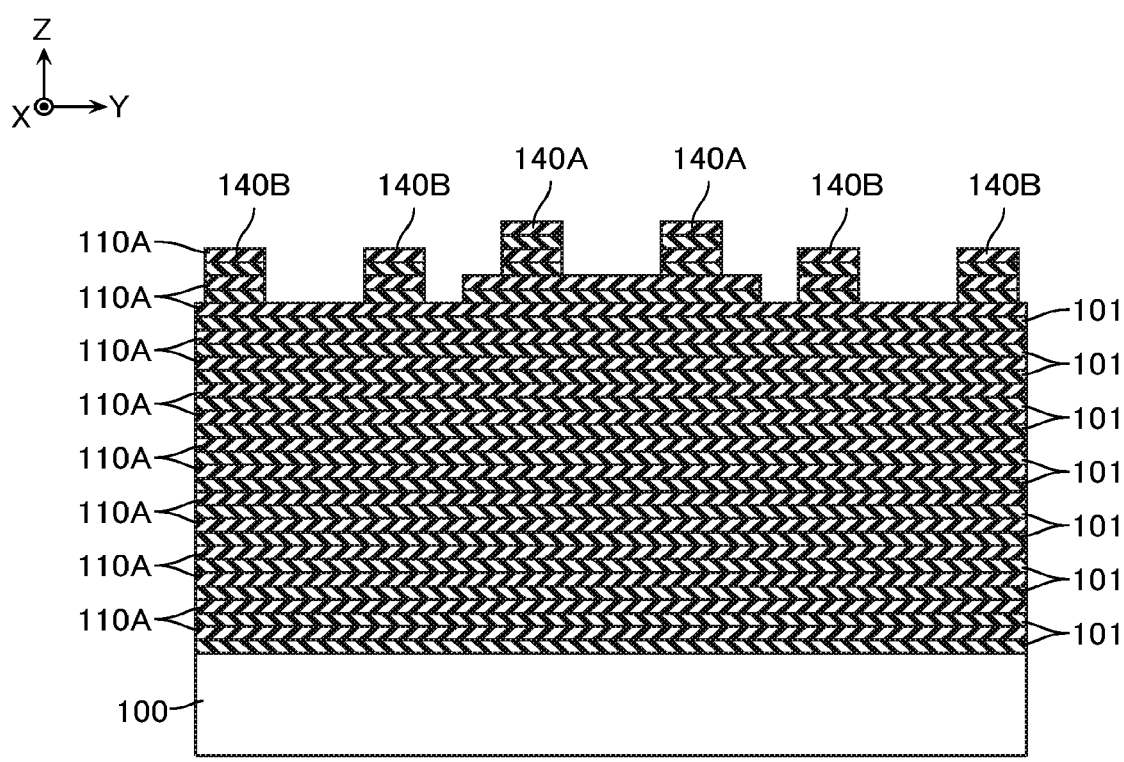
FIG. 15 is a schematic cross-sectional view illustrating the manufacturing method.

In this process, as illustrated in FIG. 14 and FIG. 15, a plurality of structures 140B are formed at portions at which the plurality of structures 140A were disposed in the region not covered with the resist. The plurality of structures 140B each include a part of the second and third sacrifice layers 110A counting from above and a part of the second and third insulating layers 101 counting from above.

Figure 16:
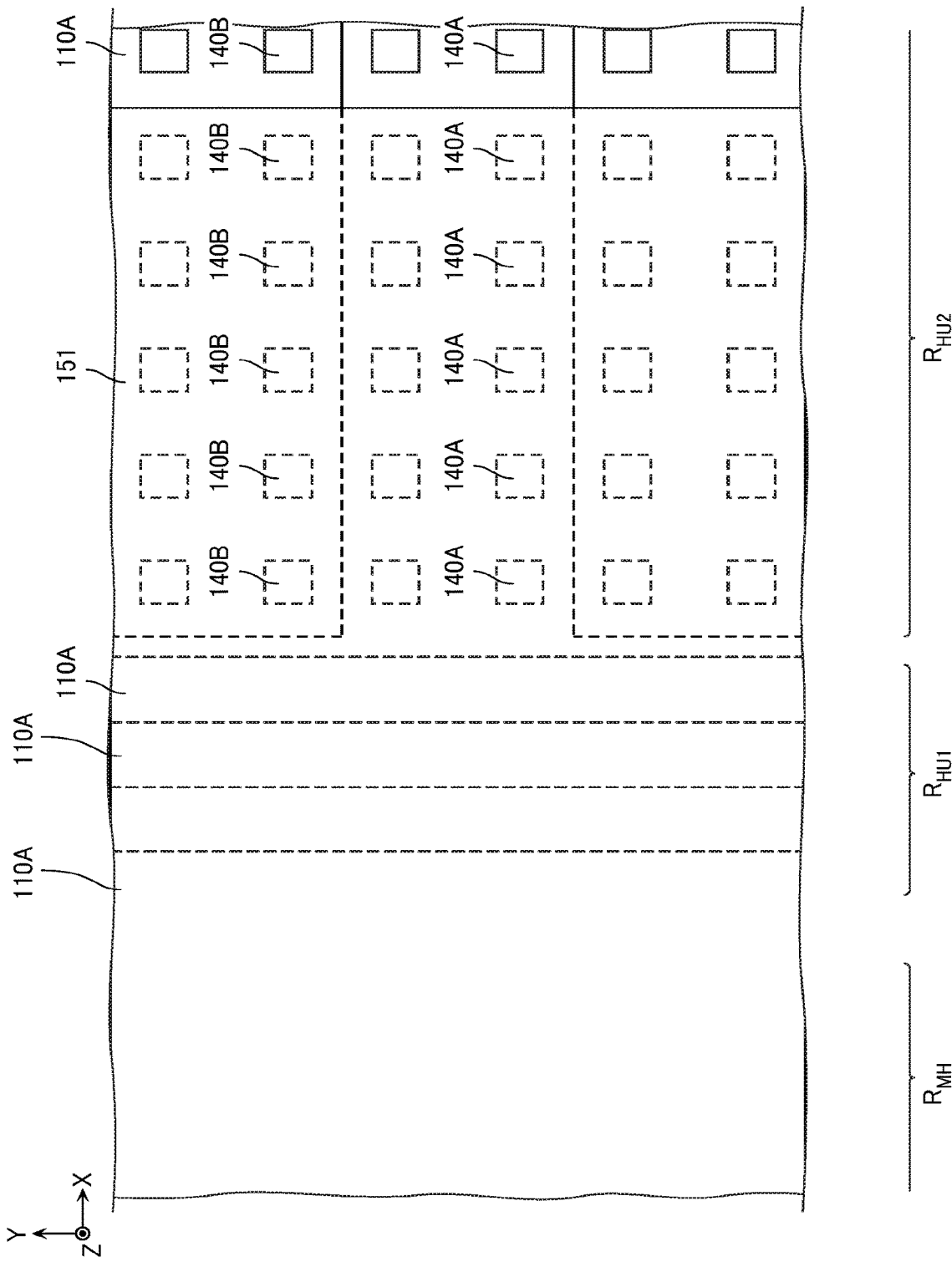
FIG. 16 is a schematic plan view illustrating the manufacturing method.
Figure 17:
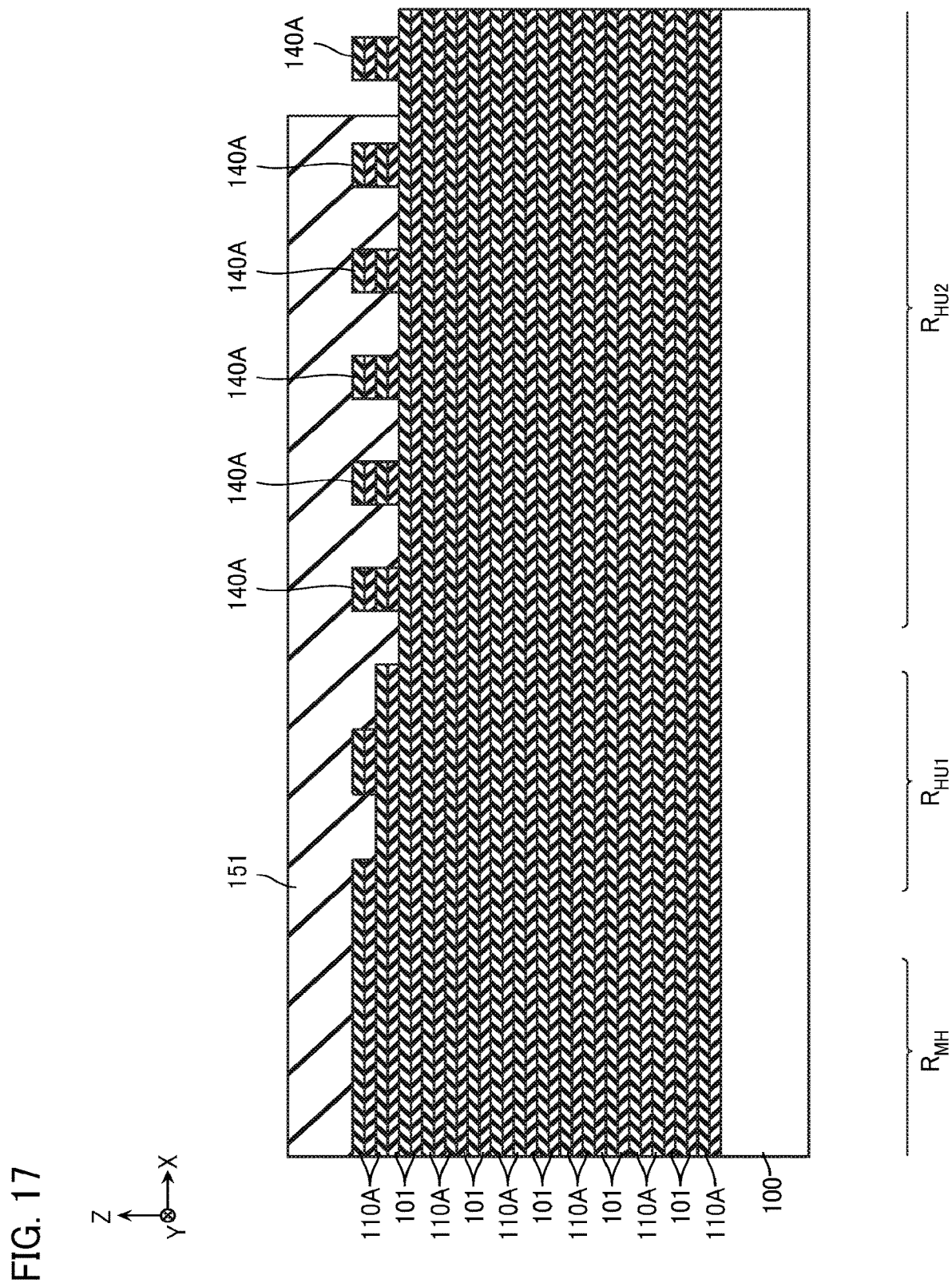
FIG. 17 is a schematic cross-sectional view illustrating the manufacturing method.

Next, for example, as illustrated in FIG. 16 and FIG. 17, a resist 151 that covers a part of the structure as illustrated in FIG. 12 to FIG. 15 is formed. This resist 151 covers the whole of memory hole region $R_{MH}$ and first hook-up region $R_{HU1}$. This resist 151 exposes regions corresponding to the terrace portions T of the first and second conductive layers 110 counting from below, and covers the other regions in the second hook-up region $R_{HU2}$.

Figure 18:
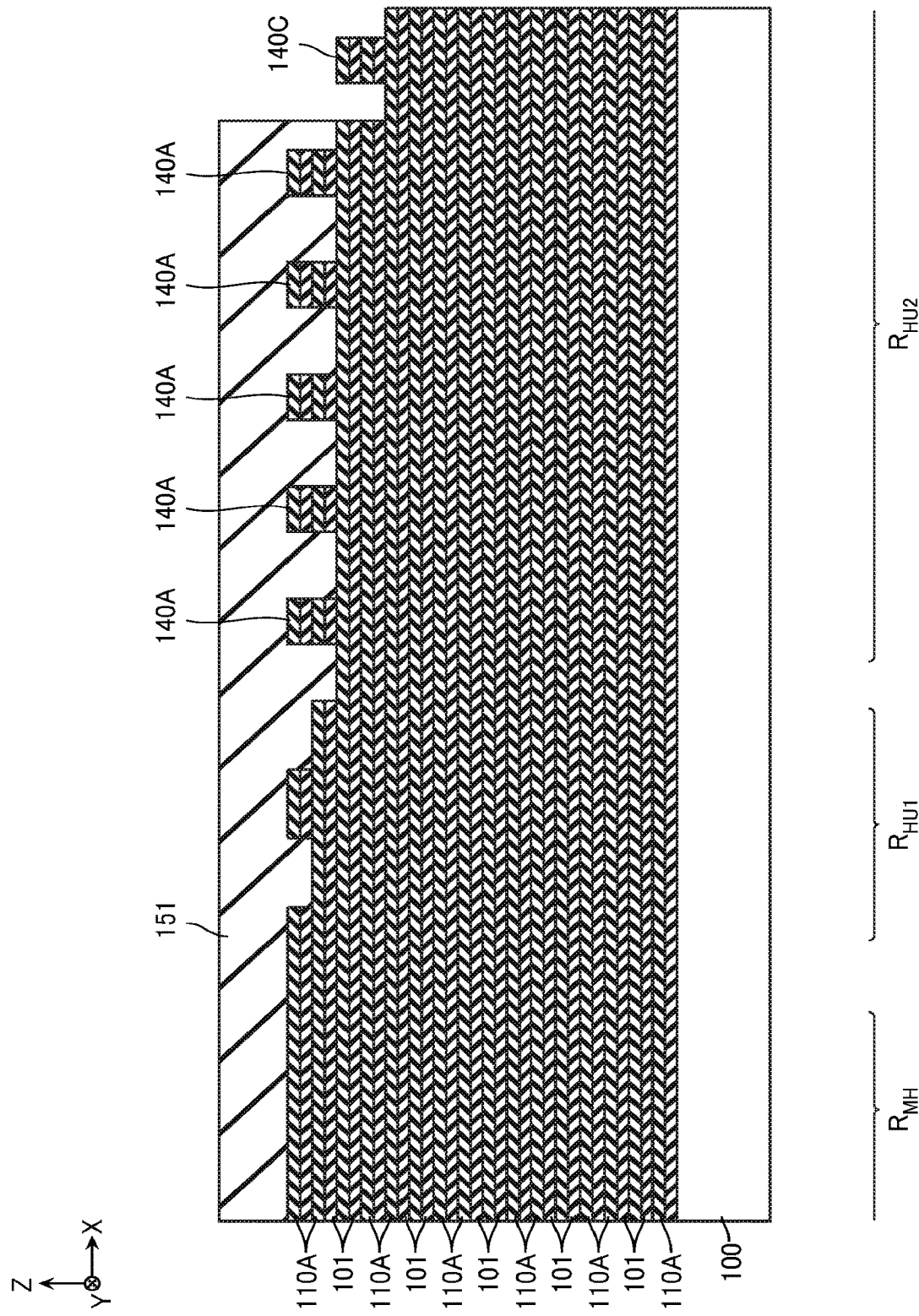
FIG. 18 is a schematic cross-sectional view illustrating the manufacturing method.

Next, for example, as illustrated in FIG. 18, removal of the sacrifice layer 110A and removal of the insulating layer 101 are alternately performed twice for each. This process is performed by a method such as wet etching or dry etching.

In this process, a plurality of structures 140C are formed at portions at which the plurality of structures 140A, 140B were disposed in the region not covered with the resist 151. The plurality of structures 140C corresponding to the plurality of structures 140A each include a part of the third and fourth sacrifice layers 110A counting from above and a part of the third and fourth insulating layers 101 counting from above. The plurality of structures 140C corresponding to the plurality of structures 140B each include a part of the fourth and fifth sacrifice layers 110A counting from above and a part of the fourth and fifth insulating layers 101 counting from above.

Figure 19:
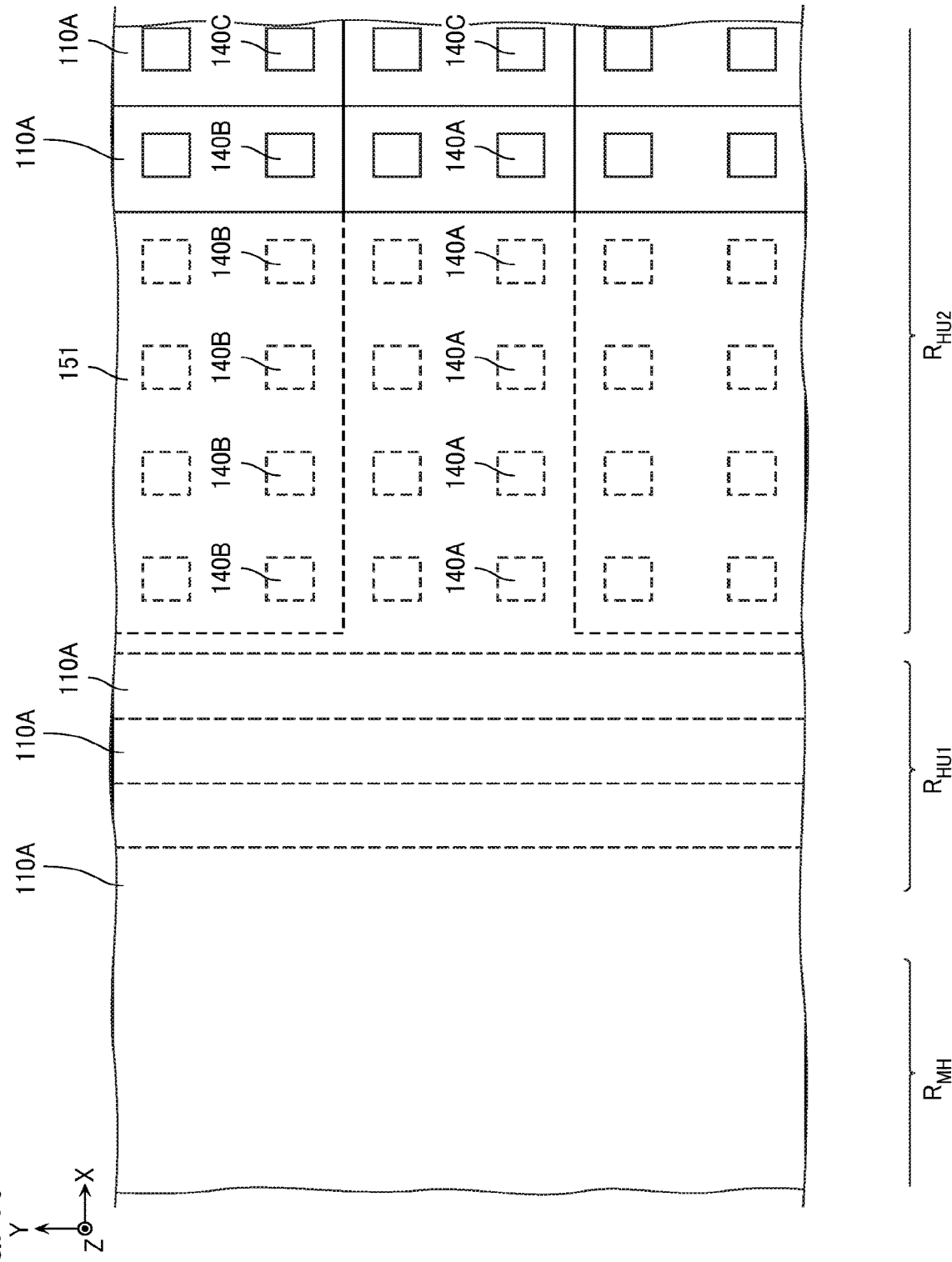
FIG. 19 is a schematic plan view illustrating the manufacturing method.
Figure 20:
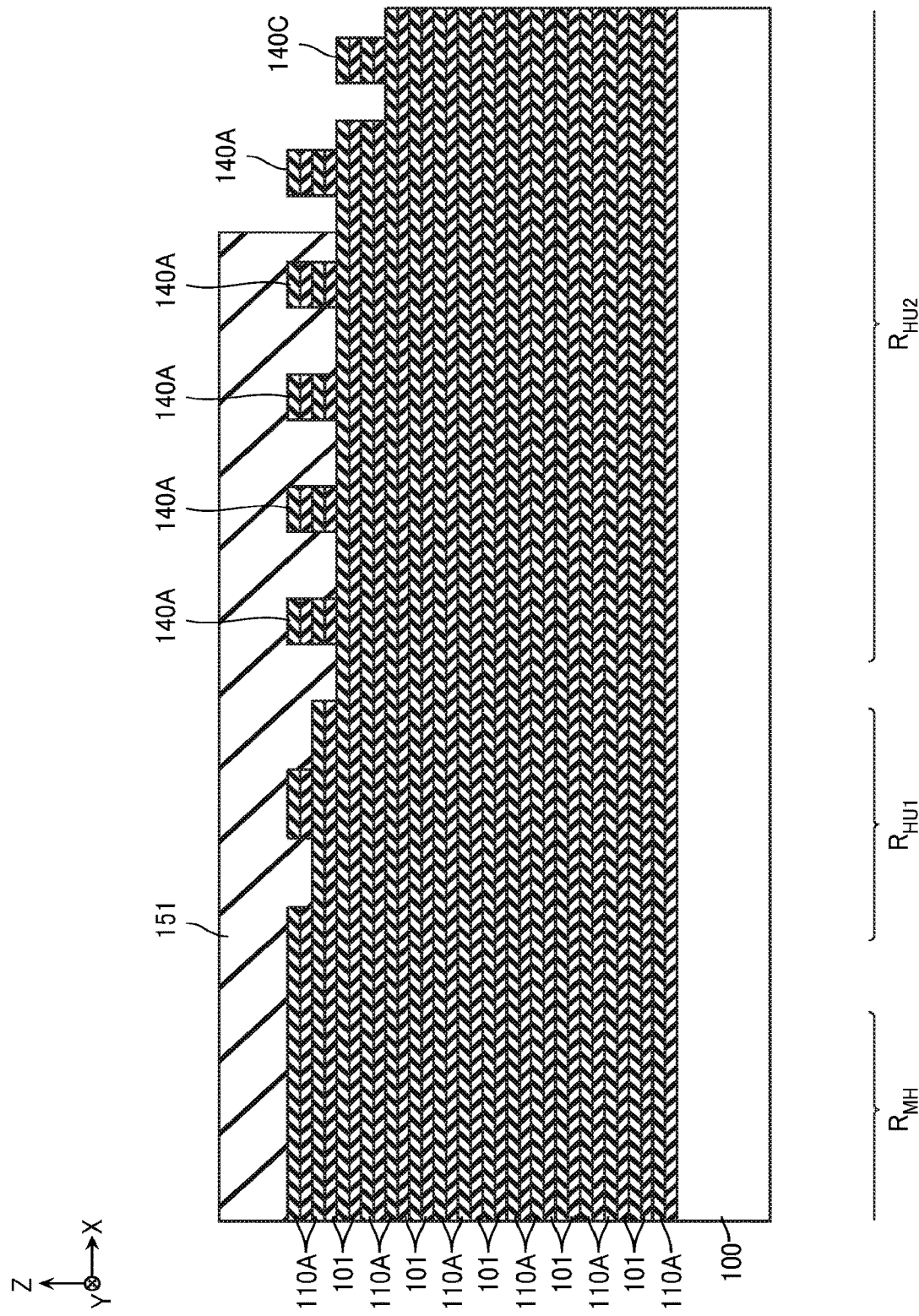
FIG. 20 is a schematic cross-sectional view illustrating the manufacturing method.

Next, for example, as illustrated in FIG. 19 and FIG. 20, a part of the resist 151 is removed. In this process, regions corresponding to the terrace portions T of the third and fourth conductive layers 110 counting from below in the second hook-up region $R_{HU2}$ are exposed.

Figure 21:
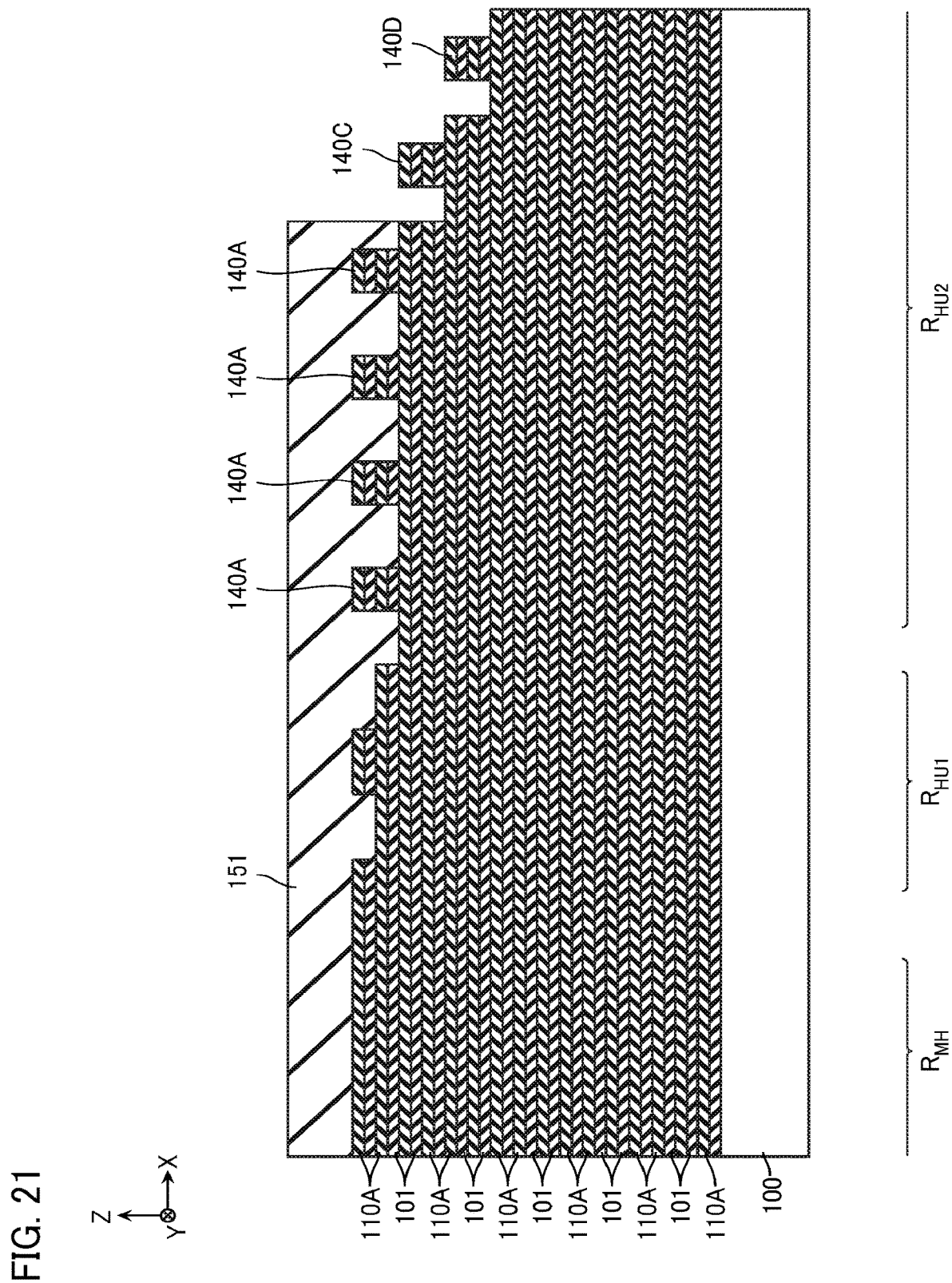
FIG. 21 is a schematic cross-sectional view illustrating the manufacturing method.

Next, for example, as illustrated in FIG. 21, removal of the sacrifice layer 110A and removal of the insulating layer 101 are alternately performed twice for each. This process is performed by a method such as wet etching or dry etching.

In this process, a plurality of structures 140C are formed at portions at which the plurality of structures 140A, 140B were disposed in the region not covered with the resist 151.

In this process, a plurality of structures 140D are formed at portions at which the plurality of structures 140C were disposed in the region not covered with the resist 151. A part of the structures 140D each include a part of the fifth and sixth sacrifice layers 110A counting from above and a part of the fifth and sixth insulating layers 101 counting from above. A part of the structures 140D each include a part of the sixth and seventh sacrifice layers 110A counting from above and a part of the sixth and seventh insulating layers 101 counting from above.

Figure 22:
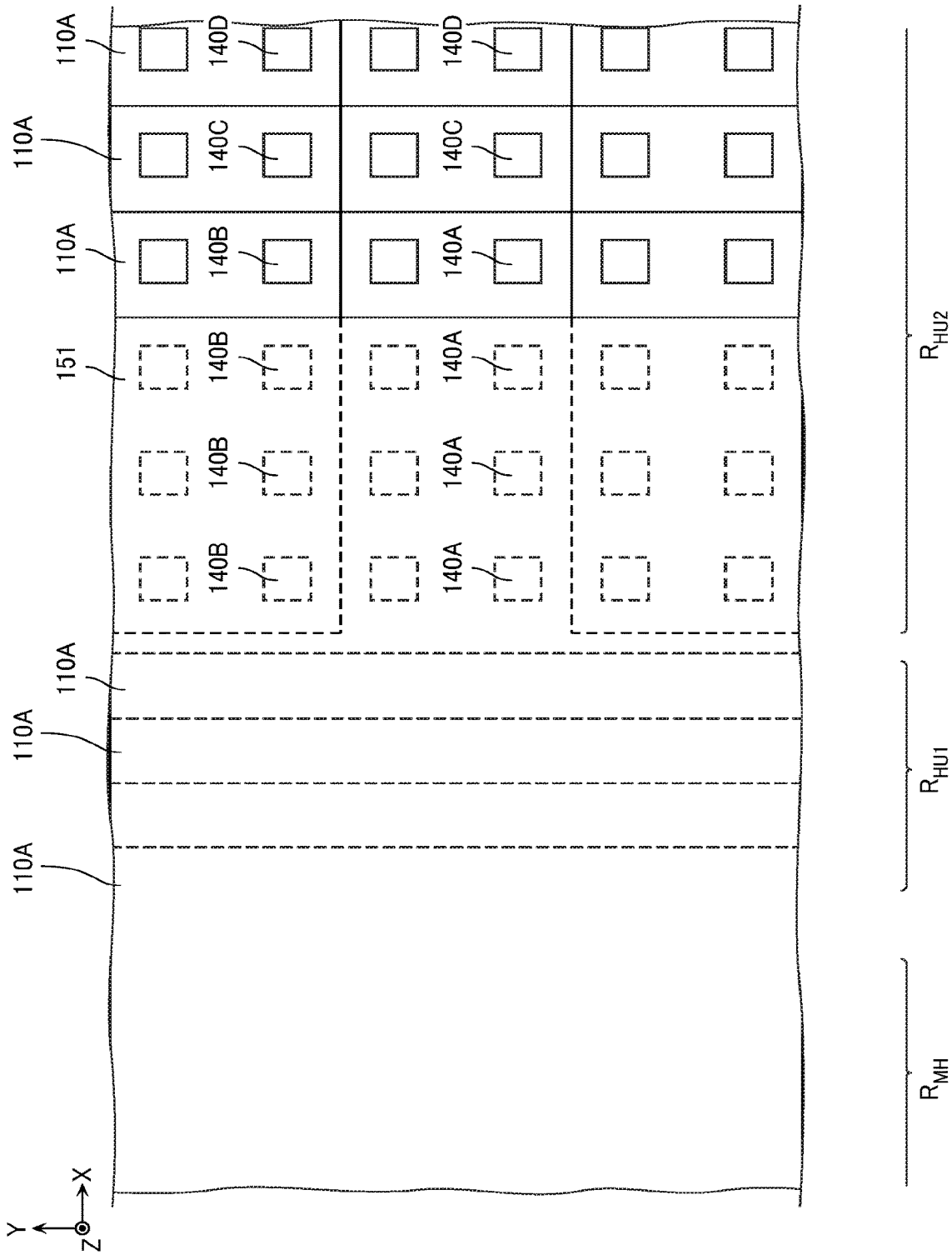
FIG. 22 is a schematic plan view illustrating the manufacturing method.
Figure 23:
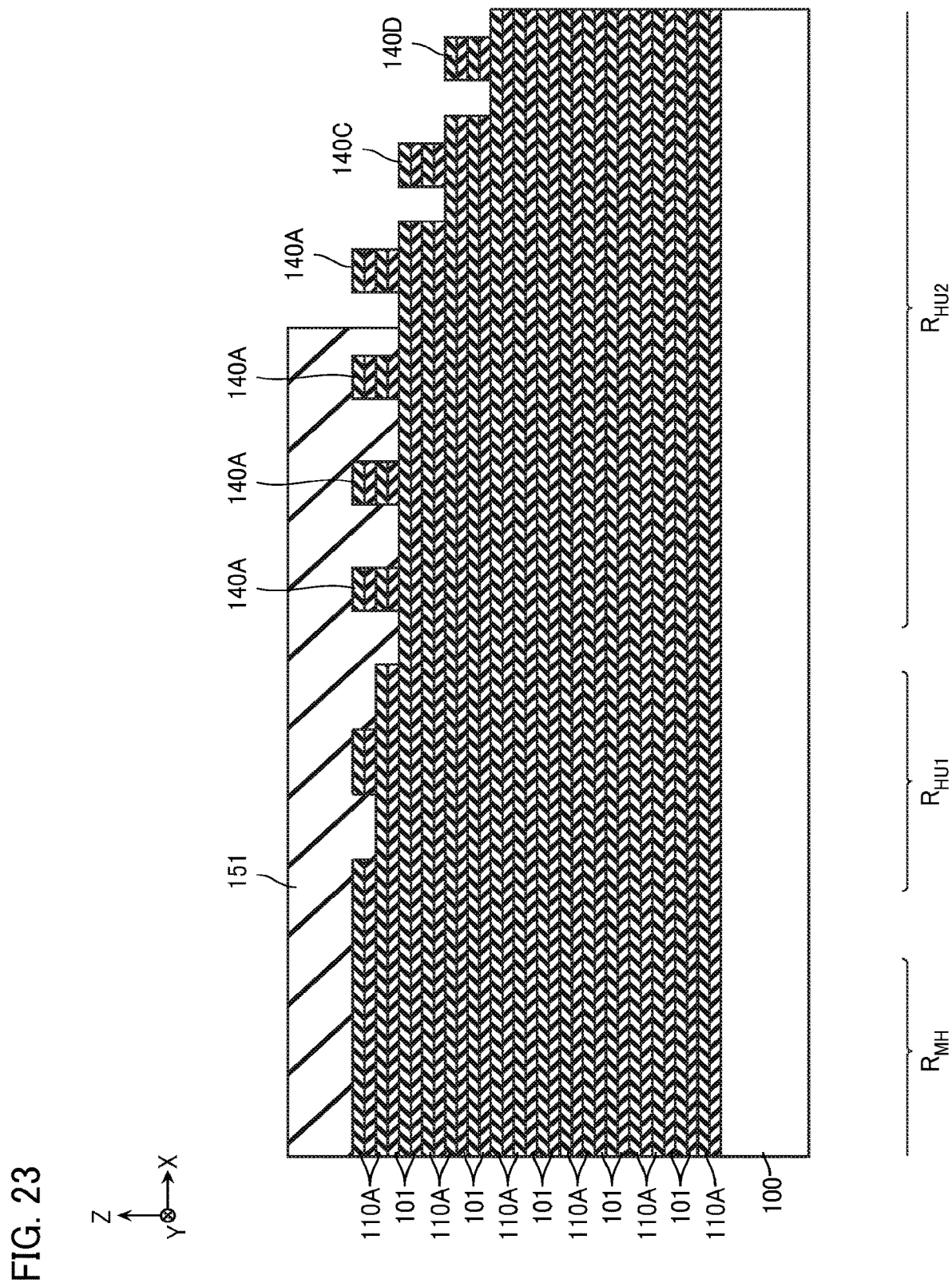
FIG. 23 is a schematic cross-sectional view illustrating the manufacturing method.

Next, for example, as illustrated in FIG. 22 and FIG. 23, a part of the resist 151 is removed. In this process, regions corresponding to the terrace portions T of the fifth and sixth conductive layers 110 counting from below in the second hook-up region $R_{HU2}$ are exposed.

Figure 24:
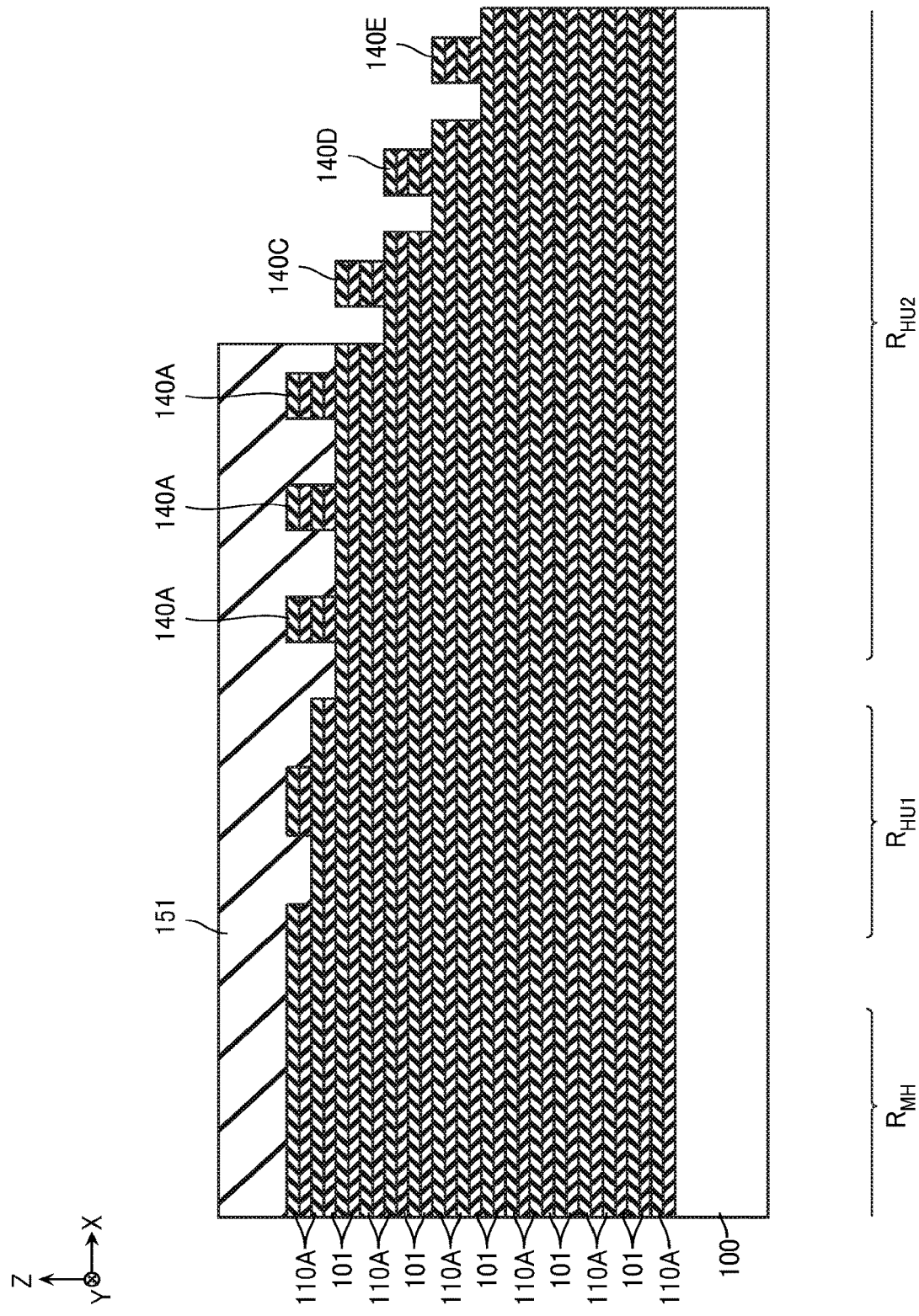
FIG. 24 is a schematic cross-sectional view illustrating the manufacturing method.

Next, for example, as illustrated in FIG. 24, removal of the sacrifice layer 110A and removal of the insulating layer 101 are alternately performed twice for each. This process is performed by a method such as wet etching or dry etching.

In this process, a plurality of structures 140C are formed at portions at which the plurality of structures 140A, 140B were disposed in the region not covered with the resist 151.

In this process, a plurality of structures 140D are formed at portions at which the plurality of structures 140C were disposed in the region not covered with the resist 151.

In this process, a plurality of structures 140E are formed at portions at which the plurality of structures 140D were disposed in the region not covered with the resist 151. A part of the structures 140E each include a part of the seventh and eighth sacrifice layers 110A counting from above and a part of the seventh and eighth insulating layers 101 counting from above. A part of the structures 140E each include a part of the eighth and ninth sacrifice layers 110A counting from above and a part of the eighth and ninth insulating layers 101 counting from above.

In the following, similarly, the process of removing a part of the resist 151 and the process of alternately performing the removal of the sacrifice layer 110A and the removal of the insulating layer 101 twice for each are repeatedly performed. Thus, the structure as illustrated in FIG. 25 and FIG. 26 is formed.

Figure 25:
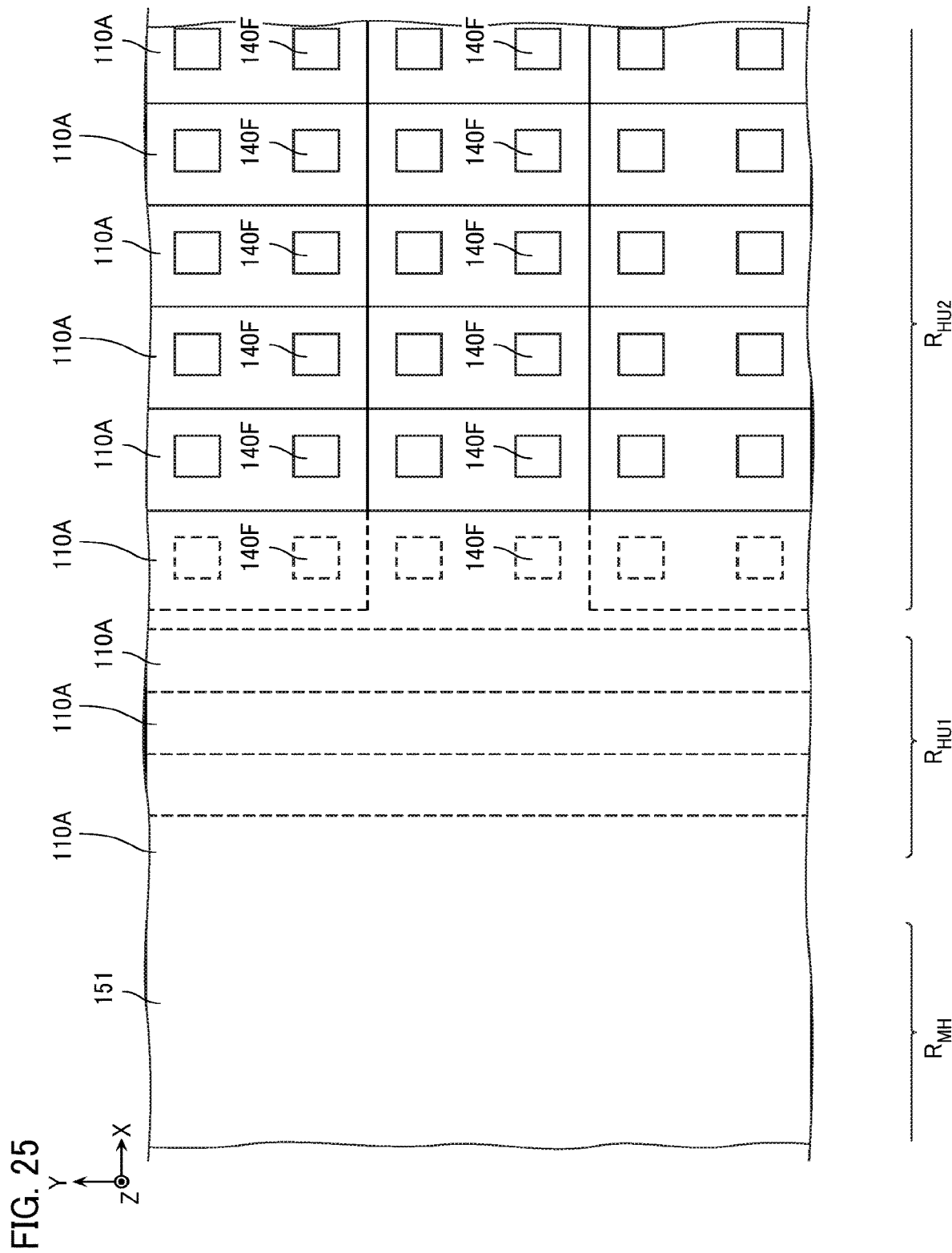
FIG. 25 is a schematic plan view illustrating the manufacturing method.
Figure 26:
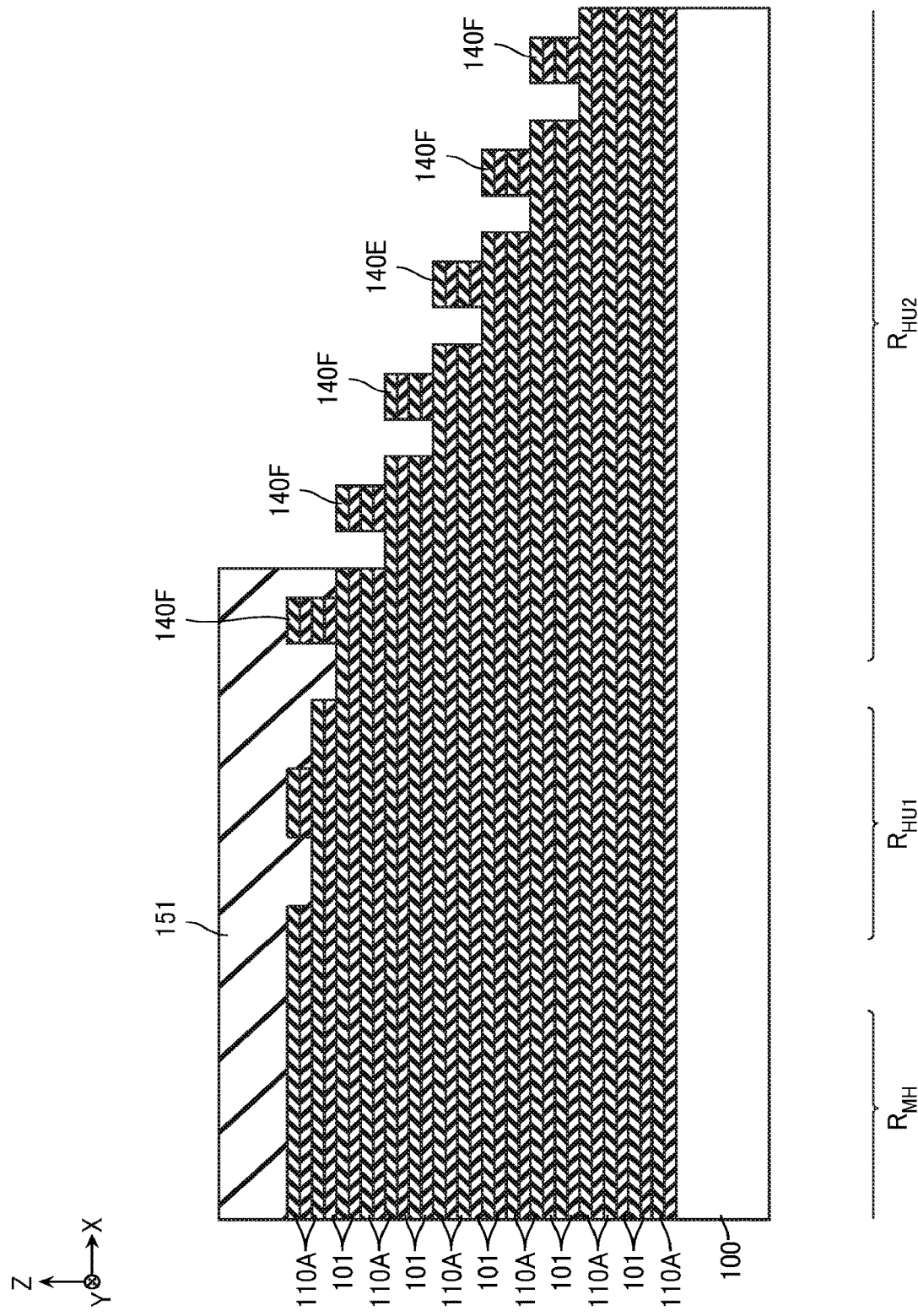
FIG. 26 is a schematic cross-sectional view illustrating the manufacturing method.

FIG. 25 and FIG. 26 illustrate a plurality of structures 140F. These plurality of structures 140F are each disposed on the upper surface of the b-th (b is an integer of 3 or more) sacrifice layer 110A counting from above. These plurality of structures 140F each include a part of the b-2-th and b-1-th sacrifice layers 110A counting from above and a part of the b-2-th and b-1-th insulating layers 101 counting from above.

Figure 27:
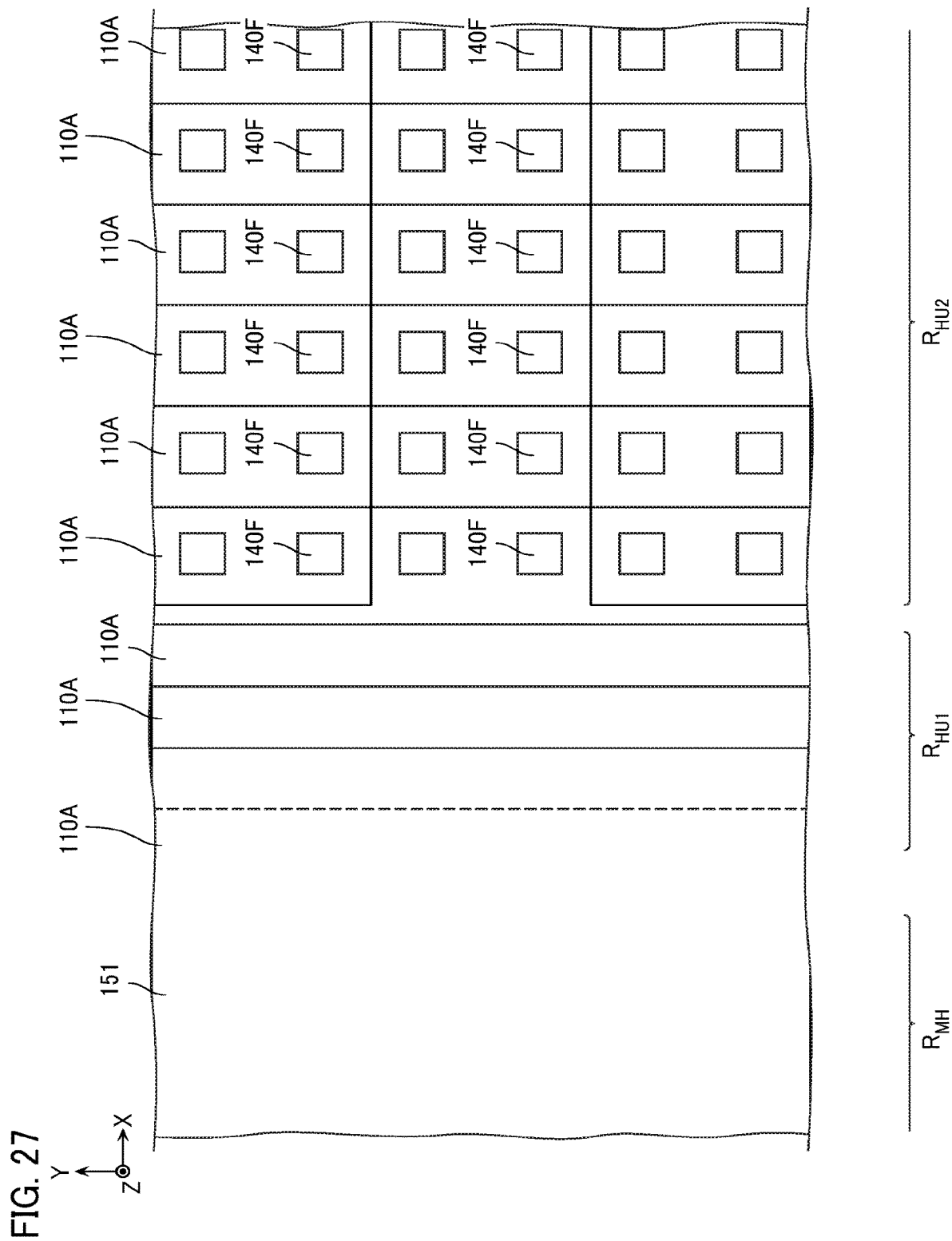
FIG. 27 is a schematic plan view illustrating the manufacturing method.
Figure 28:
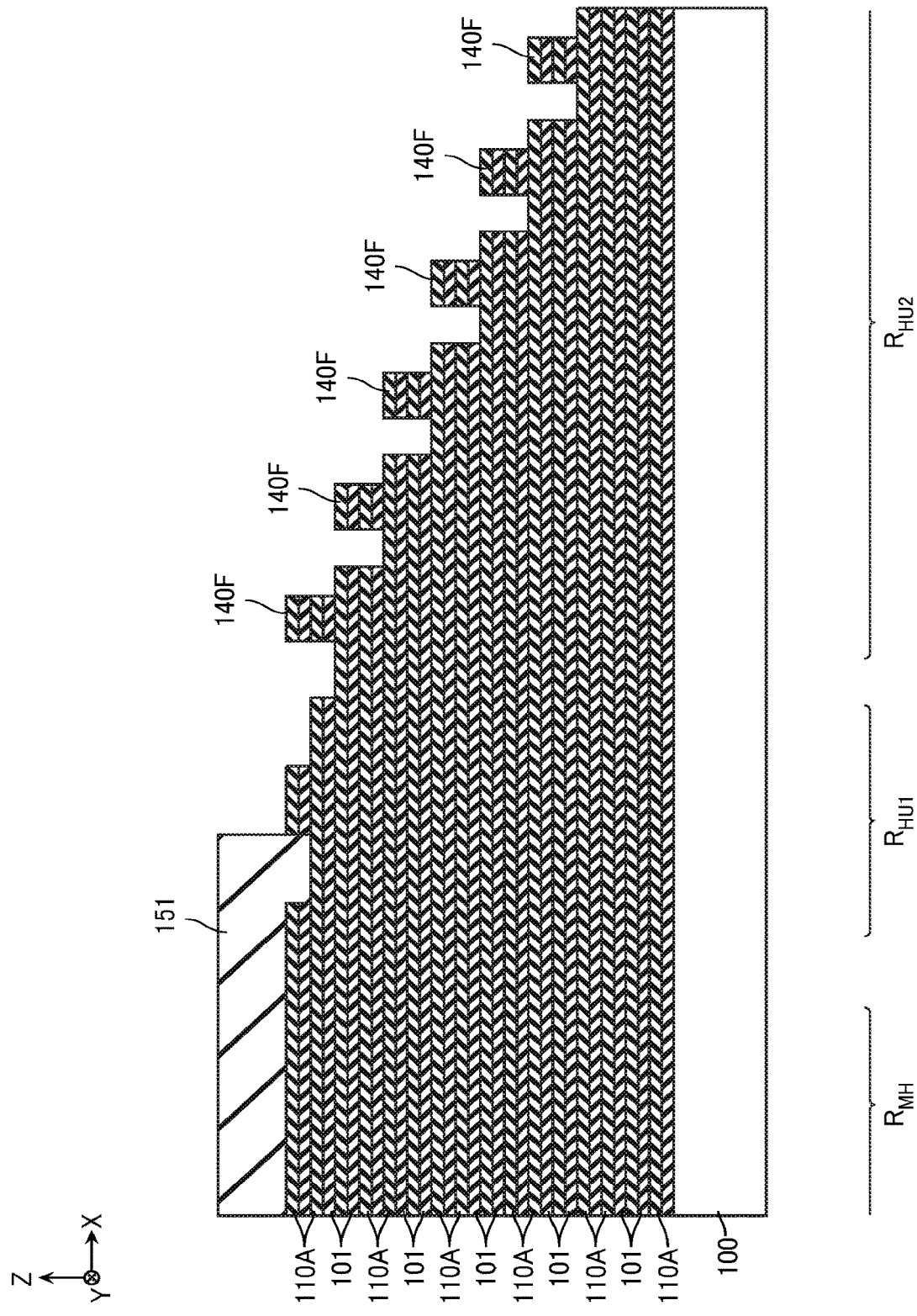
FIG. 28 is a schematic cross-sectional view illustrating the manufacturing method.

Next, for example, as illustrated in FIG. 27 and FIG. 28, a part of the resist 151 is removed. In this process, the whole of the second hook-up region $R_{HU2}$ is exposed. In the first hook-up region $R_{HU1}$, regions corresponding to the terrace portions T of the first and second conductive layers 110 counting from above are covered with the resist 151, and the other regions are exposed.

Figure 29:
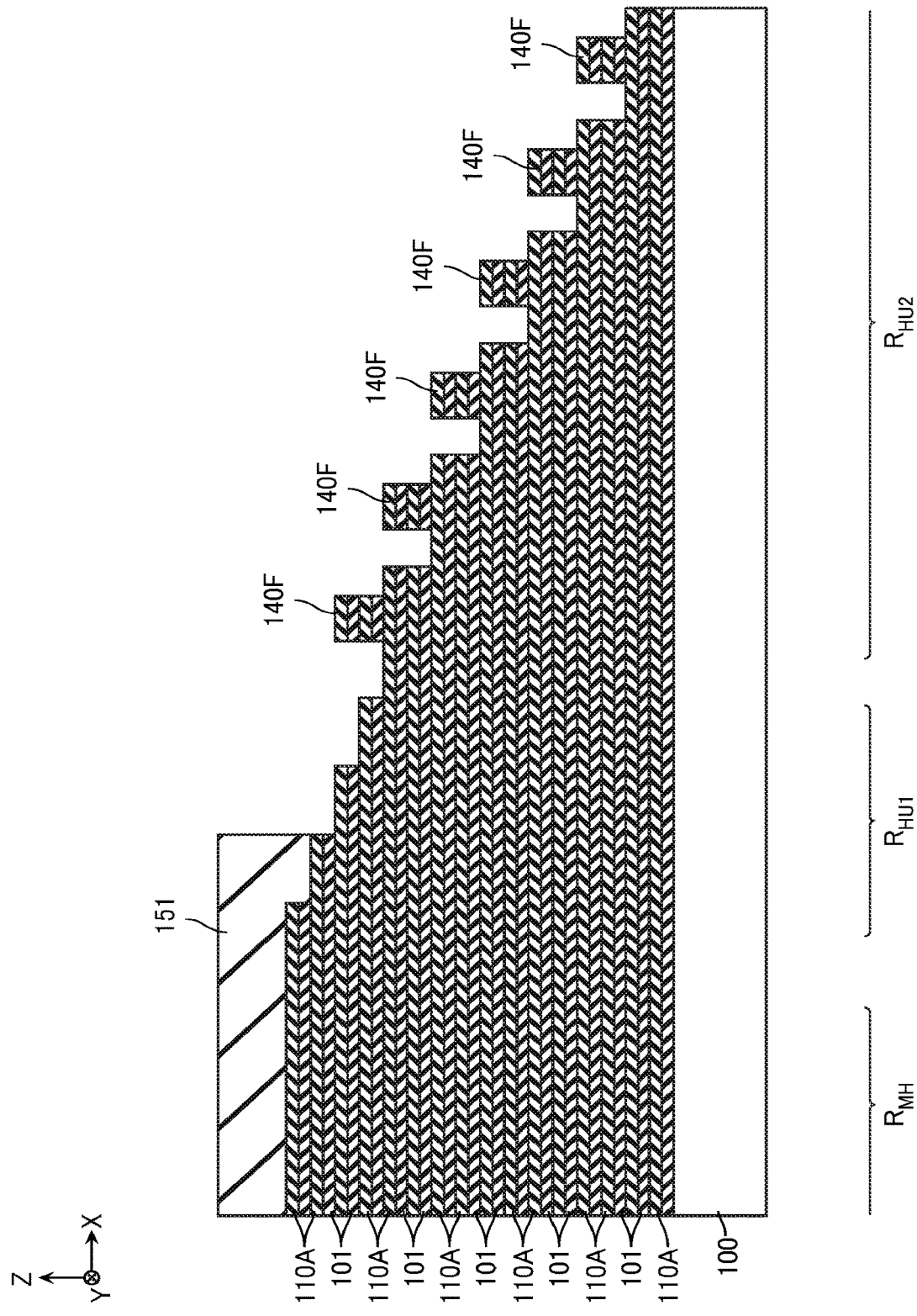
FIG. 29 is a schematic cross-sectional view illustrating the manufacturing method.

Next, for example, as illustrated in FIG. 29, removal of the sacrifice layer 110A and removal of the insulating layer 101 are alternately performed twice for each. This process is performed by a method such as wet etching or dry etching.

Figure 30:
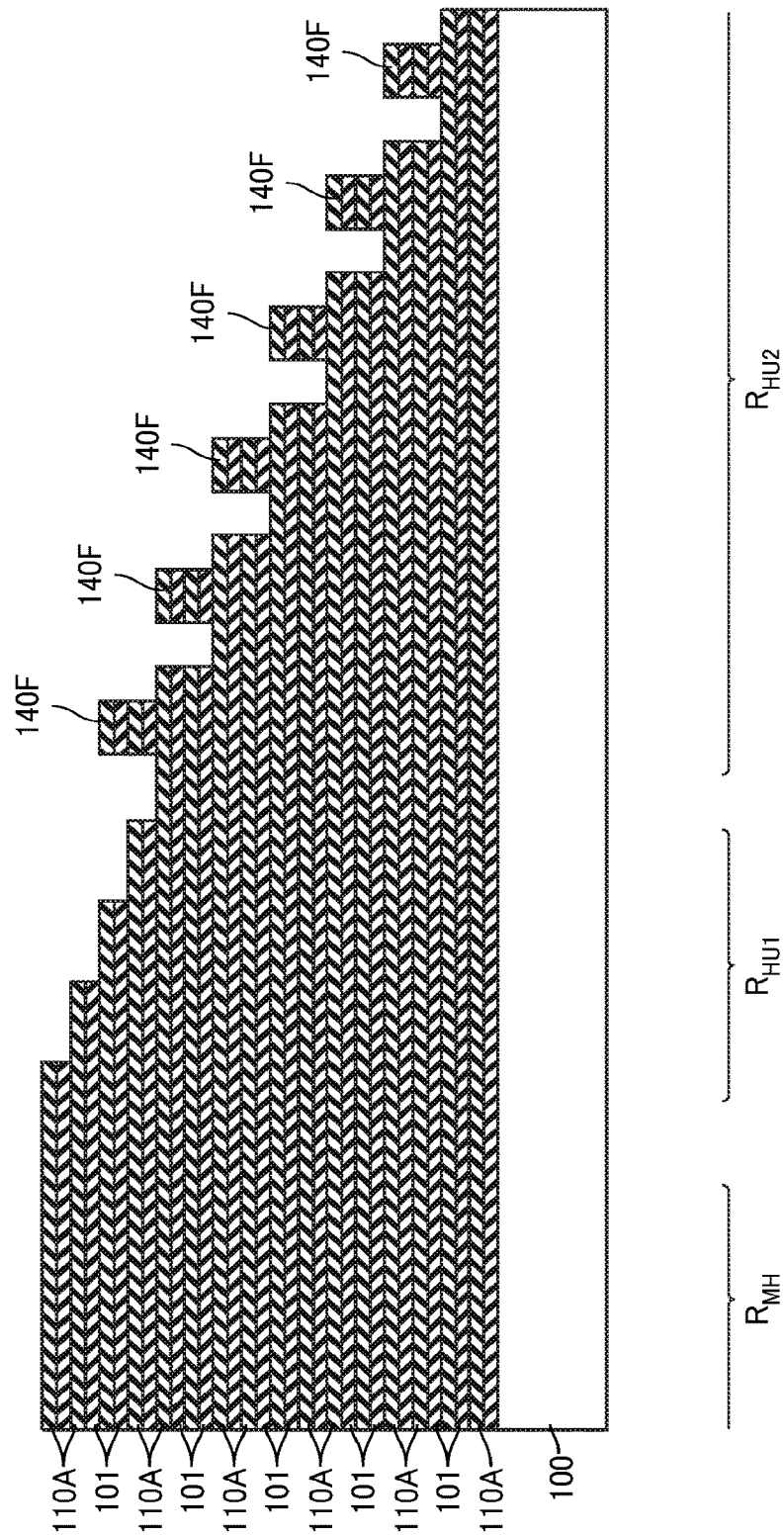
FIG. 30 is a schematic cross-sectional view illustrating the manufacturing method.
Figure 31:
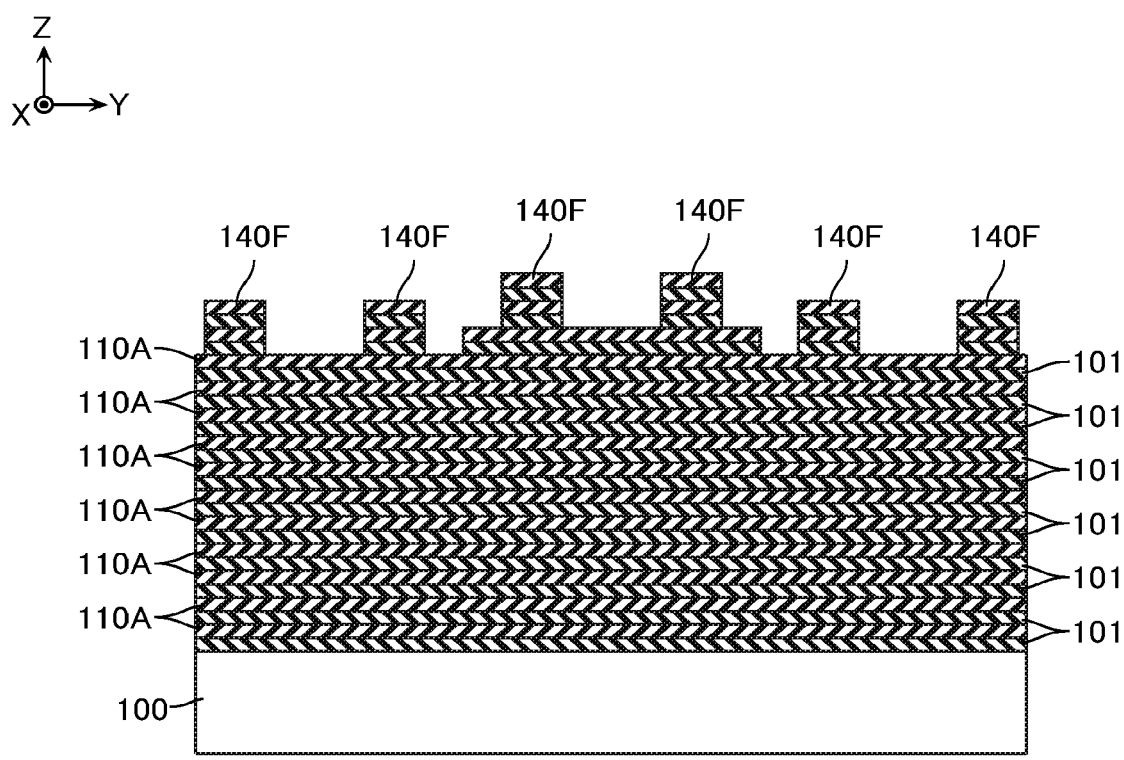
FIG. 31 is a schematic cross-sectional view illustrating the manufacturing method.

Next, for example, as illustrated in FIG. 30 and FIG. 31, the resist 151 is removed.

Figure 32:
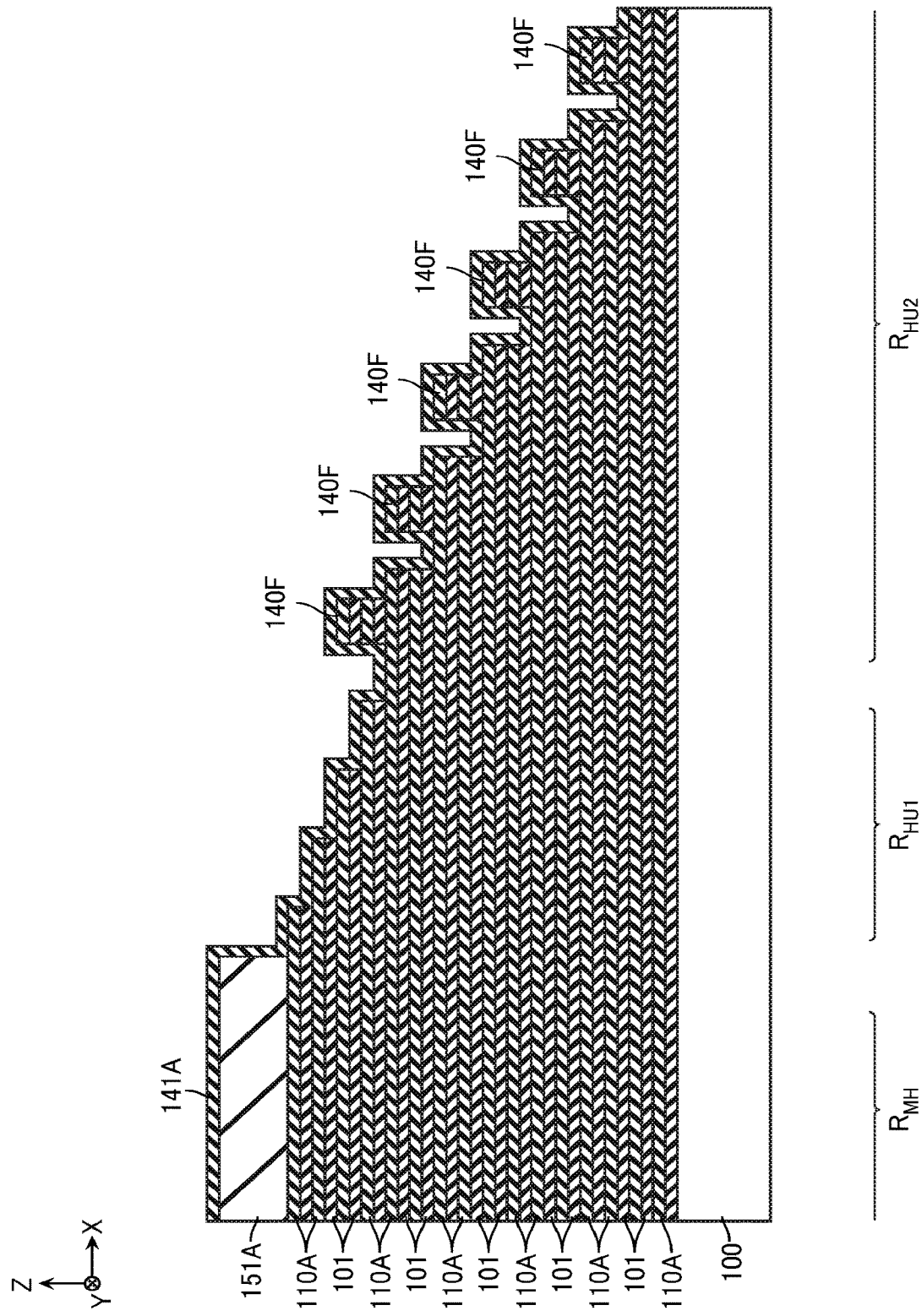
FIG. 32 is a schematic cross-sectional view illustrating the manufacturing method.
Figure 33:
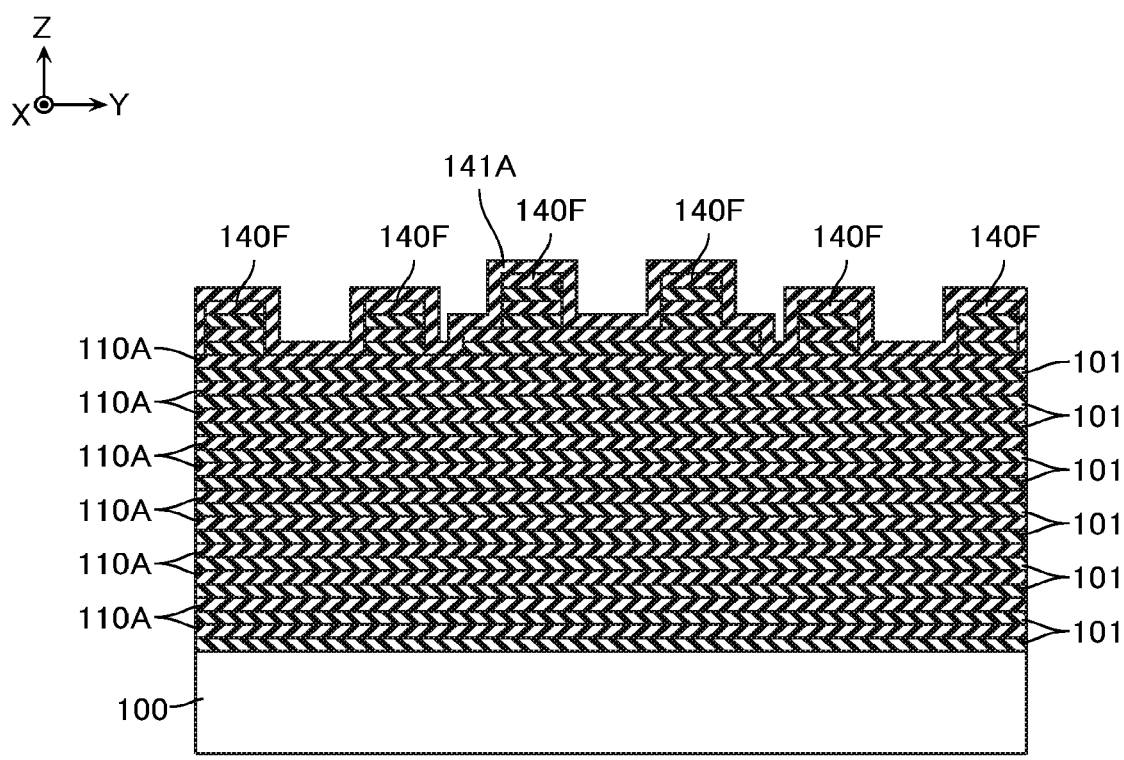
FIG. 33 is a schematic cross-sectional view illustrating the manufacturing method.

Next, for example, as illustrated in FIG. 32, a resist 151A is formed over the memory hole region $R_{MH}$. As illustrated in FIG. 32 and FIG. 33, a sacrifice layer 141A is formed. The sacrifice layer 141A contains silicon nitride (SiN) or the like. The sacrifice layer 141A covers upper surfaces of the plurality of sacrifice layers 110A and side surfaces of the plurality of sacrifice layers 110A and the plurality of insulating layers 101 in the X-direction and the Y-direction. The sacrifice layer 141A also covers upper surfaces, both side surfaces in the X-direction, and both side surfaces in the Y-direction of the plurality of structures 140F.

Figure 34:
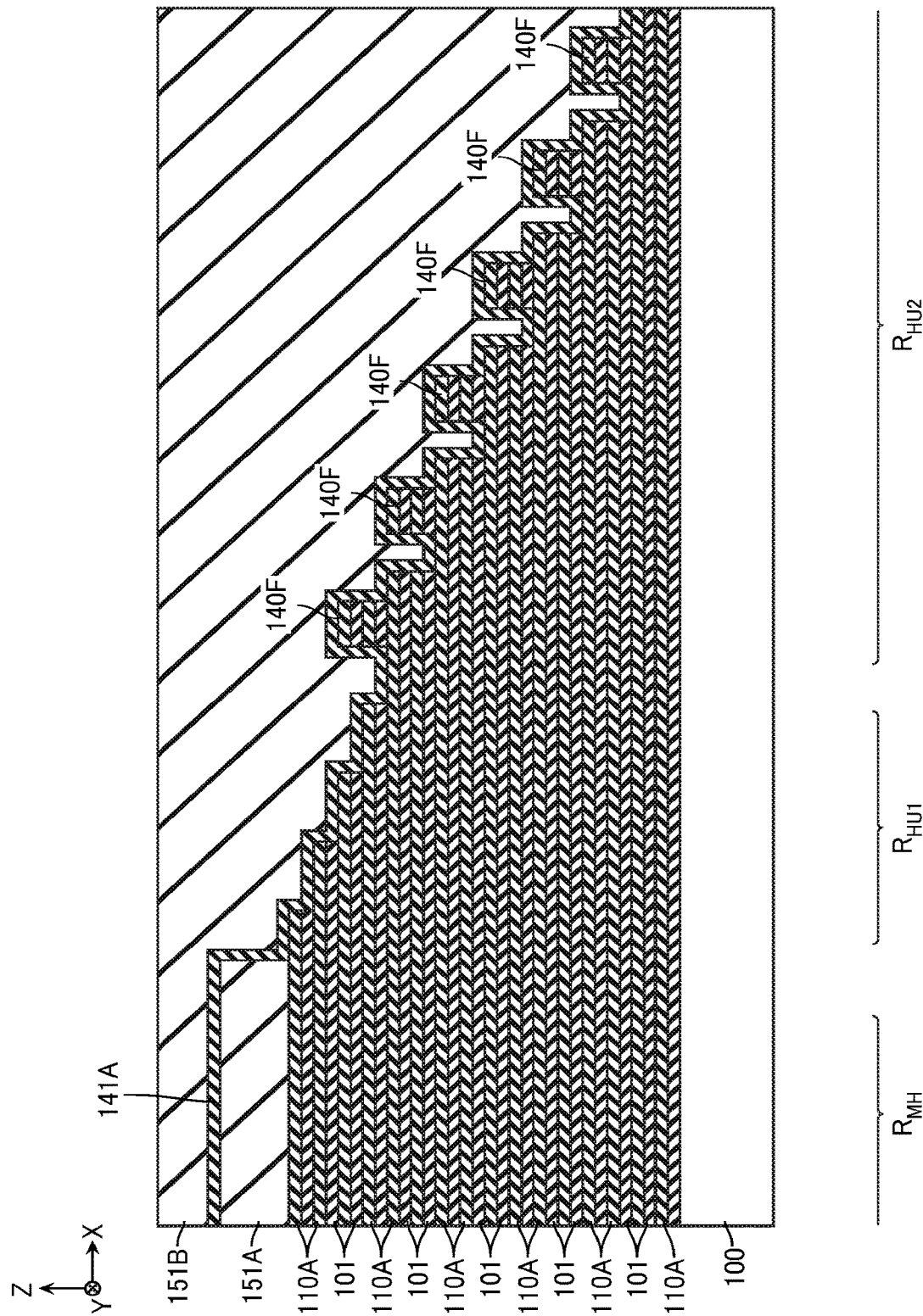
FIG. 34 is a schematic cross-sectional view illustrating the manufacturing method.

Next, for example, as illustrated in FIG. 34, a resist 151B is formed over the memory hole region $R_{MH}$, the first hook-up region $R_{HU1}$, and the second hook-up region $R_{HU2}$.

Figure 35:
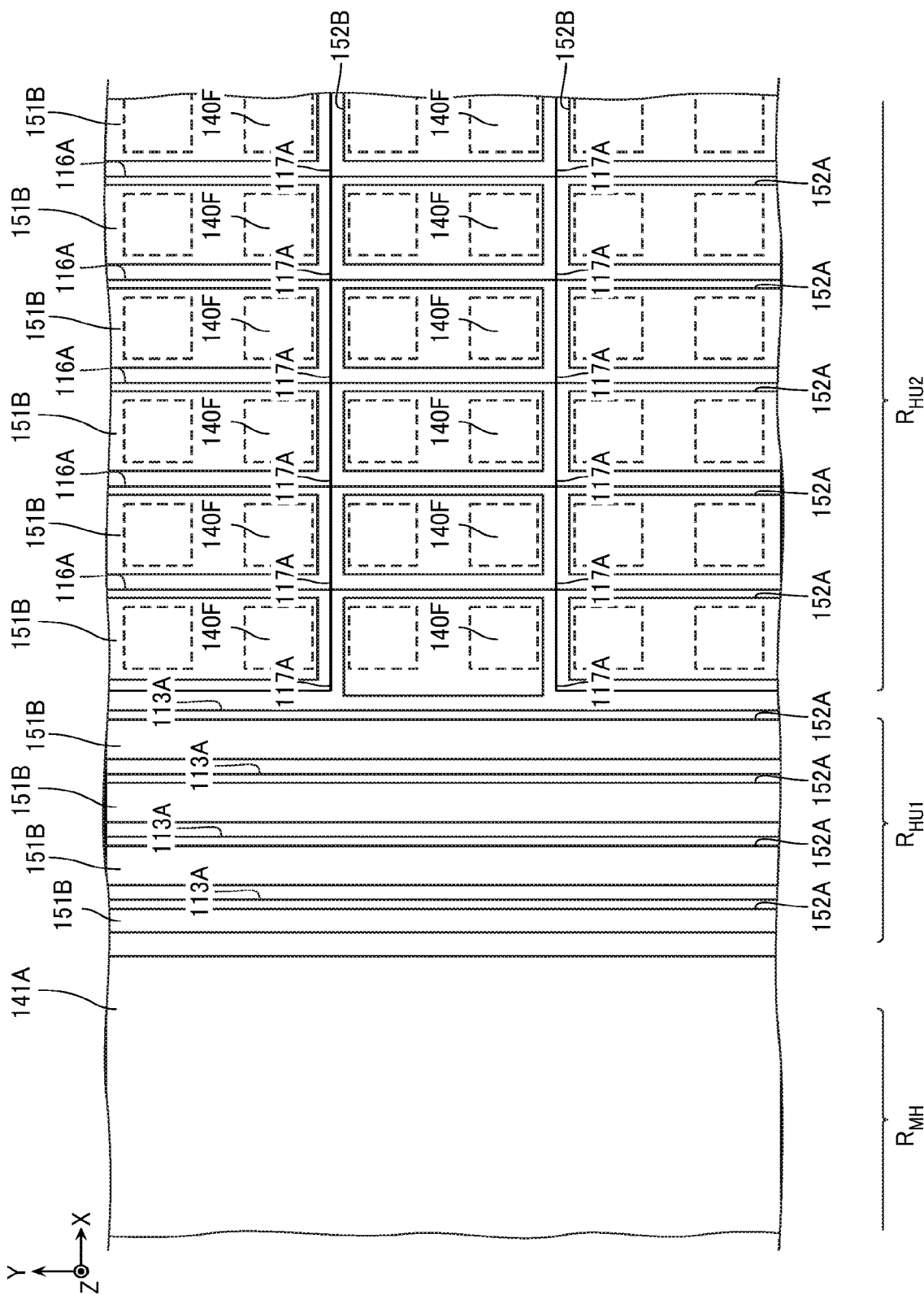
FIG. 35 is a schematic plan view illustrating the manufacturing method.
Figure 36:
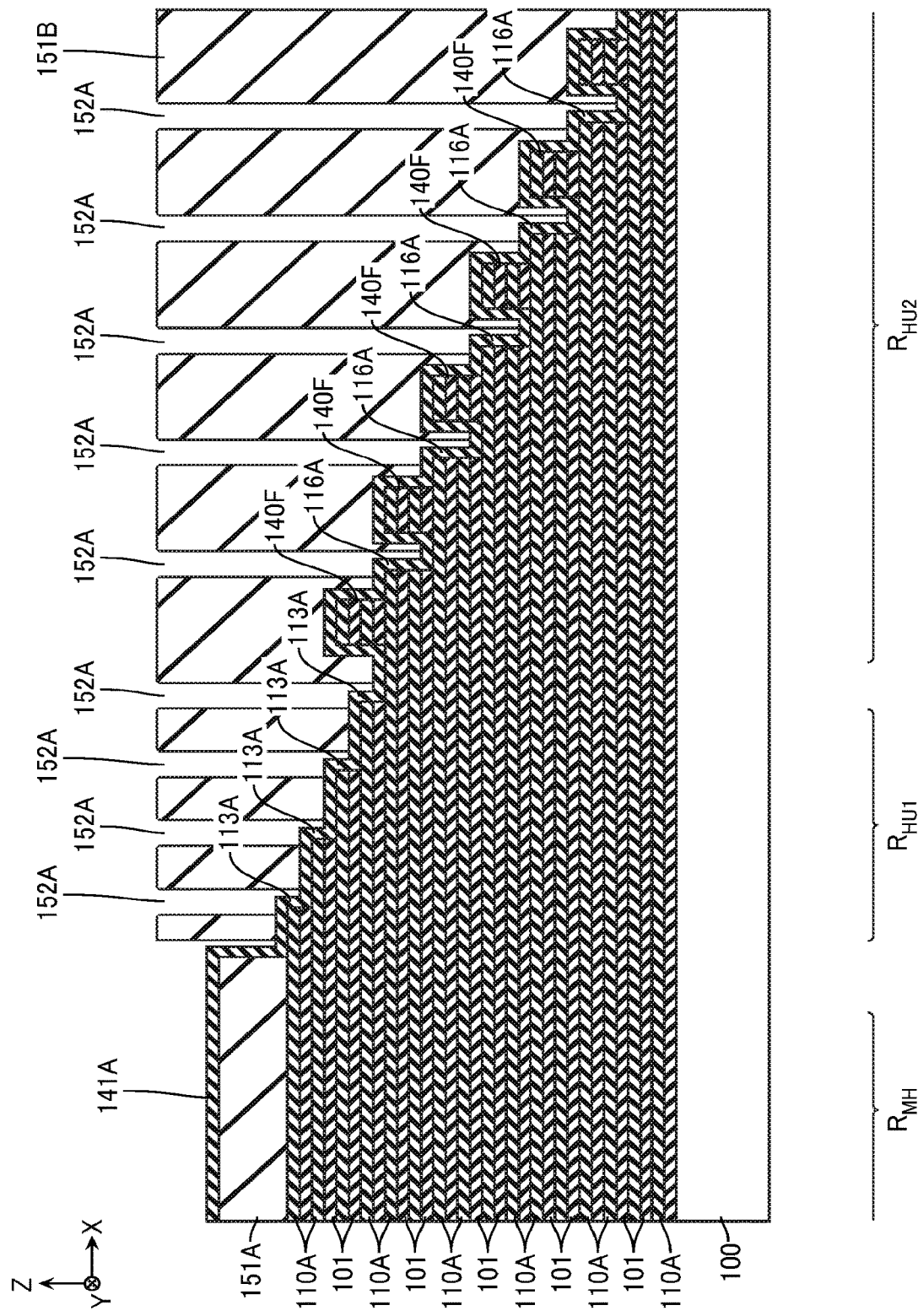
FIG. 36 is a schematic cross-sectional view illustrating the manufacturing method.
Figure 37:
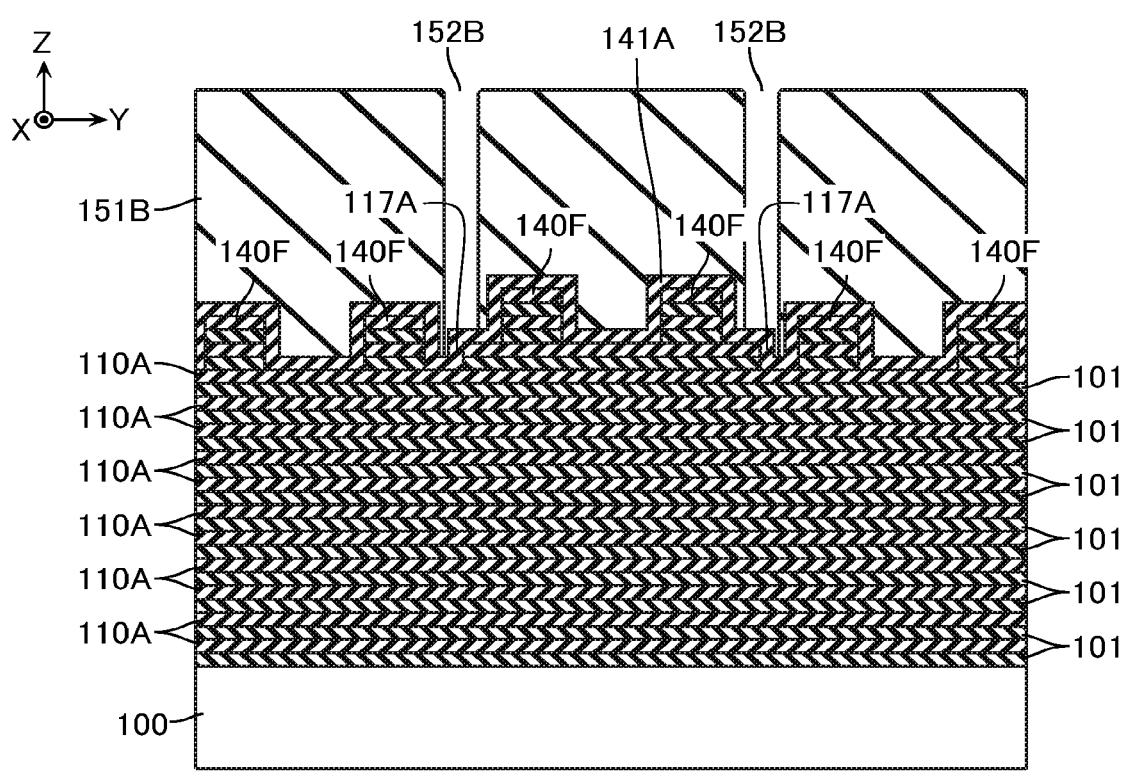
FIG. 37 is a schematic cross-sectional view illustrating the manufacturing method.

Next, for example, as illustrated in FIG. 35 and FIG. 36, the part of the resist 151B covering the upper surface and the side surface in the X-direction of the resist 151A is removed. For example, as illustrated in FIG. 35 to FIG. 37, a plurality of openings 152A and a plurality of openings 152B are provided to the resist 151B.

For example, as illustrated in FIG. 35, the plurality of openings 152A extend in the Y-direction and are arranged in the X-direction. For example, as illustrated in FIG. 36, the plurality of openings 152A provided in the second hook-up region $R_{HU2}$ expose parts 116A of the sacrifice layer 141A covering the edge portions 116 (FIG. 4) of the plurality of sacrifice layers 110A (and the plurality of insulating layers 101) in the X-direction. The plurality of openings 152A provided in the first hook-up region $R_{HU1}$ expose parts 113A of the sacrifice layer 141A covering the edge portions 113 (FIG. 4) of the plurality of sacrifice layers 110A (and the plurality of insulating layers 101) in the X-direction. However, the plurality of structures 140F are not exposed from the openings 152A.

For example, as illustrated in FIG. 35, the plurality of openings 152B extend in the X-direction in the second hook-up region $R_{HU2}$, and are arranged in the Y-direction. For example, as illustrated in FIG. 37, the plurality of openings 152B expose parts 117A of the sacrifice layer 141A covering the side surfaces of the plurality of sacrifice layers 110A and the plurality of insulating layers 101 formed in one side of both end portions 117 (FIG. 3) of the terrace portion T in the Y-direction. However, the plurality of structures 140F are not exposed from the openings 152B.

Figure 38:
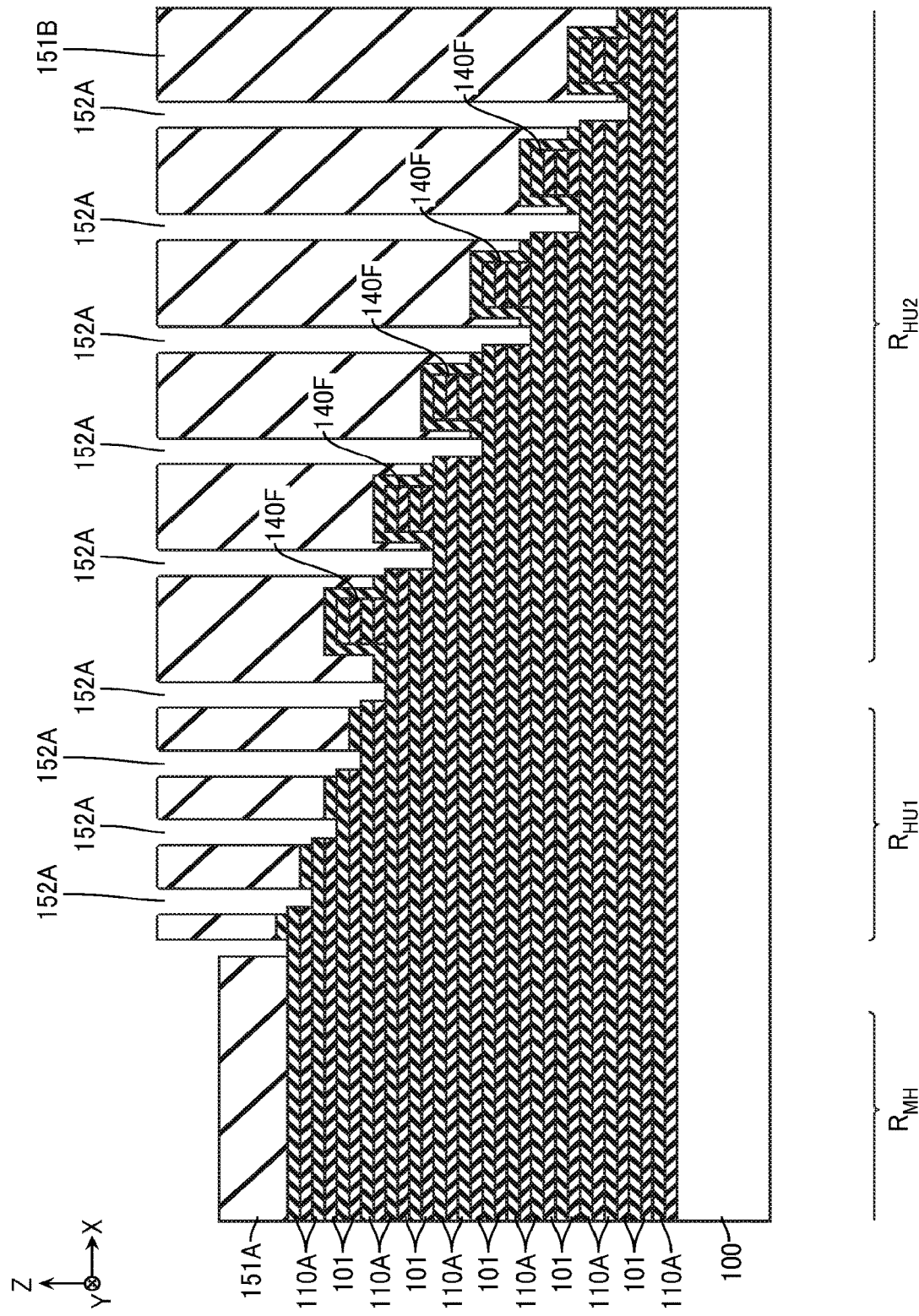
FIG. 38 is a schematic cross-sectional view illustrating the manufacturing method.
Figure 39:
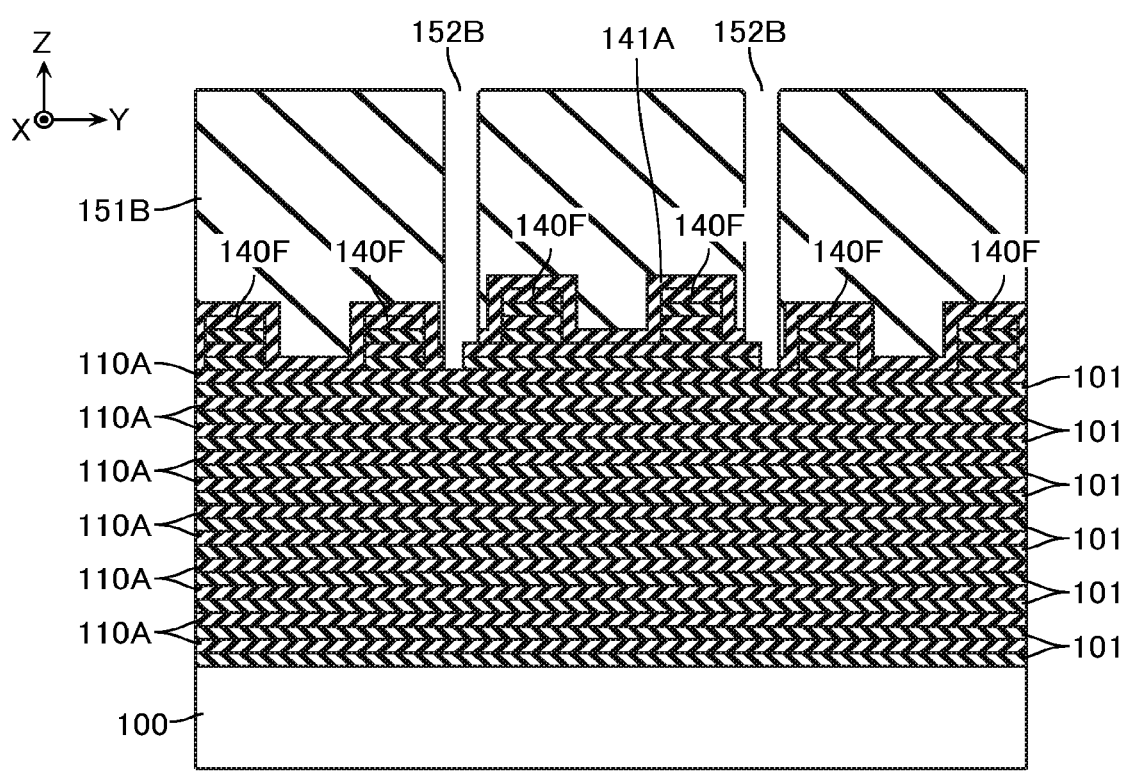
FIG. 39 is a schematic cross-sectional view illustrating the manufacturing method.

Next, for example, as illustrated in FIG. 38 and FIG. 39, in the sacrifice layer 141A, parts covering the upper surface and the side surface in the X-direction of the resist 151A, and the parts 113A, 116A, 117A covering the respective side surfaces of the plurality of sacrifice layers 110A and the plurality of insulating layers 101 in the X-direction and the Y-direction are removed. This process is performed by a method, such as isotropic wet etching or isotropic dry etching.

Figure 40:
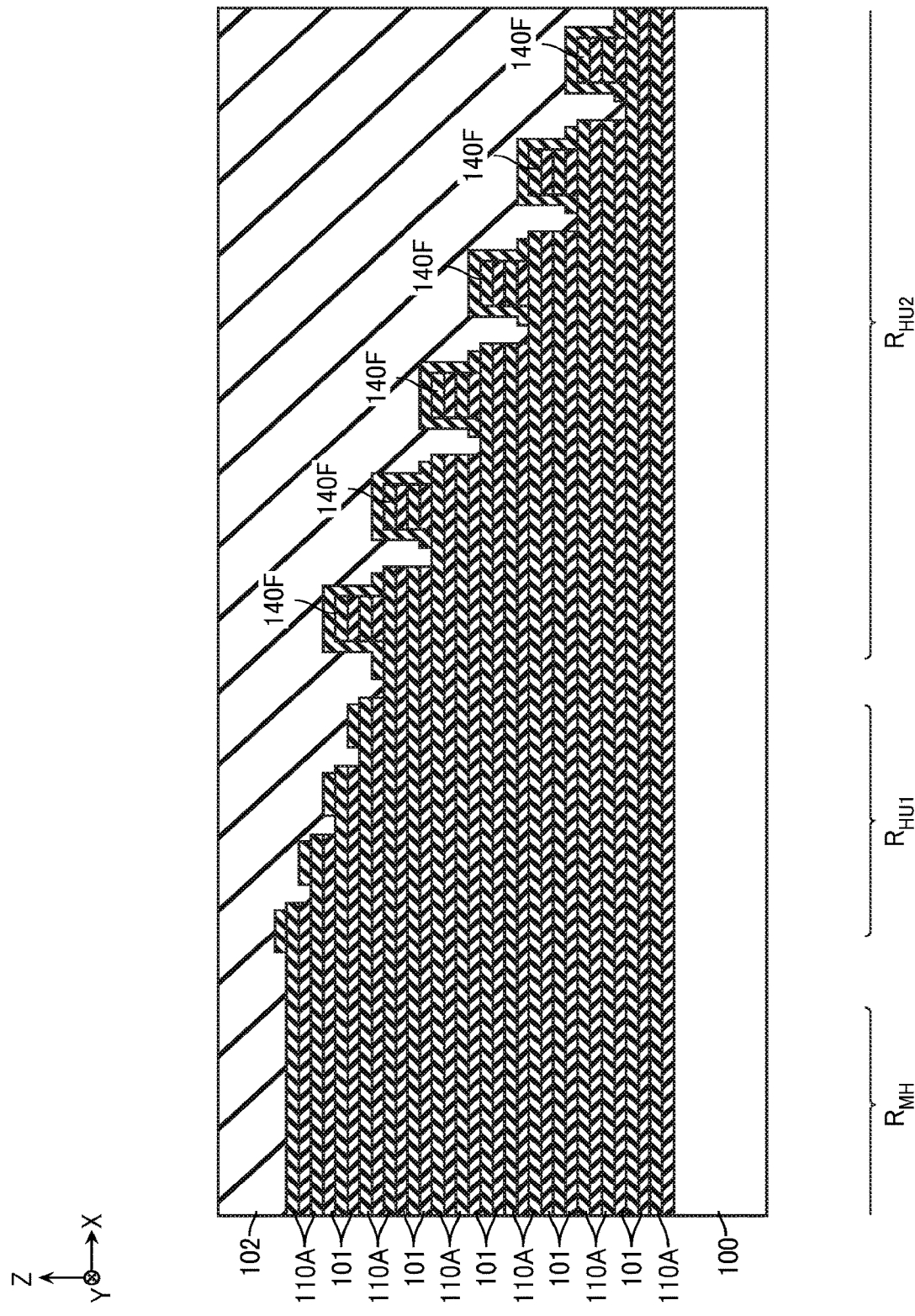
FIG. 40 is a schematic cross-sectional view illustrating the manufacturing method.
Figure 41:
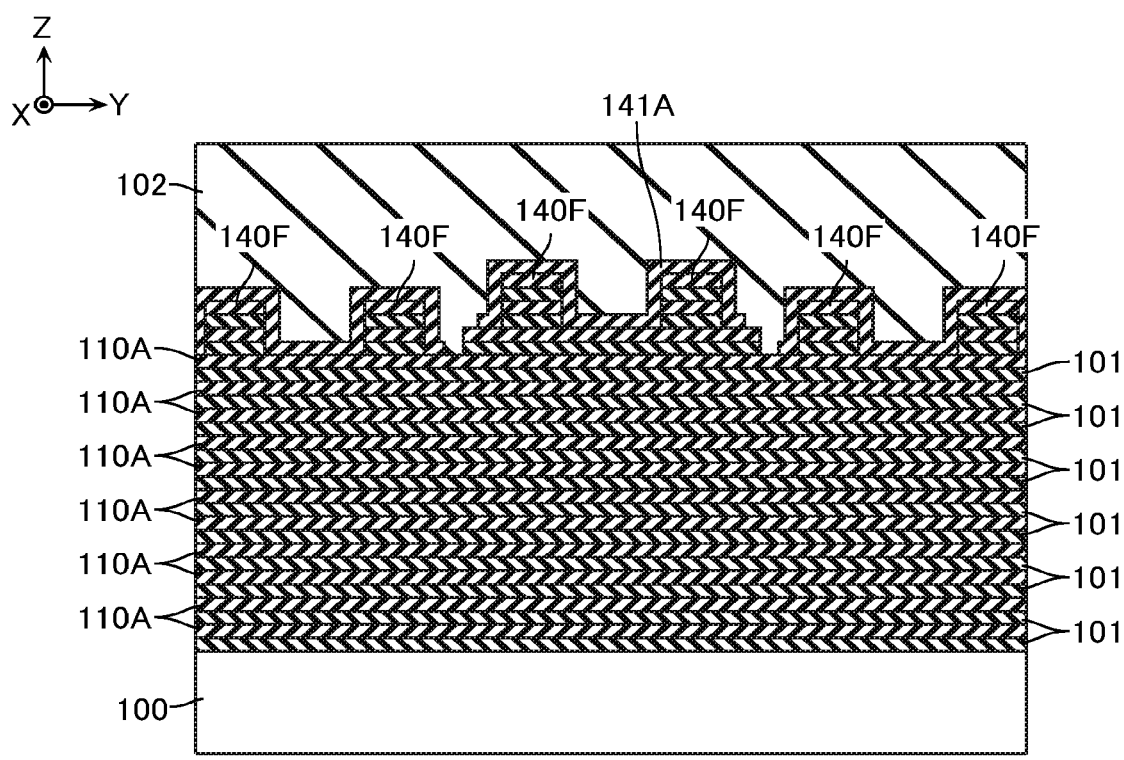
FIG. 41 is a schematic cross-sectional view illustrating the manufacturing method.

Next, for example, as illustrated in FIG. 40 and FIG. 41, the resists 151A, 151B are removed. An insulating layer 102 is formed. This process is performed by a method such as CVD.

Figure 42:
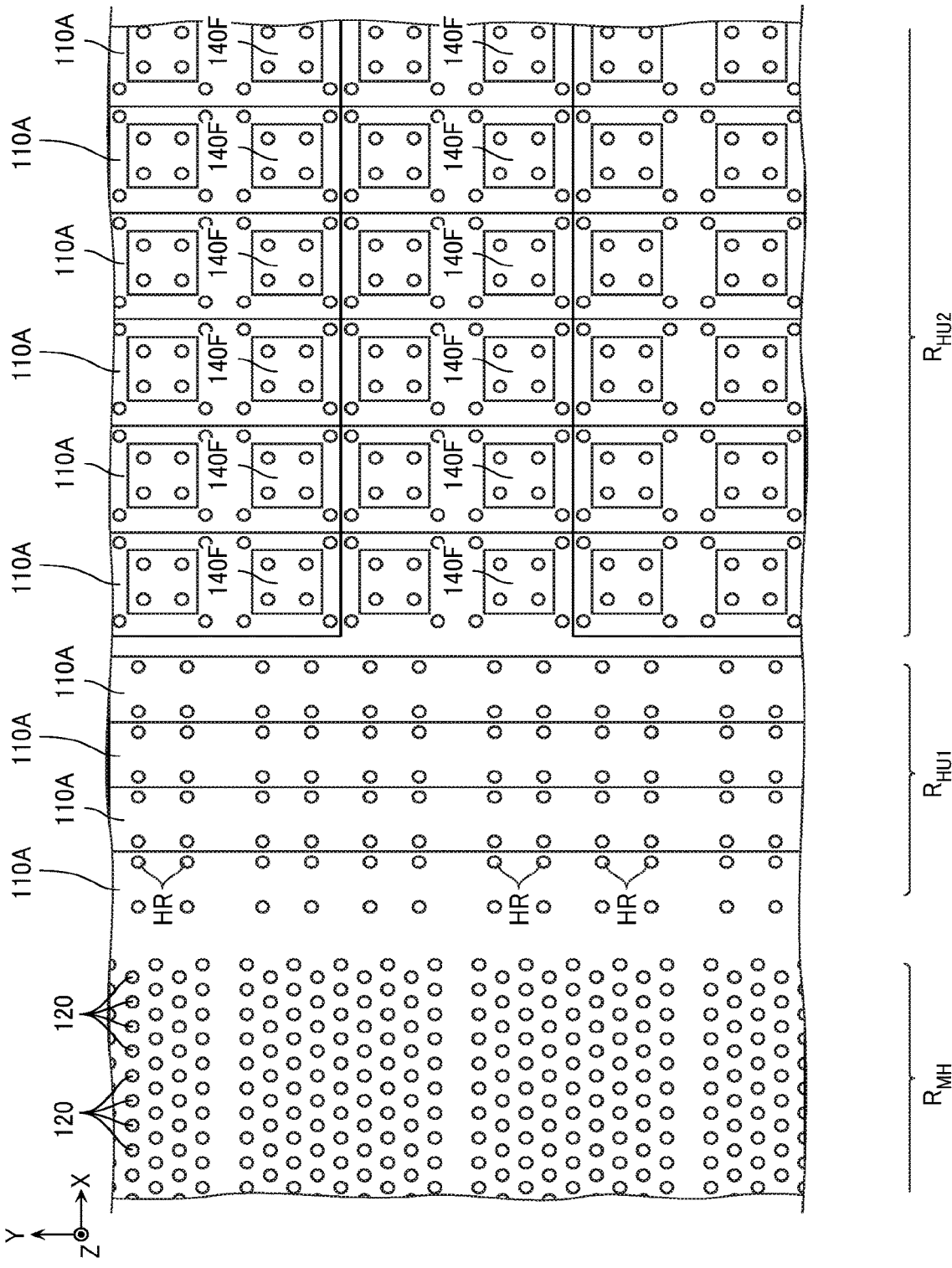
FIG. 42 is a schematic plan view illustrating the manufacturing method.
Figure 43:
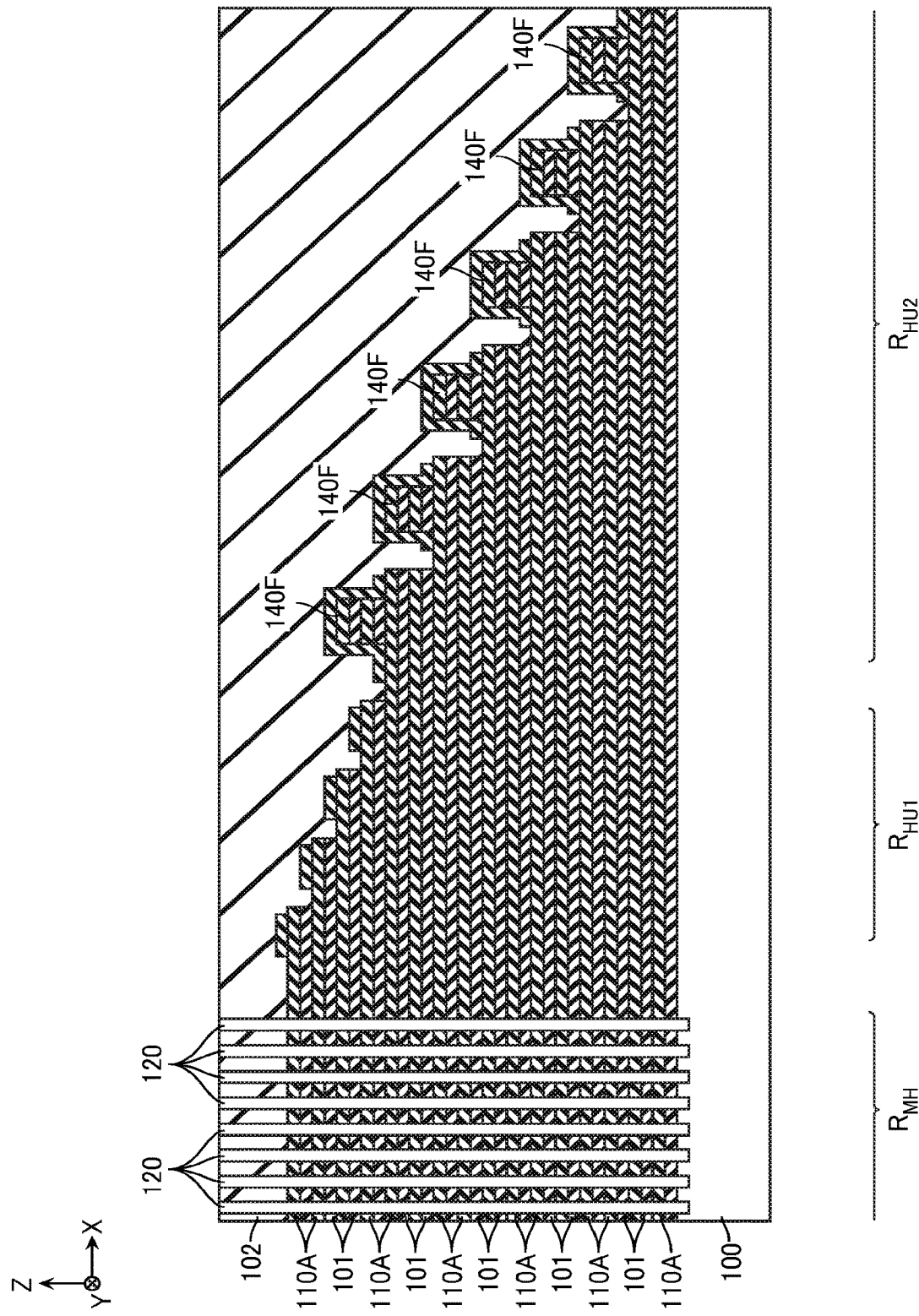
FIG. 43 is a schematic cross-sectional view illustrating the manufacturing method.

Next, for example, as illustrated in FIG. 42 and FIG. 43, a plurality of semiconductor layers 120 and a plurality of supporting structures HR are formed. In this process, respective through holes are formed at a plurality of positions at which the plurality of semiconductor layers 120 and the plurality of supporting structures HR are formed by a method, such as Reactive Ion Etching (RIE). In this process, the gate insulating films 130, the semiconductor layers 120, the insulating layers 125, and the supporting structures HR are formed by a method such as CVD.

Outer peripheral surfaces of at least a part of the plurality of supporting structures HR disposed in the second hook-up region $R_{HU2}$ are connected to the sacrifice layers 110A and the insulating layers 101 included in the structures 140F.

Figure 44:
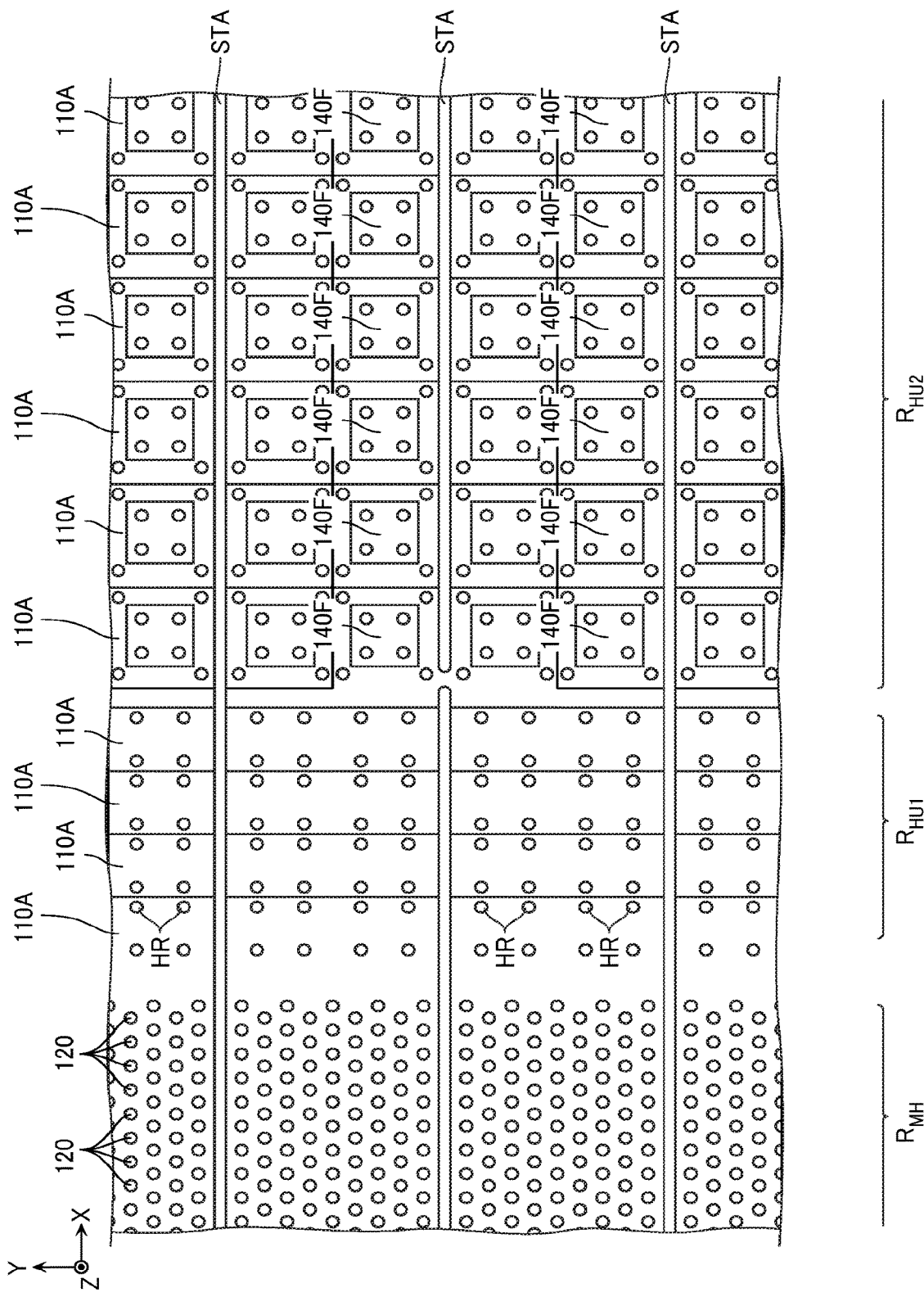
FIG. 44 is a schematic plan view illustrating the manufacturing method.
Figure 45:
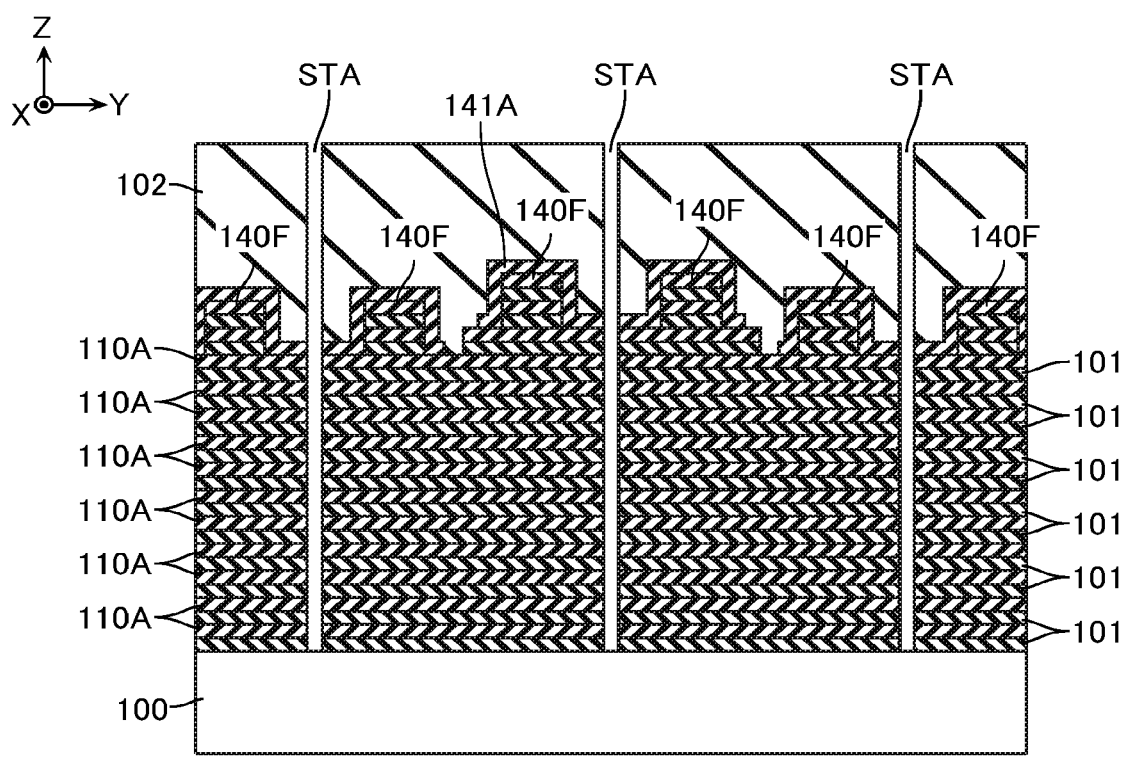
FIG. 45 is a schematic cross-sectional view illustrating the manufacturing method.

Next, for example, as illustrated in FIG. 44 and FIG. 45, trenches STA are formed. The trenches STA extend in the Z-direction and the X-direction, and separate the plurality of insulating layers 101 and the plurality of sacrifice layers 110A in the Y-direction, thus exposing the upper surface of the semiconductor substrate 100. This process is performed by a method such as RIE.

Figure 46:
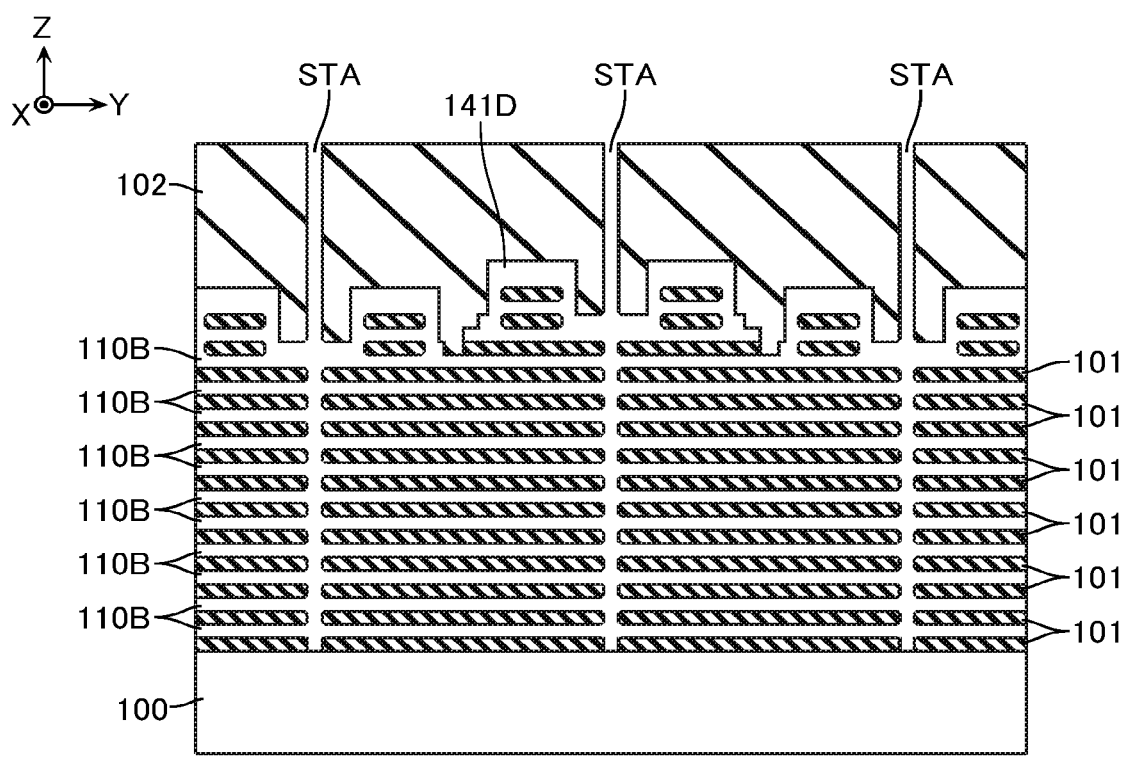
FIG. 46 is a schematic cross-sectional view illustrating the manufacturing method.

Next, for example, as illustrated in FIG. 46, the sacrifice layers 110A, 141A are removed via the trenches STA. Thus, a hollow structure including the plurality of insulating layers 101 arranged in the Z-direction and structures supporting these insulating layers 101 is formed. This hollow structure includes structures including the semiconductor layers 120, the gate insulating films 130, and the insulating layers 125 and the supporting structures HR as structures supporting the insulating layers 101. This process is performed by a method such as wet etching.

Here, at least a part of the plurality of supporting structures HR disposed in the second hook-up region $R_{HU2}$ support the insulating layers 101 included in the structures 140F.

FIG. 46 illustrates cavities 110B formed at the positions at which the plurality of sacrifice layers 110A were disposed, and cavities 141D formed at positions at which the sacrifice layer 141A was disposed.

Figure 47:
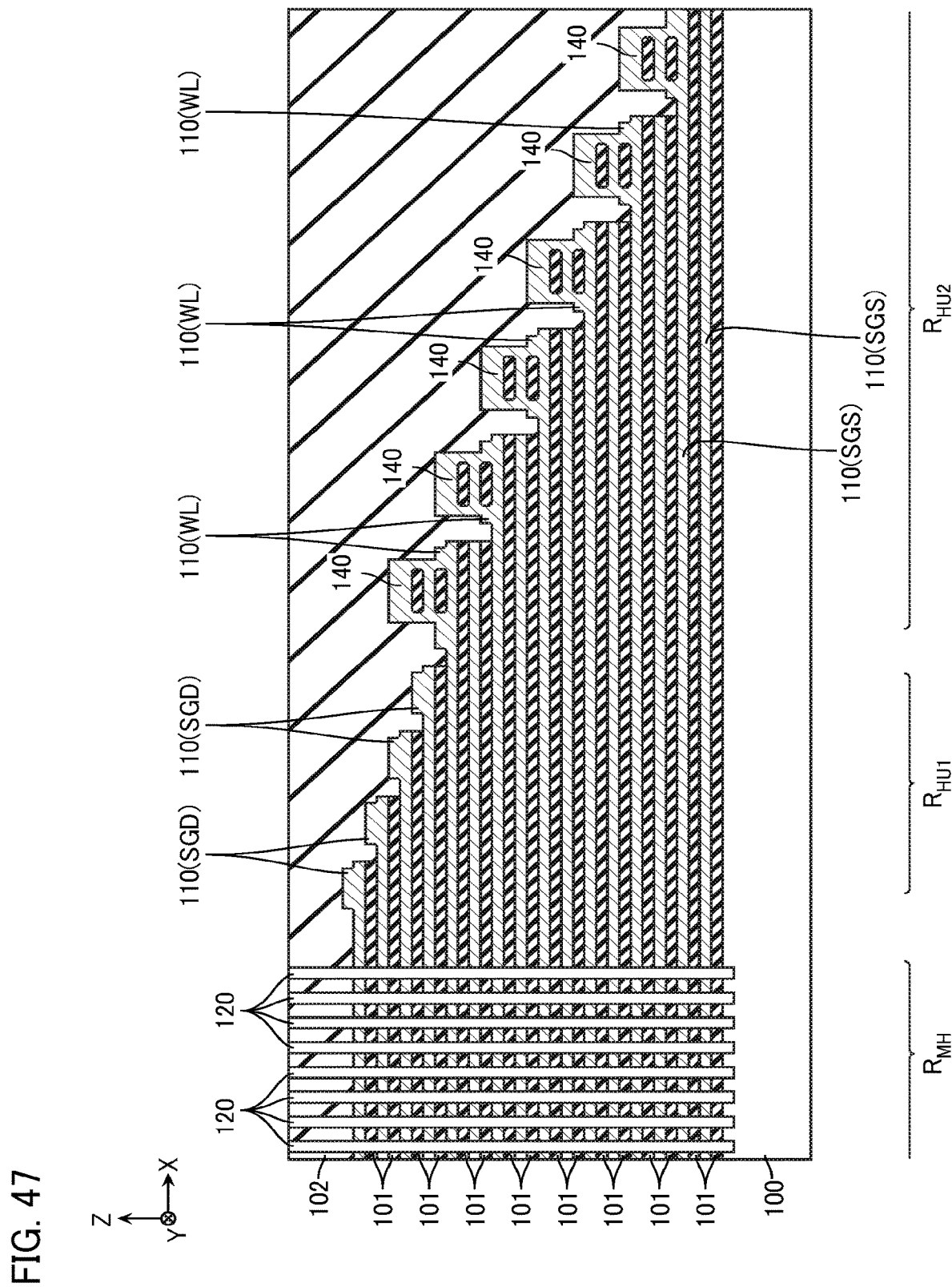
FIG. 47 is a schematic cross-sectional view illustrating the manufacturing method.
Figure 48:
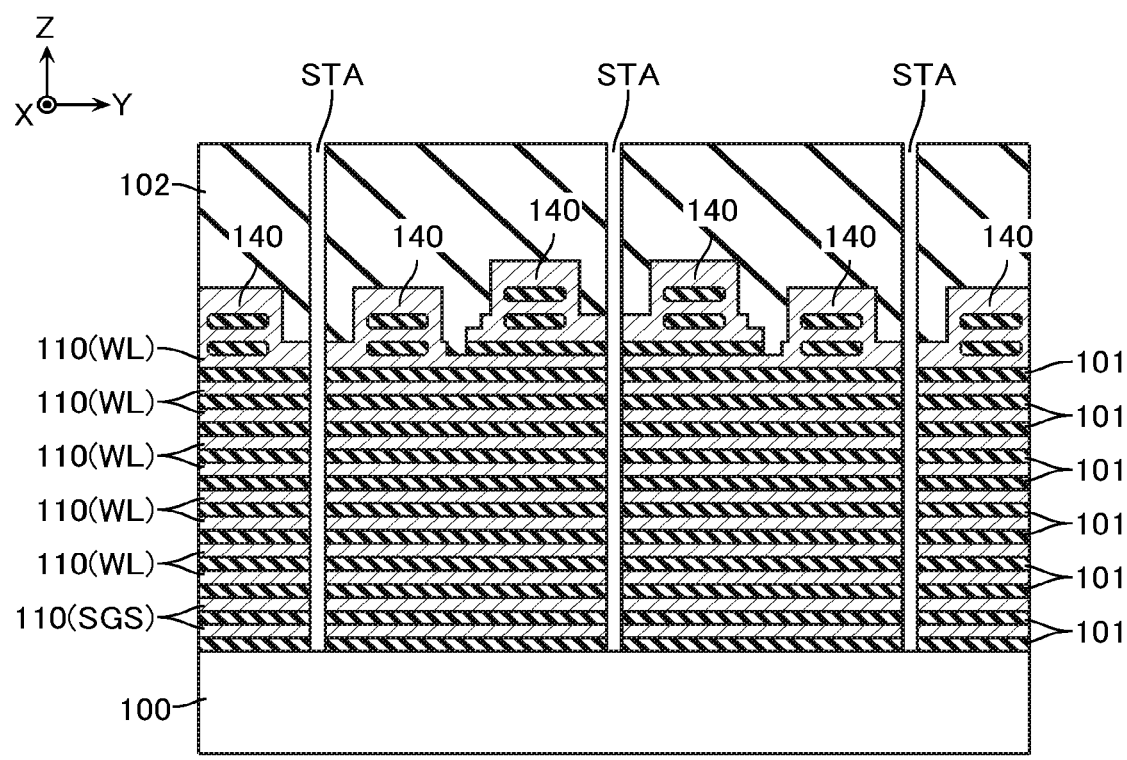
FIG. 48 is a schematic cross-sectional view illustrating the manufacturing method.

Next, for example, as illustrated in FIG. 47 and FIG. 48, the conductive layers 110 and the structures 140 are formed. This process is performed by a method such as CVD. In this process, the conductive layers 110 and the like are filled in the cavities 110B and the cavities 141D.

Figure 49:
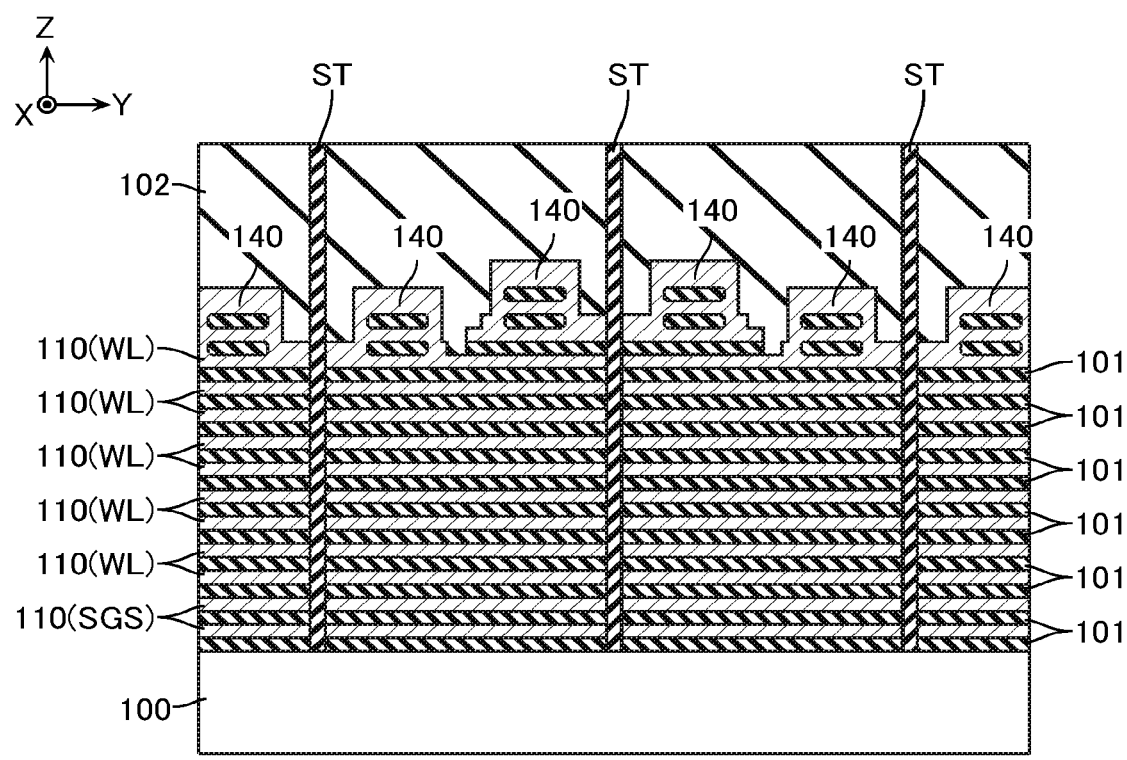
FIG. 49 is a schematic cross-sectional view illustrating the manufacturing method.

Next, for example, as illustrated in FIG. 49, the inter-finger structures ST are formed in the trenches STA. This process is performed by a method such as CVD and RIE. Furthermore, the inter-string unit insulating layers SHE that are arranged in the center of the finger structures FS in the Y-direction and extend in the X-direction are formed in the plurality of conductive layers 110 (SGD) in the memory hole region $R_{MH}$ and the first hook-up region $R_{HU1}$.

Figure 50:
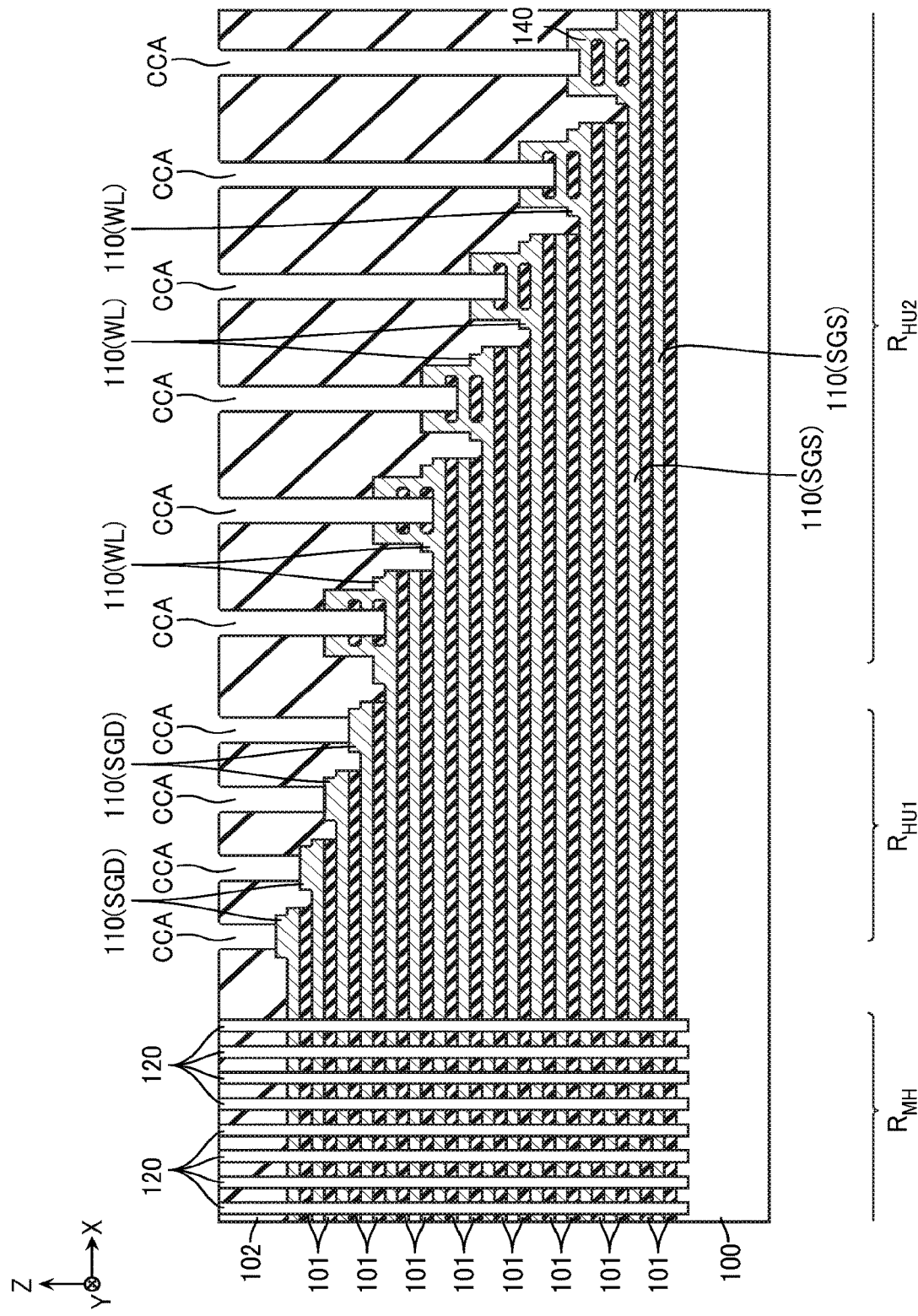
FIG. 50 is a schematic cross-sectional view illustrating the manufacturing method.

Next, for example, as illustrated in FIG. 50, a plurality of contact holes CCA are formed at positions corresponding to the plurality of contacts CC. The contact holes CCA each extend in the Z-direction, and penetrate the insulating layer 102, thus exposing the upper surface of the conductive layer 110, the upper surface of the conductive portion 141, or the upper surface of the conductive portion 142. This process is performed by a method such as RIE.

Next, for example, as illustrated in FIG. 4, the contacts CC are formed in the contact holes CCA. This process is performed by a method such as CVD and RIE.

Then, wirings and the like are formed, and a wafer is separated by dicing, thereby forming the semiconductor memory device according to the first embodiment.

First Comparative Example

Figure 51:
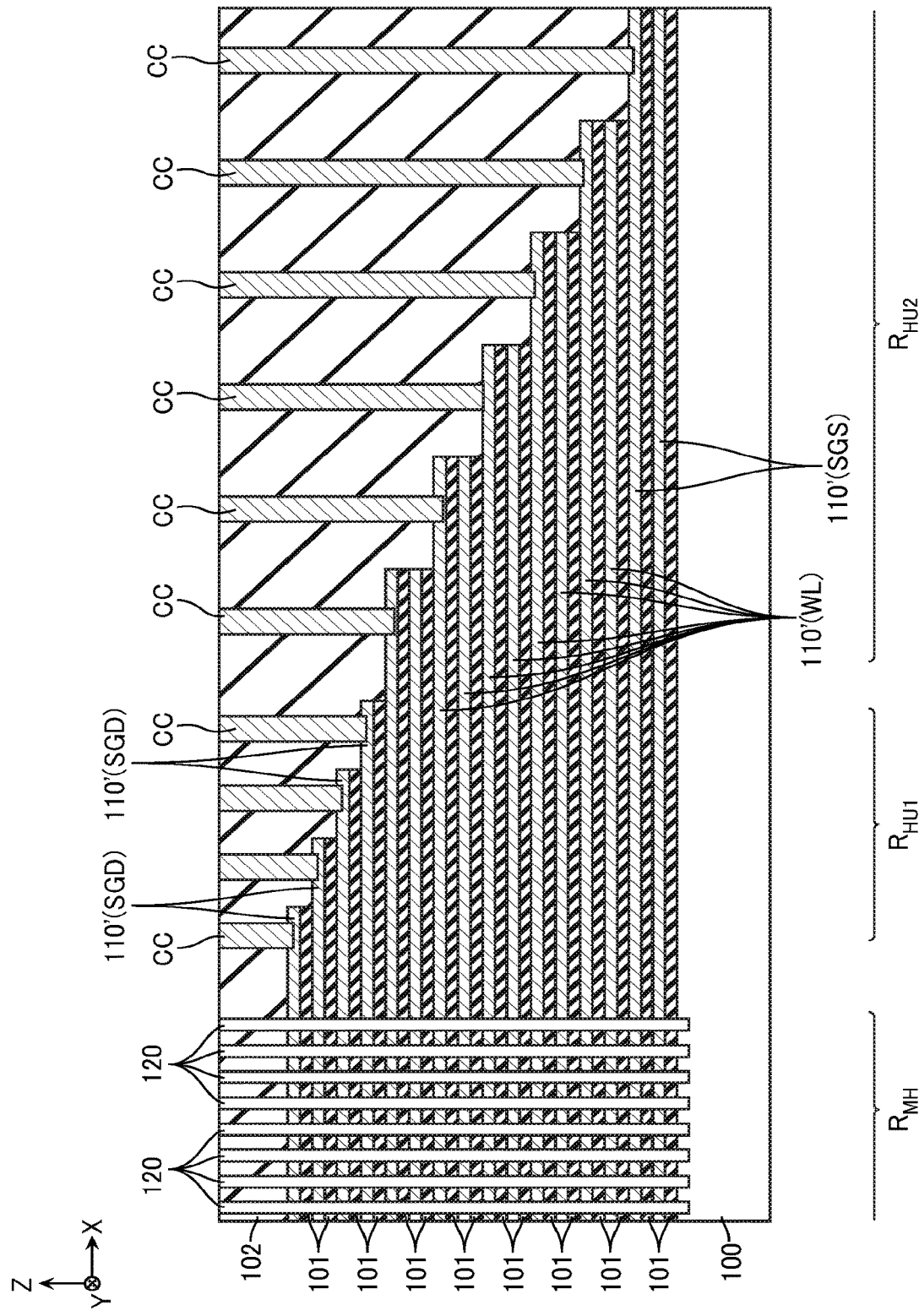
FIG. 51 is a schematic cross-sectional view illustrating a part of a configuration of a semiconductor memory device according to a first comparative example.

FIG. 51 is a schematic cross-sectional view illustrating a part of a configuration of a semiconductor memory device according to a first comparative example. The semiconductor memory device according to the first comparative example includes neither the conductive layers 110 nor the structures 140. The semiconductor memory device according to the first comparative example includes a plurality of conductive layers 110'.

As described with reference to FIG. 4, each of conductive layers 110 (SGD) according to the first embodiment includes the part 111 and the part 112. The length $Z_{112}$ of the part 112 in the Z-direction is larger than the length $Z_{111}$ of the part 111 in the Z-direction.

Each of the conductive layers 110 (WL), 110 (SGS) according to the first embodiment includes the part 114 and the part 115. The length $Z_{115}$ of the part 115 in the Z-direction is larger than the length $Z_{114}$ of the part 114 in the Z-direction.

Meanwhile, as illustrated in FIG. 51, the lengths of the conductive layers 110' according to the first comparative example in the Z-direction are uniform.

In the manufacture of the semiconductor memory device according to the first comparative example, the process as described with reference to FIG. 9 to FIG. 11 is not executed. In the manufacture of the semiconductor memory device according to the first comparative example, the processes as described with reference to FIG. 32 to FIG. 39 are not executed.

Figure 52:
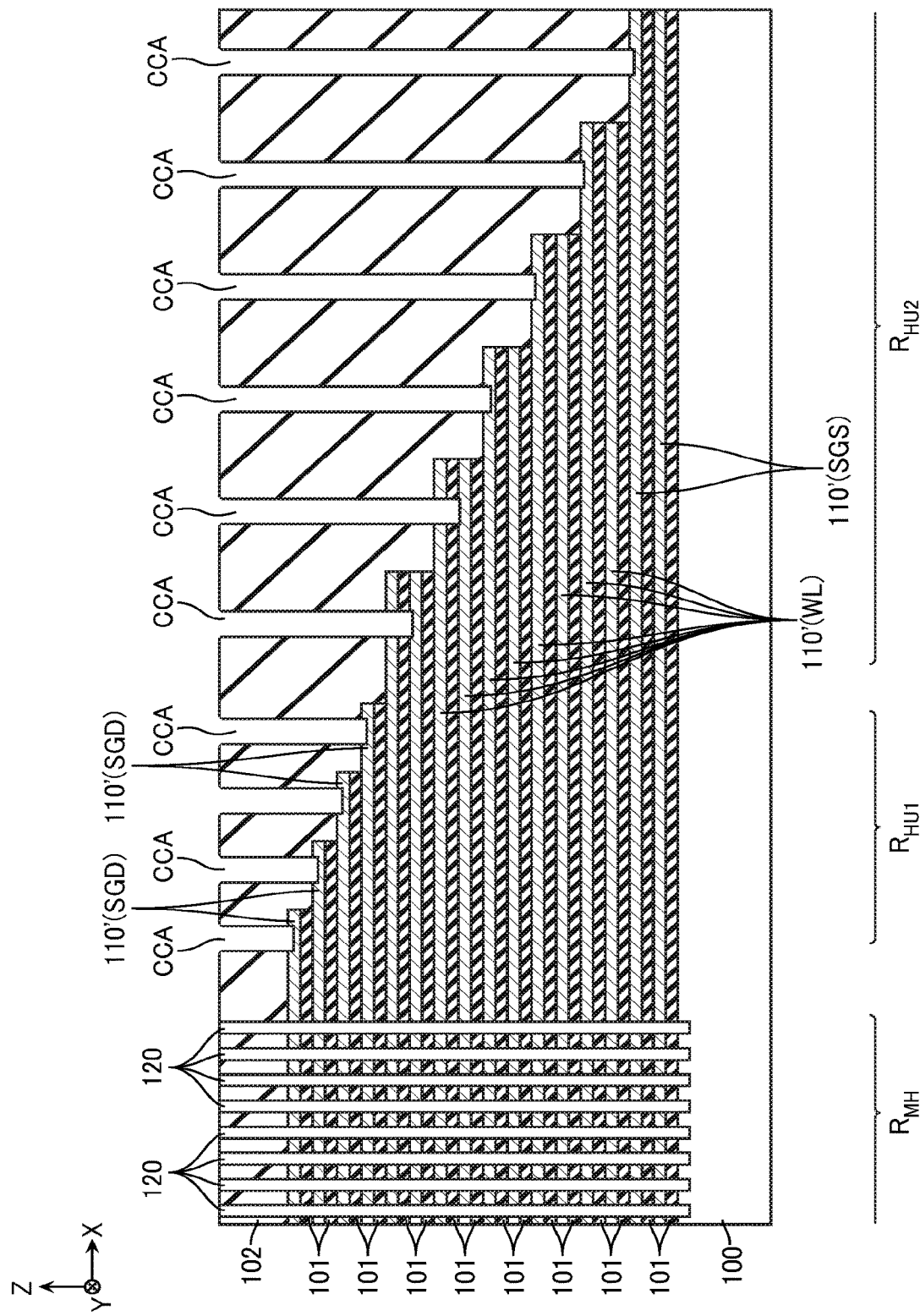
FIG. 52 is a schematic cross-sectional view illustrating a method for manufacturing the semiconductor memory device according to the first comparative example.

FIG. 52 is a schematic cross-sectional view for describing a method for manufacturing the semiconductor memory device according to the first comparative example. FIG. 52 illustrates the process corresponding to that of FIG. 50.

In the process illustrated in FIG. 52, a plurality of contact holes CCA are formed at positions corresponding to the plurality of contacts CC. In this process, it is necessary to expose upper surfaces of the plurality of conductive layers 110' differed in height position at bottom surfaces of the plurality of contact holes CCA.

Here, for example, when the insulating layer 102 contains silicon oxide ($SiO_2$) and the conductive layer 110' includes a stacked film of titanium nitride (TiN) and tungsten (W) or the like, the process condition of RIE or the like can be adjusted so as to have an etching rate in the insulating layer 102 larger than an etching rate in the conductive layer 110'. However, in association with the high integration of the semiconductor memory device, the length of the conductive layer 110' in the Z-direction has been decreased. In association with this, for example, as illustrated in FIG. 52, apart of the contact holes CCA penetrate the corresponding conductive layers 110', thus exposing the upper surface of the conductive layer 110' immediately below in some cases. When the contact CC is formed in such a state, the two conductive layers 110' mutually adjacent in the Z-direction are short-circuited.

Second Comparative Example

Figure 53:
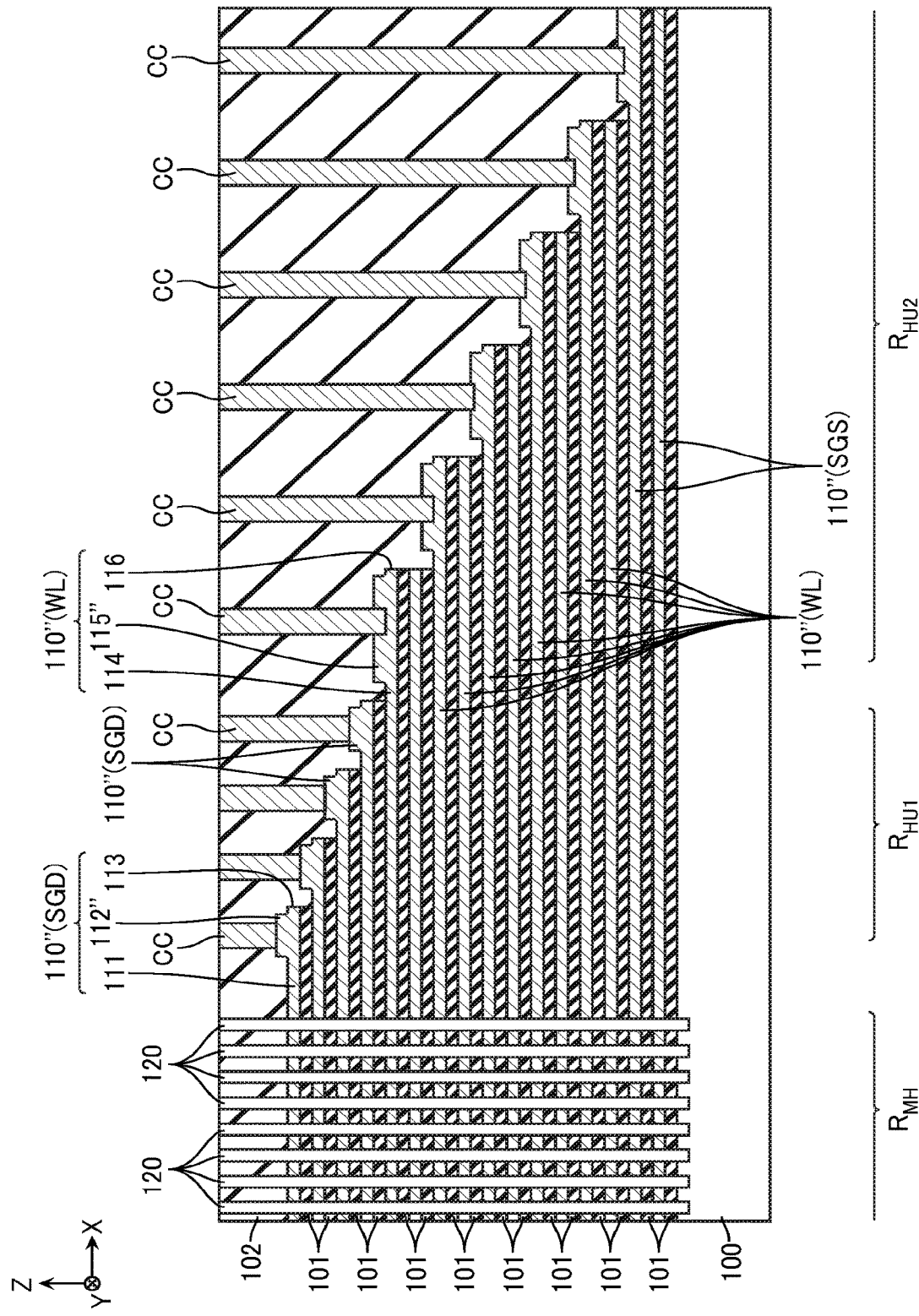
FIG. 53 is a schematic cross-sectional view illustrating a part of a configuration of a semiconductor memory device according to a second comparative example.

FIG. 53 is a schematic cross-sectional view illustrating a part of a configuration of a semiconductor memory device according to a second comparative example. The semiconductor memory device according to the second comparative example includes neither the conductive layer 110 nor the structure 140. The semiconductor memory device according to the second comparative example includes a plurality of conductive layers 110".

Each of conductive layers 110" (SGD) according to the second comparative example includes apart 111 and apart 112'. A length of the part 112" in the Z-direction is larger than a length of the part 111 in the Z-direction.

Each of conductive layers 110" (WL), 110" (SGS) according to the second comparative example each include apart 114 and a part 115". A length of the part 115" in the Z-direction is larger than a length of the part 114 in the Z-direction.

In the manufacture of the semiconductor memory device according to the second comparative example, the process as described with reference to FIG. 9 to FIG. 11 is not executed.

Figure 54:
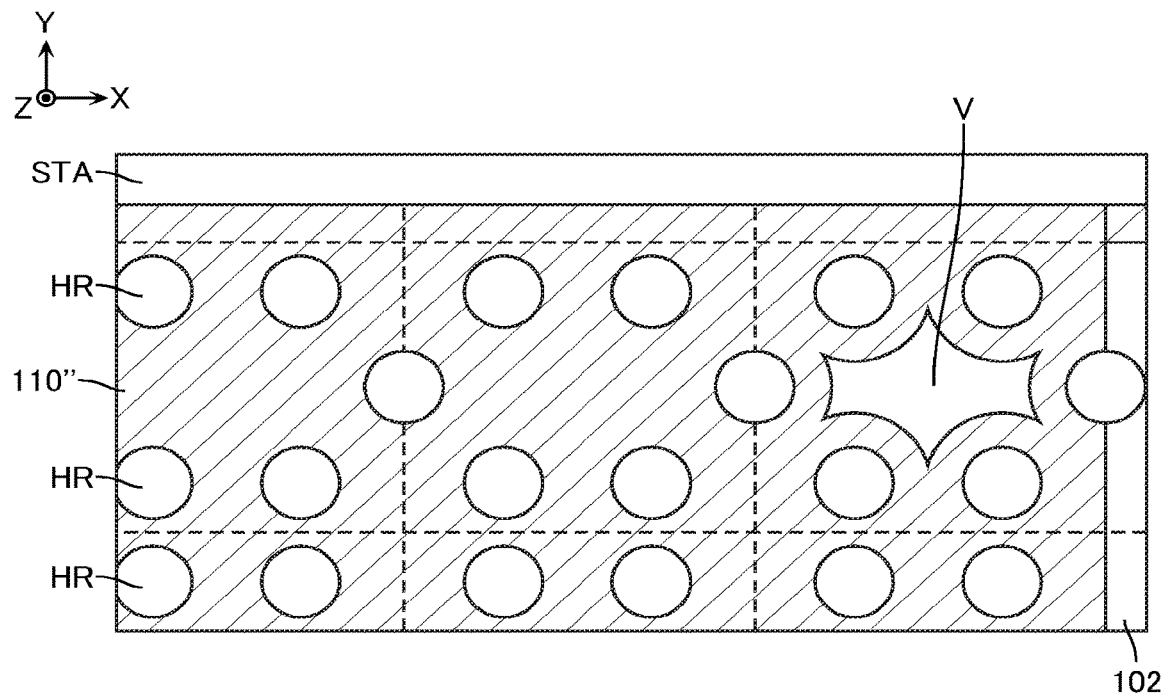
FIG. 54 is a schematic cross-sectional view illustrating a method for manufacturing the semiconductor memory device according to the second comparative example.
Figure 55:
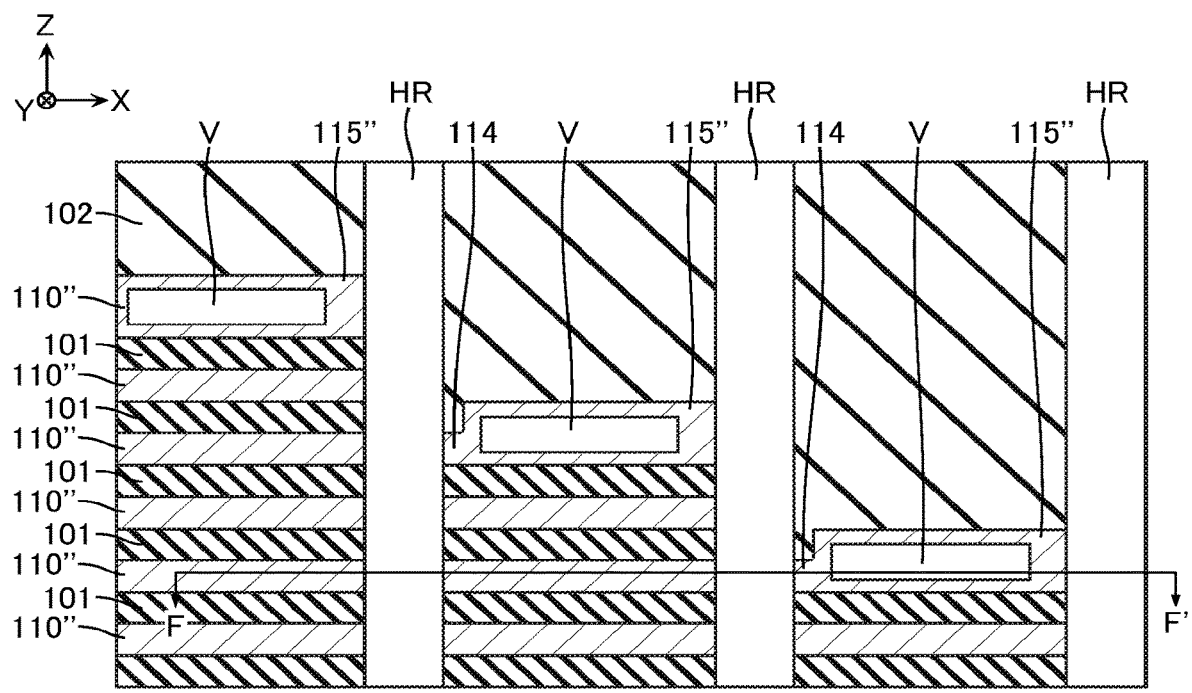
FIG. 55 is a schematic cross-sectional view illustrating the manufacturing method.

FIG. 54 and FIG. 55 are schematic cross-sectional views for describing a method for manufacturing the semiconductor memory device according to the second comparative example. FIG. 54 and FIG. 55 illustrate a process corresponding to that of FIG. 47 and FIG. 48. FIG. 54 illustrates a cross-section of the structure illustrated in FIG. 55 taken along a line F-F' viewed in an arrow direction.

In the semiconductor memory device according to the second comparative example, a part 112' having a large length in the Z-direction is disposed at a contact part of the conductive layer 110" (SGD) and the contact CC. A part 115" having a large length in the Z-direction is disposed at contact parts of the conductive layer 110" (WL), 110" (SGS) and the contact CC. With this configuration, it is considered to be able to restrain a part of the contact holes CCA from penetrating the corresponding conductive layers 110' in the process corresponding to FIG. 52.

However, in the semiconductor memory device according to the second comparative example, as illustrated in FIG. 54 and FIG. 55, portions corresponding to the parts 115" are not filled with the conductive layers 110" in some cases. For example, in the formation of the conductive layers 110", a gas used for forming the conductive layers 110' is supplied from the trenches STA. The conductive layers 110" are formed not only on the upper surfaces and the lower surfaces of the insulating layers 101, but also on the outer peripheral surfaces of the supporting structures HR. Here, for example, as illustrated in FIG. 54, when the supporting structures HR are disposed at pitches equal to or less than a predetermined pitch, a path between a space corresponding to the part 115' and the trench STA is obstructed before this space is filled with the conductive layer 110", and a void V is formed in this space in some cases.

In this case, while the length itself of the part 115" in the Z-direction is larger than the length of the part 114 in the Z-direction, the substantial film thickness of the part 115" is decreased. Therefore, the penetration by the contact hole CCA cannot be appropriately avoided in some cases.

[Effects of Semiconductor Memory Device According to First Embodiment]

As described with reference to FIG. 3 and the like, in the semiconductor memory device according to the first embodiment, the plurality of structures 140 are disposed at the terrace portions T of the plurality of conductive layers 110 (WL) and the plurality of conductive layers 110 (SGS). As described with reference to FIG. 4 and the like, the structure 140 includes the approximately plate-shaped conductive portions 141, 142, the pair of conductive portions 143 (FIG. 4) connected to respective both end portions of the conductive portions 141, 142 in the X-direction, and the pair of conductive portions 144 (FIG. 6) connected to respective both end portions of the conductive portions 141, 142 in the Y-direction.

With this configuration, for example, in the process illustrated in FIG. 50, even when a part of the contact holes CCA penetrate the conductive portions 141, further penetration by the contact hole CCA can be restrained by the conductive portion 142. Even when a part of the contact holes CCA penetrate the conductive portions 142, further penetration by the contact hole CCA can be restrained by the conductive layer 110.

In any of a case where the conductive portion 141 is exposed at the bottom surface of the contact hole CCA, a case where the conductive portion 142 is exposed at the bottom surface of the contact hole CCA, and a case where the conductive layer 110 is exposed at the bottom surface of the contact hole CCA, the conductive layer 110 can be appropriately connected to the peripheral circuit PC, and short-circuiting between the two conductive layers 110 mutually adjacent in the Z-direction can be suppressed.

Second Embodiment

[Configuration]

Figure 56:
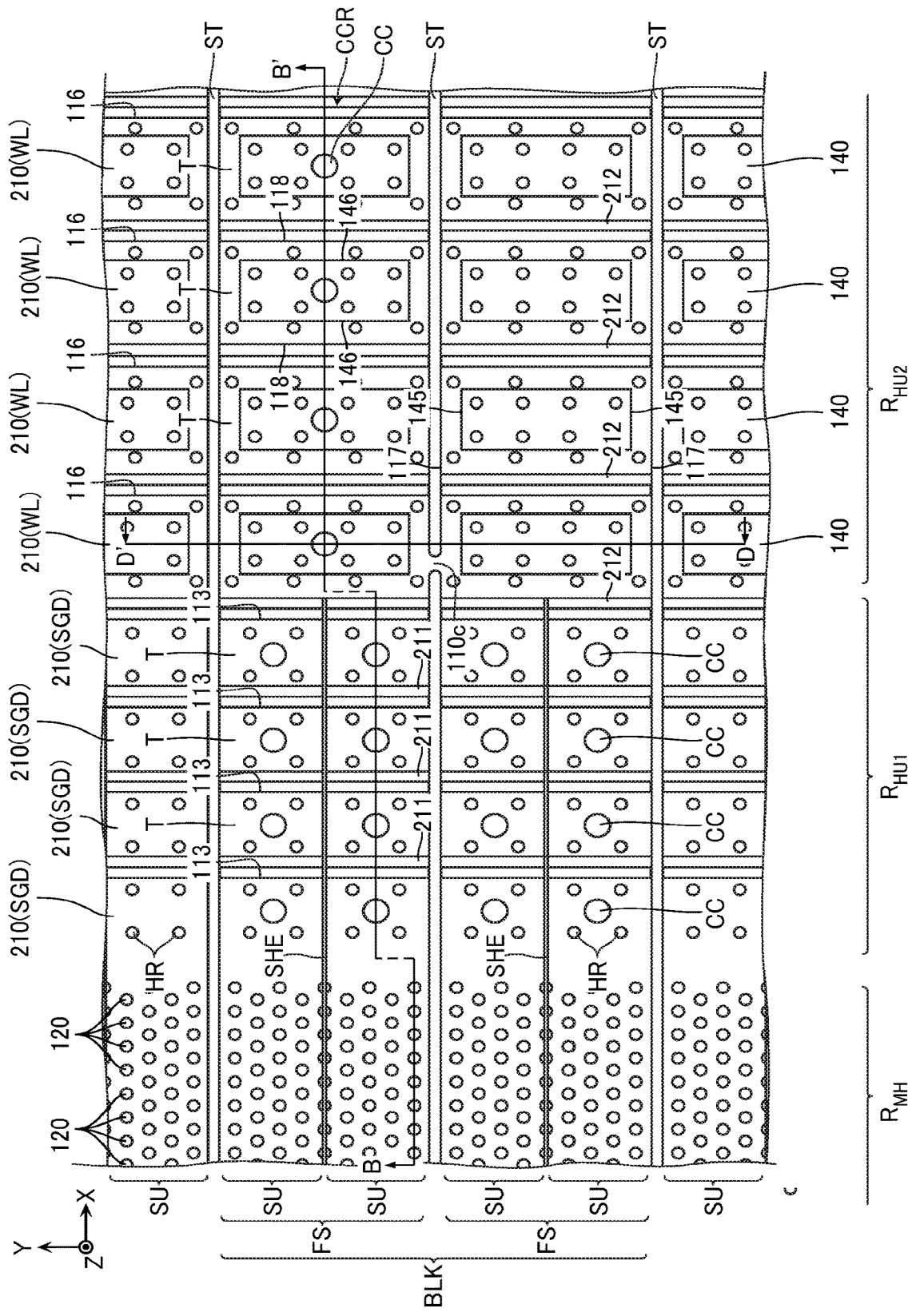
FIG. 56 is a schematic plan view illustrating a part of a configuration of a semiconductor memory device according to a second embodiment.
Figure 57:
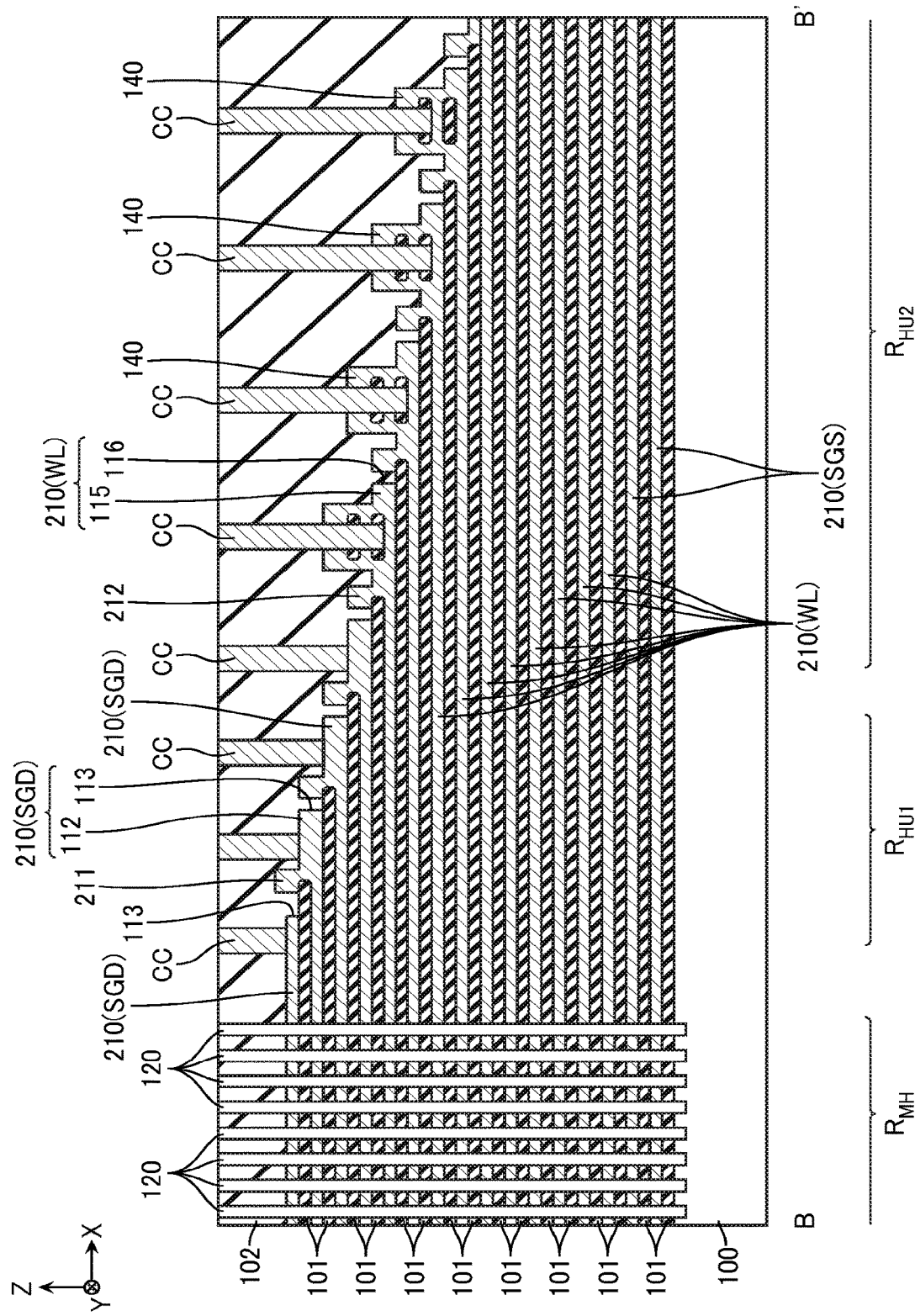
FIG. 57 is a schematic cross-sectional view of the structure illustrated in FIG. 56 taken along a line B-B' viewed in an arrow direction.
Figure 58:
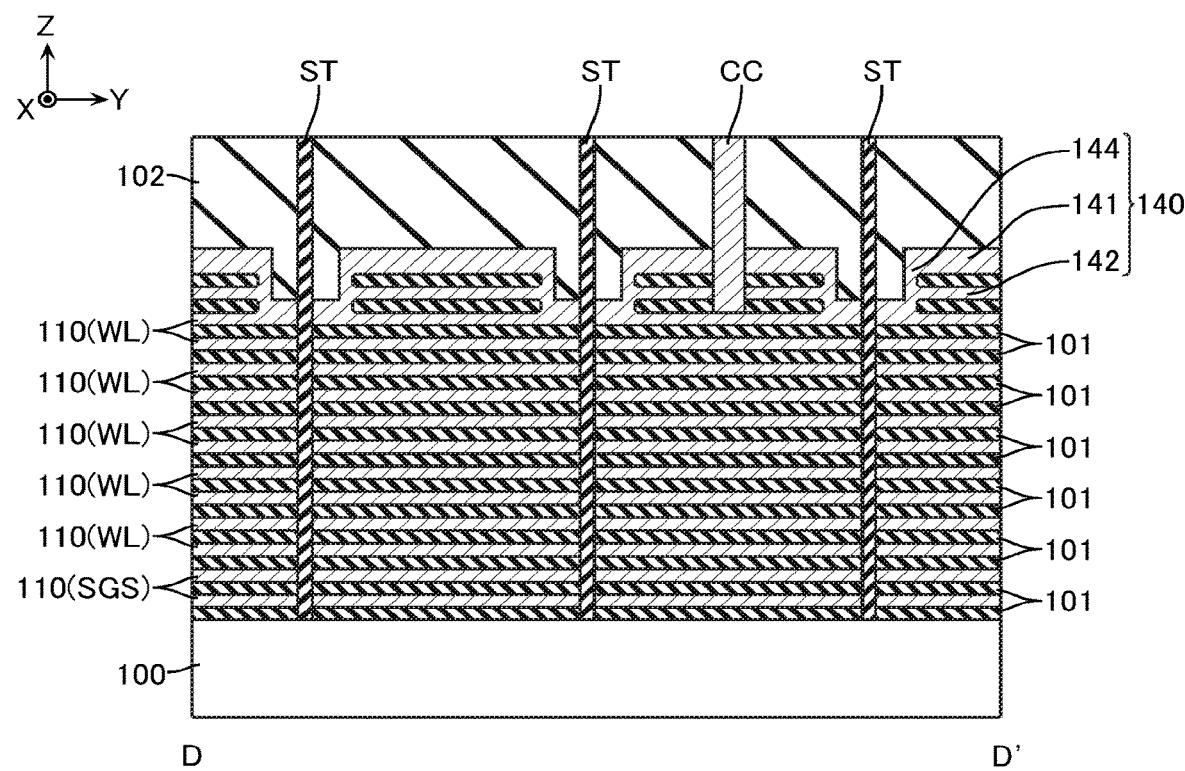
FIG. 58 is a schematic cross-sectional view of the structure illustrated in FIG. 56 taken along a line D-D' viewed in an arrow direction.

Next, with reference to FIG. 56 to FIG. 58, a semiconductor memory device according to the second embodiment will be described. FIG. 56 is a schematic plan view illustrating a part of a configuration of the semiconductor memory device according to the second embodiment. FIG. 57 is a schematic cross-sectional view of the structure illustrated in FIG. 56 taken along a line B-B' viewed in an arrow direction. FIG. 58 is a schematic cross-sectional view of the structure illustrated in FIG. 56 taken along a line D-D' viewed in an arrow direction.

The semiconductor memory device according to the second embodiment is basically configured similarly to the semiconductor memory device according to the first embodiment. However, the semiconductor memory device according to the second embodiment is different from the semiconductor memory device according to the first embodiment in a part of configurations.

[Structure of Memory Hole Region $R_{MH}$]

A finger structure FS according to the second embodiment is basically configured similarly to the finger structure FS according to the first embodiment. However, the finger structure FS according to the second embodiment includes a plurality of conductive layers 210 instead of the plurality of conductive layers 110. The configuration of the plurality of conductive layers 210 in the memory hole region $R_{MH}$ is similar to the configuration of the plurality of conductive layers 110 in the memory hole region $R_{MH}$.

[Structure of First Hook-Up Region $R_{HU1}$]

As illustrated in FIG. 56, in the first hook-up region $R_{HU1}$, terrace portions T of the plurality of conductive layers 210 (SGD) and a plurality of conductive portions 211 corresponding to these plurality of conductive layers 210 (SGD) are disposed. In the example of FIG. 56, the terrace portions T are disposed at end portions of the conductive layers 210 (SGD) in the X-direction. The conductive portions 211 are each separated from the conductive layers 210 (SGD) in the X direction. In the example of FIG. 56, a plurality of contacts CC are disposed corresponding to the terrace portions T of the plurality of conductive layers 210 (SGD) included in the even-numbered memory blocks BLK counting from one side in the Y-direction (for example, negative side in the Y-direction) among the plurality of memory blocks BLK arranged in the Y-direction. In the example of FIG. 56, a plurality of supporting structures HR are disposed corresponding to each terrace portion T of the plurality of conductive layers 210 (SGD).

FIG. 56 illustrates the first hook-up region $R_{HU1}$ disposed in the positive side in the X-direction with respect to the memory hole region $R_{MH}$. While the illustration is omitted, in the first hook-up region $R_{HU1}$ disposed in the negative side in the X-direction with respect to the memory hole region $R_{MH}$, a plurality of contacts CC are disposed corresponding to the terrace portions T of the plurality of conductive layers 210 (SGD) included in the odd-numbered memory blocks BLK counting from the one side in the Y-direction among the plurality of memory blocks BLK arranged in the Y-direction.

As illustrated in FIG. 57, an end portion of the uppermost conductive layer 210 (SGD) in the X-direction includes an edge portion 113. In the illustrated example, the end portion of the uppermost conductive layer 210 (SGD) in the X-direction does not include a part 112. End portions of the conductive layers 210 (SGD) other than the uppermost layer in the X-direction each include the part 112 and the edge portion 113. The parts 112 of the conductive layers 210 (SGD) other than the uppermost layer are connected to the conductive portions 211. The conductive portion 211 connected to the c-th (c is an integer of 2 or more) conductive layer 210 (SGD) counting from above is disposed between the corresponding contact CC and the edge portion 113 of the c-1-th conductive layer 210 (SGD) counting from above. A lower surface of the conductive portion 211 connected to the c-th conductive layer 210 (SGD) counting from above is disposed at a height position corresponding to a lower surface of the c-1-th conductive layer 210 (SGD) counting from above. An upper surface of the conductive portion 211 connected to the c-th conductive layer 210 (SGD) counting from above is disposed at a height position corresponding to an upper surface of the part 112 of the c-1-th conductive layer 210 (SGD) counting from above.

[Structure of Second Hook-Up Region $R_{HU2}$]

As illustrated in FIG. 56, in the second hook-up region $R_{HU2}$, terrace portions T of the plurality of conductive layers 210 (WL) and the plurality of conductive layers 210 (SGS), and a plurality of conductive portions 212 corresponding to these plurality of conductive layers 210 (WL) and plurality of conductive layers 210 (SGS) are disposed. In the example of FIG. 56, the terrace portions T are disposed at end portions of the plurality of conductive layers 210 (WL) and the plurality of conductive layers 210 (SGS) in the X-direction. The conductive portions 212 are each separated from the conductive layers 210 (WL) and the conductive layers 210 (SGS) in the X-direction. In the example of FIG. 56, a plurality of structures 140 are disposed at the terrace portions T of the plurality of conductive layers 210 (WL) and the plurality of conductive layers 210 (SGS). In the example of FIG. 56, a plurality of contacts CC are disposed corresponding to the plurality of conductive layers 210 (WL) and the plurality of conductive layer 210 (SGS) included in the even-numbered memory blocks BLK counting from the one side in the Y-direction among the plurality of memory blocks BLK arranged in the Y-direction. In the illustrated example, the plurality of contacts CC are disposed to the plurality of conductive layers 210 in the finger structure FS disposed in the positive side in the Y-direction in the two finger structures FS included in the memory block BLK. However, the plurality of contacts CC may be disposed to the plurality of conductive layers 210 in the finger structure FS disposed in the negative side in the Y-direction. In the example of FIG. 56, a plurality of supporting structures HR are disposed corresponding to each terrace portion T of the conductive layers 210 (WL) and the plurality of conductive layers 210 (SGS).

FIG. 56 illustrates the second hook-up region $R_{HU2}$ disposed in the positive side in the X-direction with respect to the memory hole region $R_{MH}$. While the illustration is omitted, in the second hook-up region $R_{HU2}$ disposed in the negative side in the X-direction with respect to the memory hole region $R_{MH}$, a plurality of contacts CC are disposed corresponding to the terrace portions T of the plurality of conductive layers 210 (WL) and the plurality of conductive layers 210 (SGS) included in the odd-numbered memory blocks BLK counting from the one side in the Y-direction among the plurality of memory blocks BLK arranged in the Y-direction. In this case, the plurality of contacts CC may be disposed corresponding to the terrace portions T of the plurality of conductive layers 210 (WL) and the plurality of conductive layers 210 (SGS) included in any of the two finger structures FS in the positive side and the negative side in the Y-direction included in the memory block BLK.

As illustrated in FIG. 57, the end portions of the conductive layers 210 (WL) and the conductive layers 210 (SGS) in the X-direction each include a part 115 and an edge portion 116. The parts 115 of the conductive layers 210 (WL) and the conductive layers 210 (SGS) are connected to the conductive portion 212.

The conductive portion 212 connected to the uppermost conductive layer 210 (WL) is disposed between the corresponding contact CC and the edge portion 113 of the lowermost conductive layer 210 (SGD). A lower surface of the conductive portion 212 connected to the uppermost conductive layer 210 (WL) is disposed at a height position corresponding to a lower surface of the lowermost conductive layer 210 (SGD). An upper surface of the conductive portion 212 connected to the uppermost conductive layer 210 (WL) is disposed at a height position corresponding to an upper surface of the part 112 of the lowermost conductive layer 210 (SGD).

The conductive portion 212 connected to the c-th (c is an integer of 2 or more) conductive layer 210 (WL) counting from above is disposed between the corresponding contact CC and the edge portion 116 of the c-1-th conductive layer 210 (WL) counting from above. A lower surface of the conductive portion 212 connected to the c-th conductive layer 210 (WL) counting from above is disposed at a height position corresponding to a lower surface of the c-1-th conductive layer 210 (WL) counting from above. An upper surface of the conductive portion 212 connected to the c-th conductive layer 210 (WL) counting from above is disposed at a height position corresponding to an upper surface of the part 115 of the c-1-th conductive layer 210 (WL) counting from above.

In the example of FIG. 56, one contact row CCR is disposed corresponding to one finger structure FS. This contact row CCR includes a plurality of contacts CC arranged in the X-direction.

In the plurality of contacts CC included in this contact row CCR, the contact CC closest to the memory hole region $R_{MH}$ is connected to the first conductive layer 210 (WL) counting from above. The contact CC second closest to the memory hole region $R_{MH}$ is connected to the second conductive layer 210 (WL) counting from above. In the following, similarly, the contact CC that is a-th (a is an integer of 1 or more) closest to the memory hole region $R_{MH}$ is connected to the a-th conductive layer 210 (WL) counting from above. The contact CC farthermost from the memory hole region $R_{MH}$ is connected to the conductive layer 210 (SGS) in the lower layer side.

[Manufacturing Method]

Figure 59:
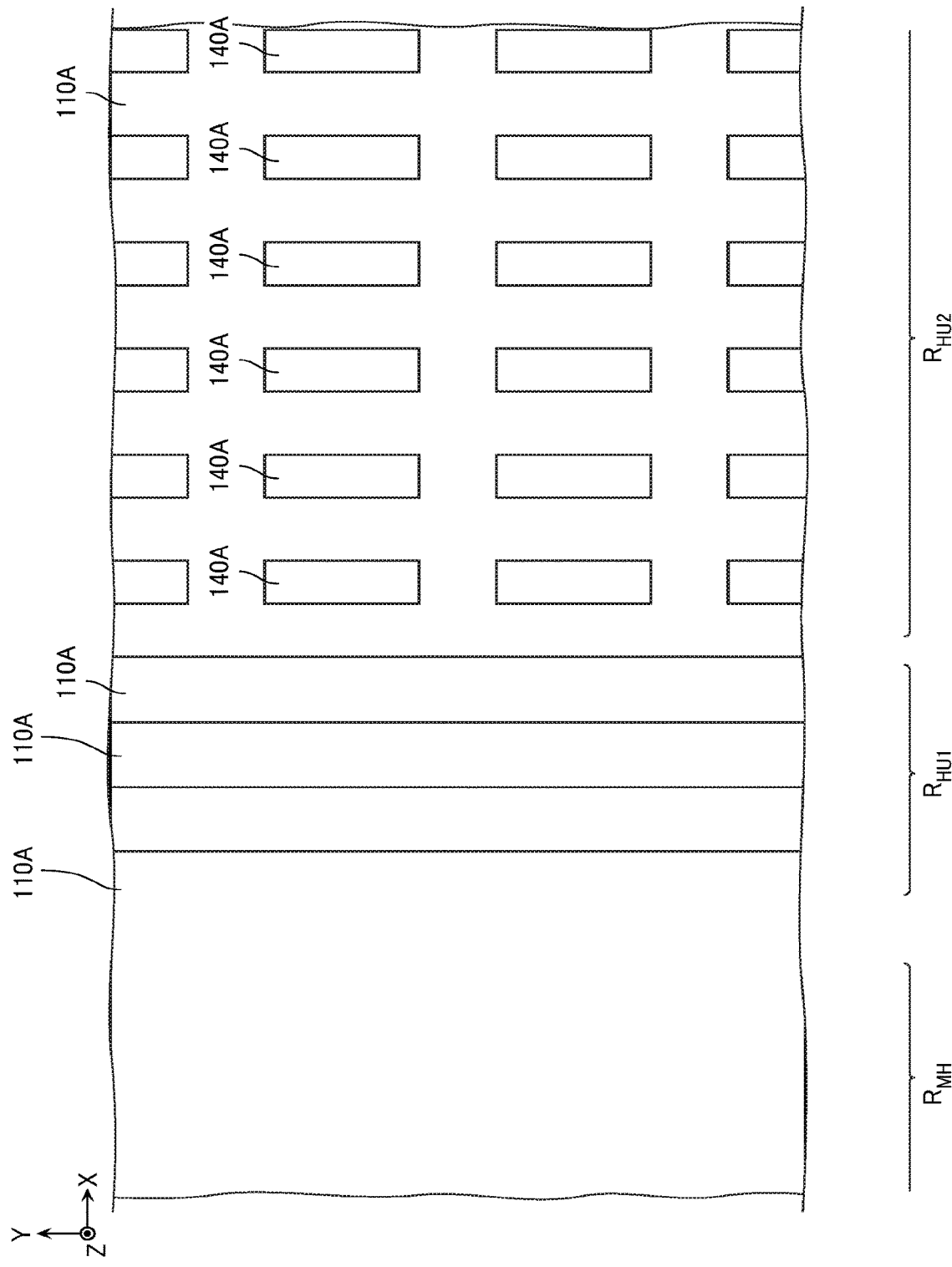
FIG. 59 is a schematic plan view illustrating a method for manufacturing the semiconductor memory device according to the second embodiment.

Next, with reference to FIG. 59 to FIG. 66, a method for manufacturing the semiconductor memory device according to the second embodiment will be described. FIG. 59 is a schematic plan view for describing the manufacturing method, and illustrates a planar surface corresponding to that in FIG. 56. FIG. 60 to FIG. 66 are schematic cross-sectional views for describing the manufacturing method, and illustrate cross-sections corresponding to that in FIG. 57.

In the manufacture of the semiconductor memory device according to the embodiment, first, in the method for manufacturing the semiconductor memory device according to the first embodiment, the processes up to those described with reference to FIG. 9 to FIG. 11 are performed.

Figure 13:
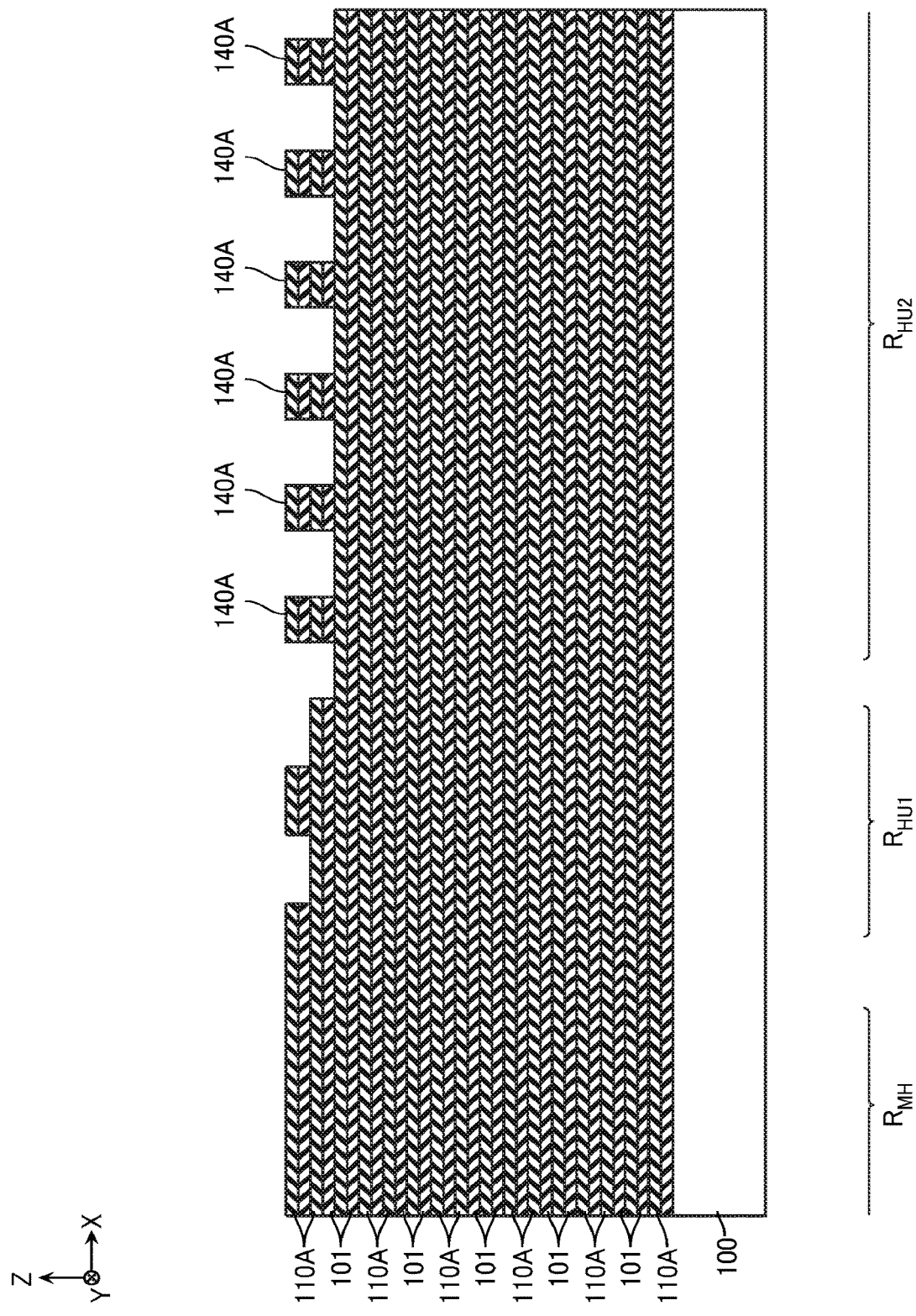
FIG. 13 is a schematic cross-sectional view illustrating the manufacturing method.

Next, for example, as illustrated in FIG. 59 and FIG. 13, a part of the sacrifice layers 110A and a part of the insulating layers 101 are removed. In this process, for example, a resist that covers a part of the structure as illustrated in FIG. 9 to FIG. 11 is formed. This resist covers the whole of memory hole region $R_{MH}$ and second hook-up region $R_{HU2}$. This resist covers regions corresponding to the terrace portions T of the odd-numbered conductive layers 210 counting from above, and exposes regions corresponding to the terrace portions T of the even-numbered conductive layers 210 counting from above in the first hook-up region $R_{HU1}$. Next, removal of the sacrifice layer 110A and removal of the insulating layer 101 are performed once for each. This process is performed by a method such as wet etching or dry etching.

Next, the process described with reference to, for example, FIG. 16 and FIG. 17 is performed.

Figure 60:
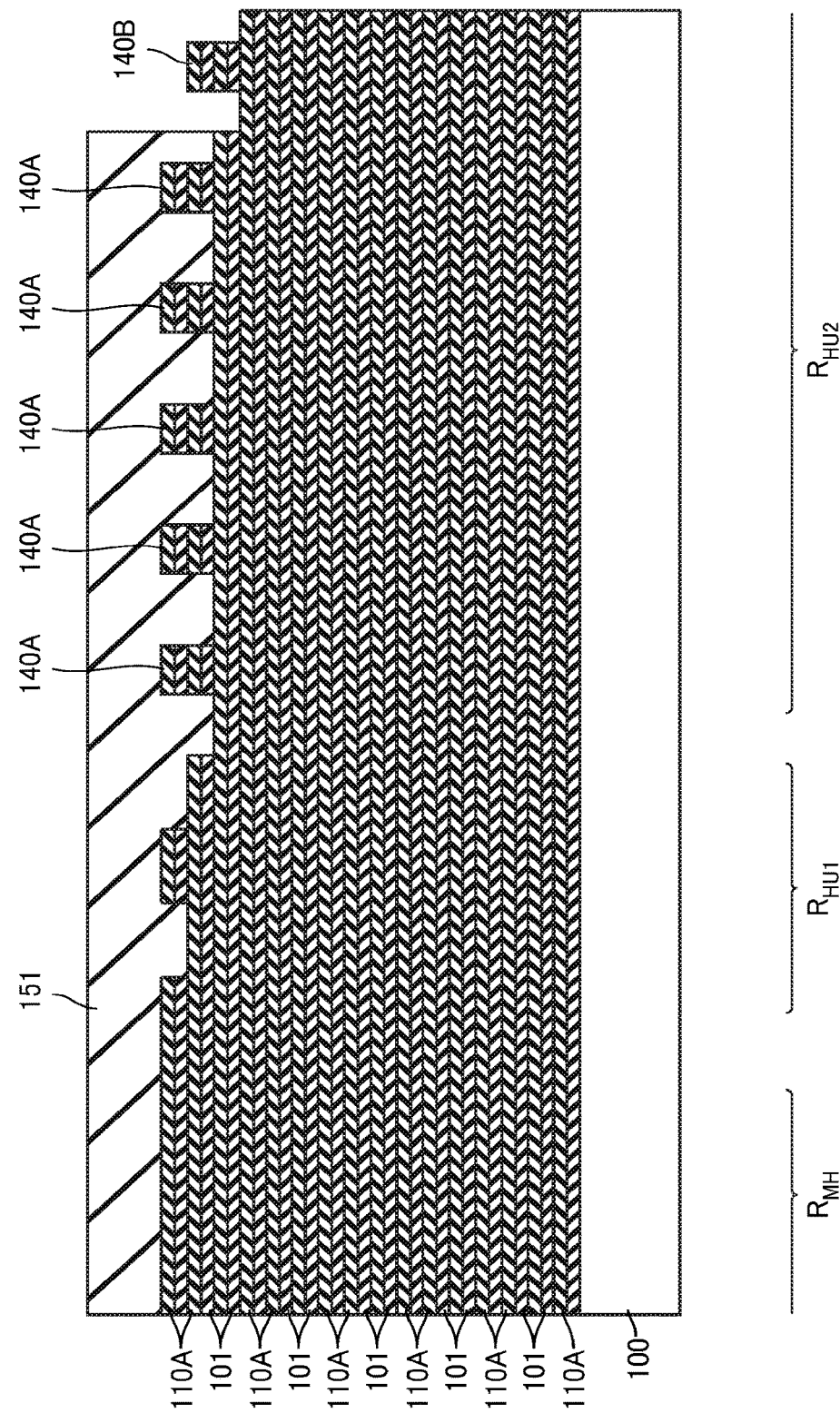
FIG. 60 is a schematic cross-sectional view illustrating the manufacturing method.

Next, for example, as illustrated in FIG. 60, the removal of the sacrifice layer 110A and the removal of the insulating layer 101 are performed once for each. This process is performed by a method such as wet etching or dry etching.

Figure 61:
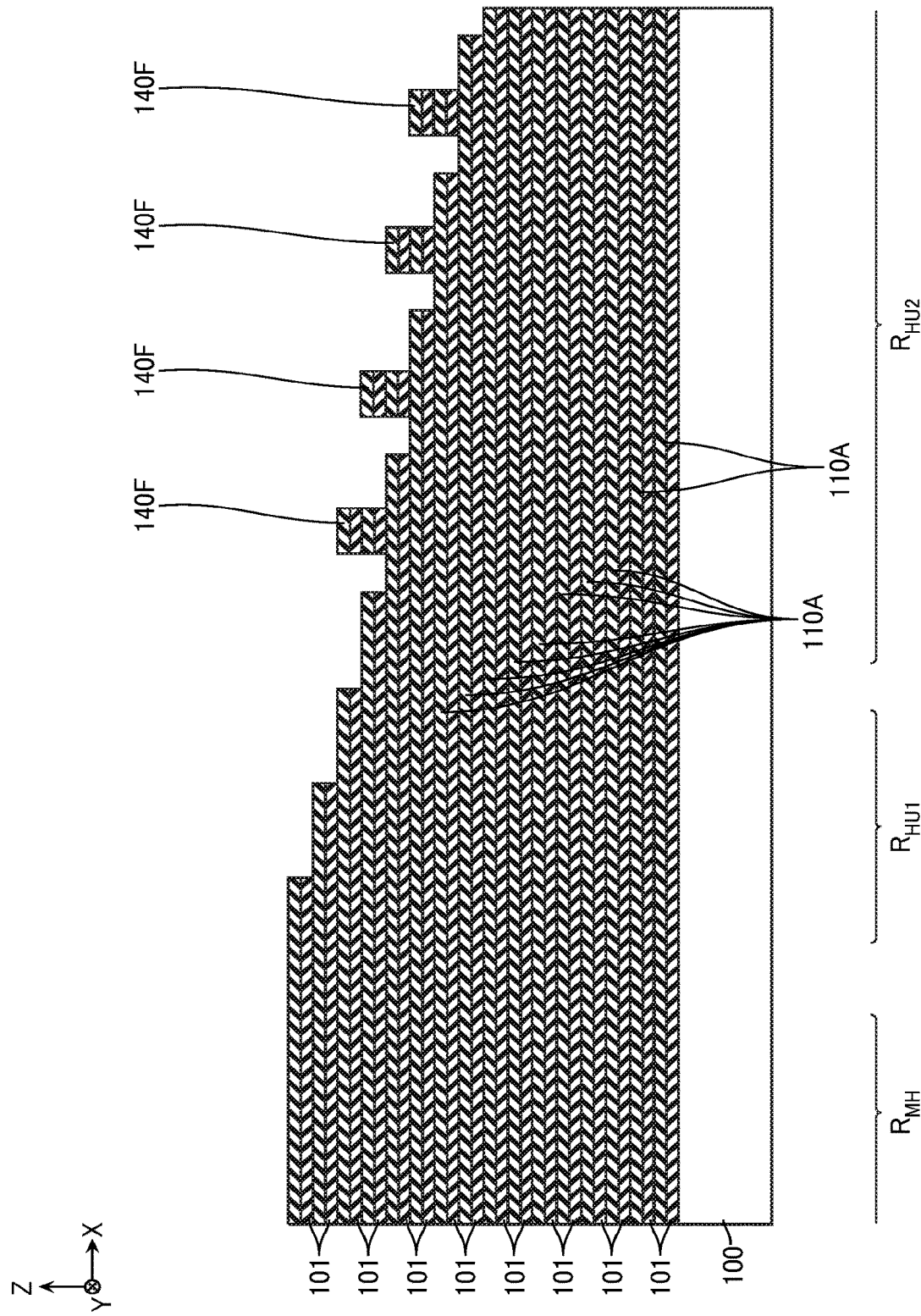
FIG. 61 is a schematic cross-sectional view illustrating the manufacturing method.

Next, the process of removing a part of the resist 151 and the process of performing the removal of the sacrifice layer 110A and the removal of the insulating layer 101 once for each are repeatedly performed. The processes described with reference to FIG. 27 to FIG. 31 are performed. Thus, the structure as illustrated in FIG. 61 is formed.

Figure 62:
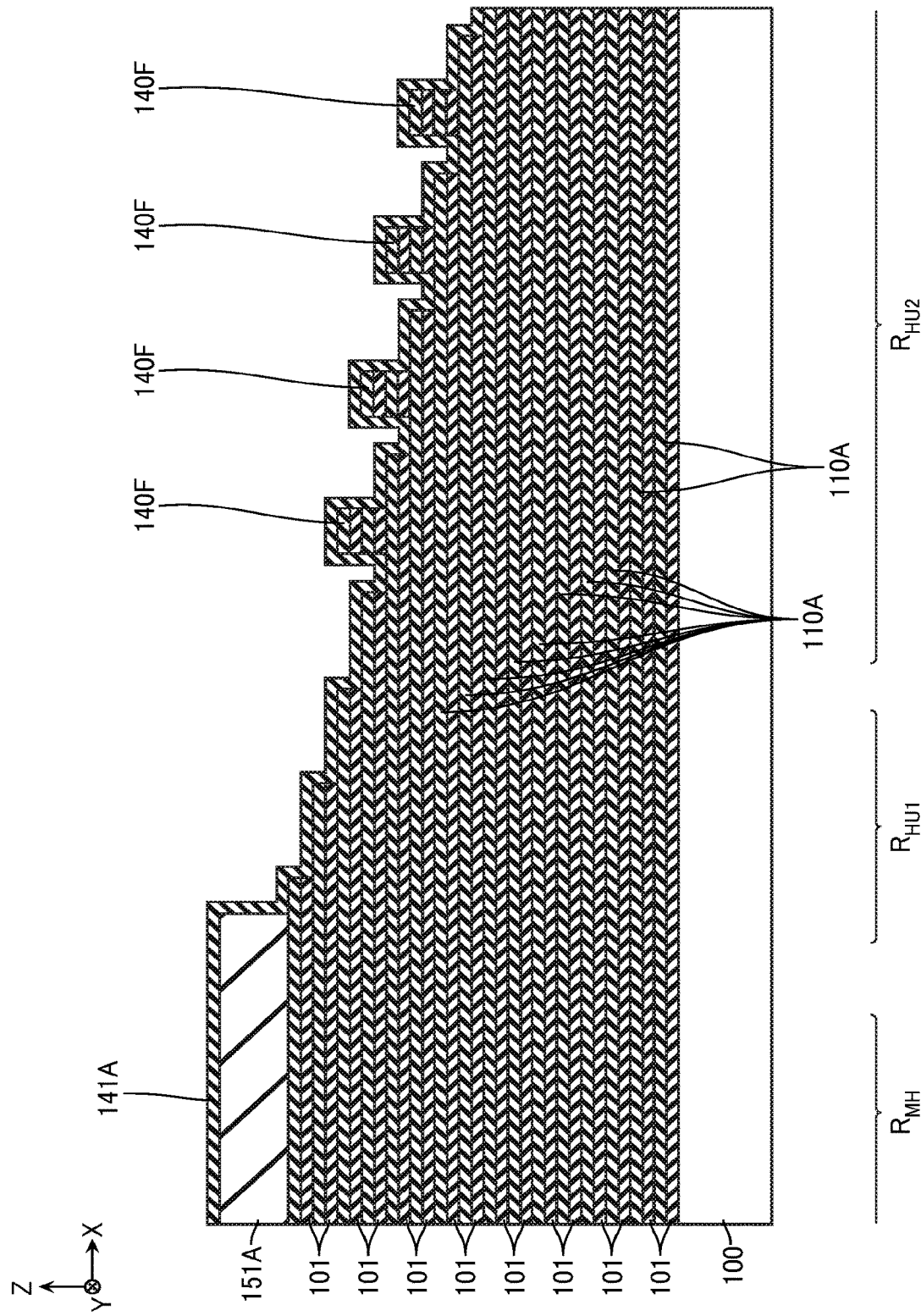
FIG. 62 is a schematic cross-sectional view illustrating the manufacturing method.

Next, for example, as illustrated in FIG. 62, a resist 151A is formed in the memory hole region $R_{MH}$. As illustrated in FIG. 62, a sacrifice layer 141A is formed.

Next, a resist 151B is formed over the memory hole region $R_{MH}$, the first hook-up region $R_{HU1}$, and the second hook-up region $R_{HU2}$.

Figure 63:
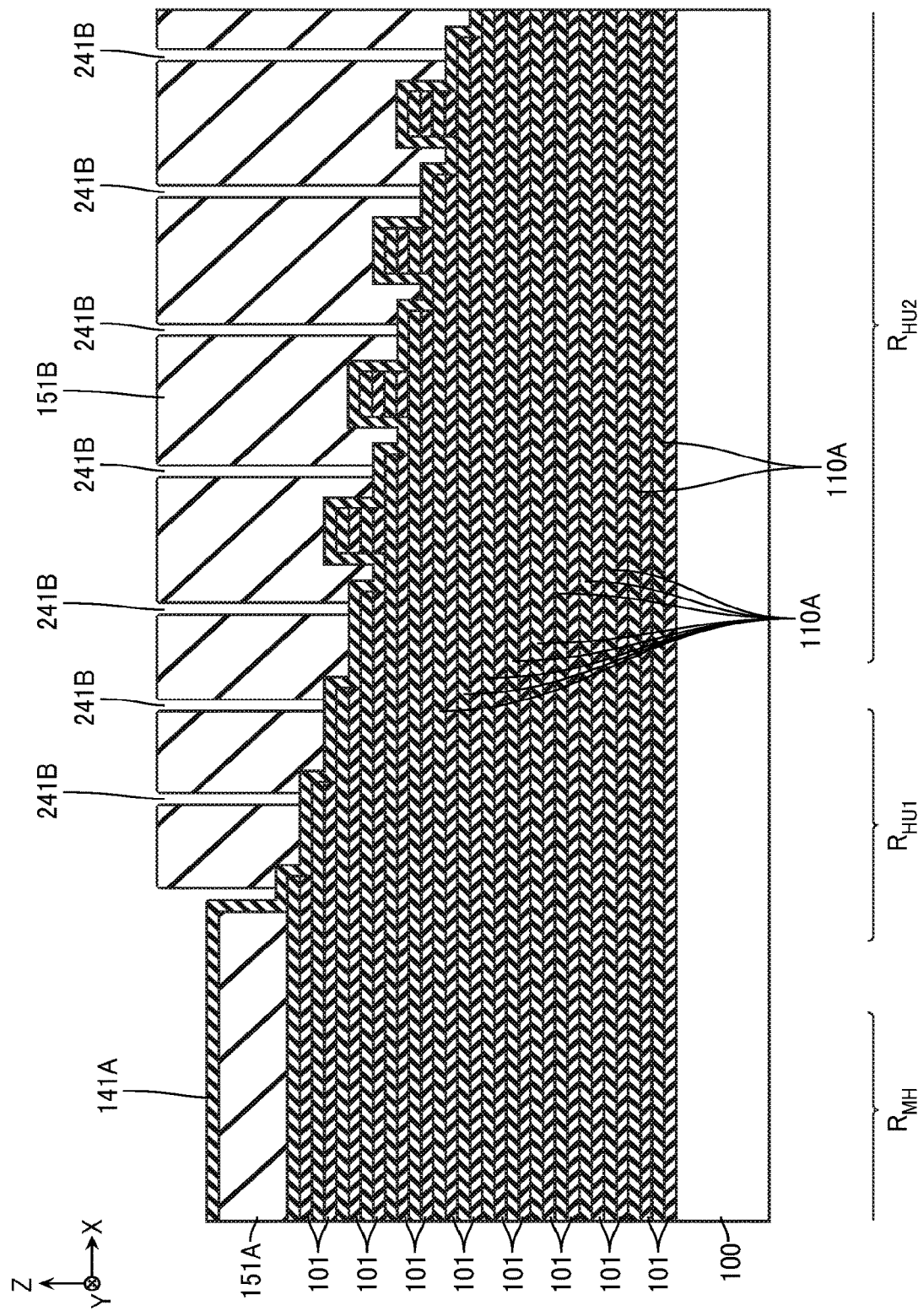
FIG. 63 is a schematic cross-sectional view illustrating the manufacturing method.

Next, for example, as illustrated in FIG. 63, a part of the resist 151B covering the upper surface and the side surface in the X-direction of the resist 151A is removed. A plurality of openings 241B are provided to the resist 151B. The plurality of openings 241B extend in the Y-direction, and are arranged in the X-direction. The plurality of openings 241B expose parts of the sacrifice layer 141A disposed in regions corresponding to regions between the edge portions 113, 116 (FIG. 56, FIG. 57) of the conductive layers 210 and the conductive portions 211, 212 (FIG. 56, FIG. 57).

Figure 64:
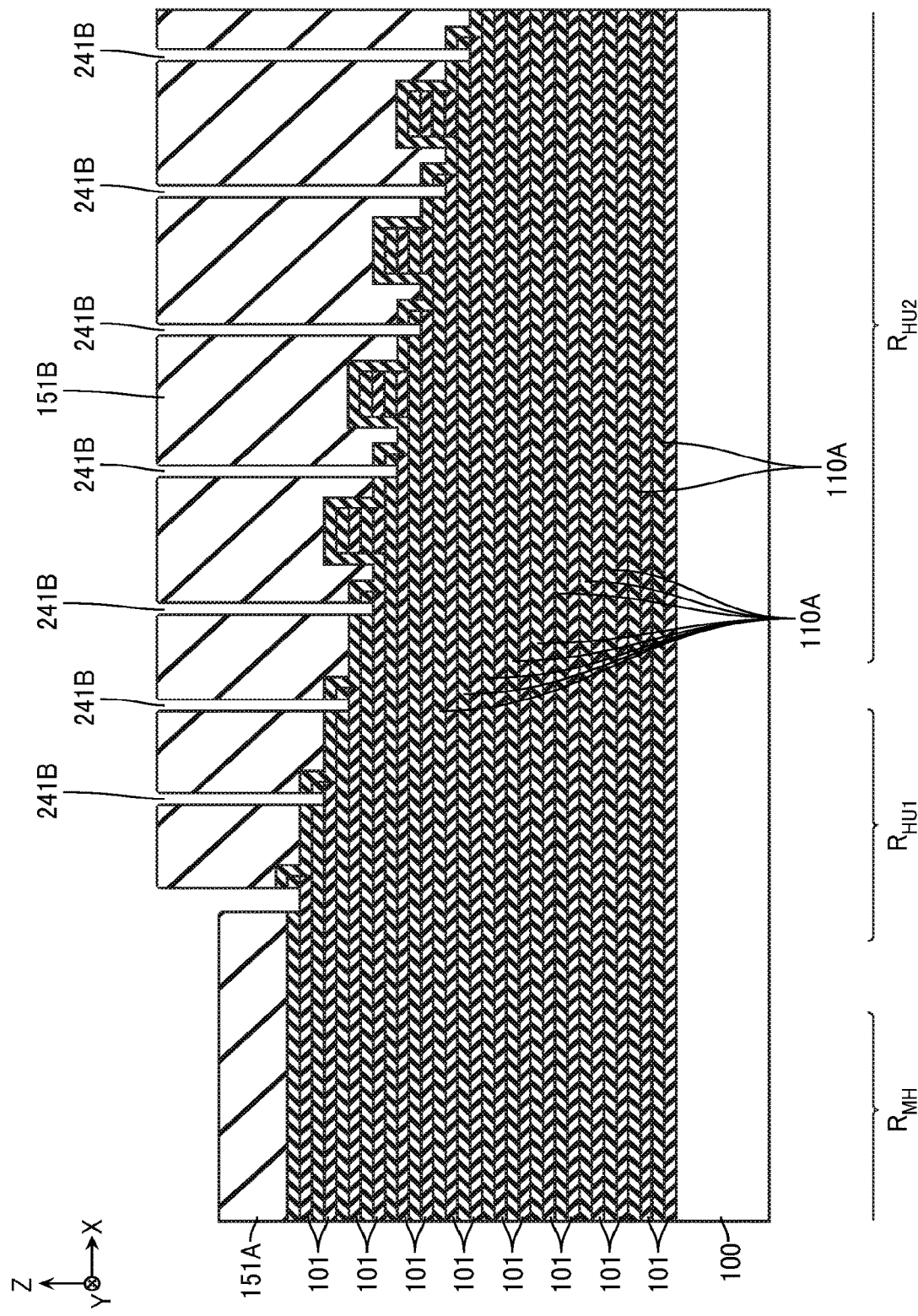
FIG. 64 is a schematic cross-sectional view illustrating the manufacturing method.

Next, for example, as illustrated in FIG. 64, in the sacrifice layer 141A, parts covering the upper surface and the side surface in the X-direction of the resist 151A are removed. In the sacrifice layers 110A, 141A, parts disposed in regions in the proximity of the edge portions 113, 116 (FIG. 56, FIG. 57) of the terrace portions T (FIG. 56, FIG. 57) in the conductive layers 210 are removed. This process is performed by a method, such as isotropic or anisotropic wet etching or isotropic or anisotropic dry etching.

Figure 65:
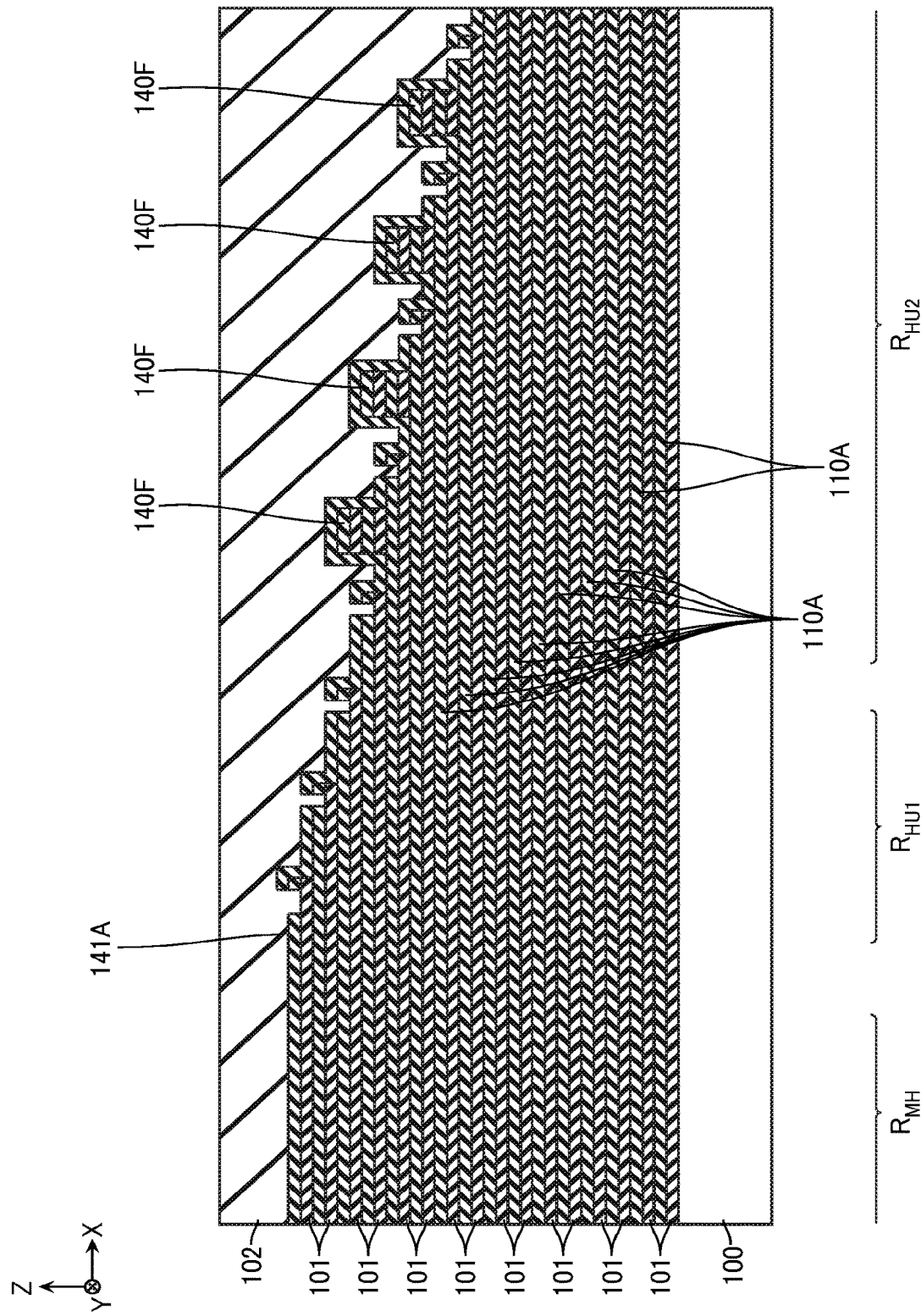
FIG. 65 is a schematic cross-sectional view illustrating the manufacturing method.

Next, for example, as illustrated in FIG. 65, the resists 151A, 151B are removed. An insulating layer 102 is formed. This process is performed by a method such as CVD.

Figure 66:
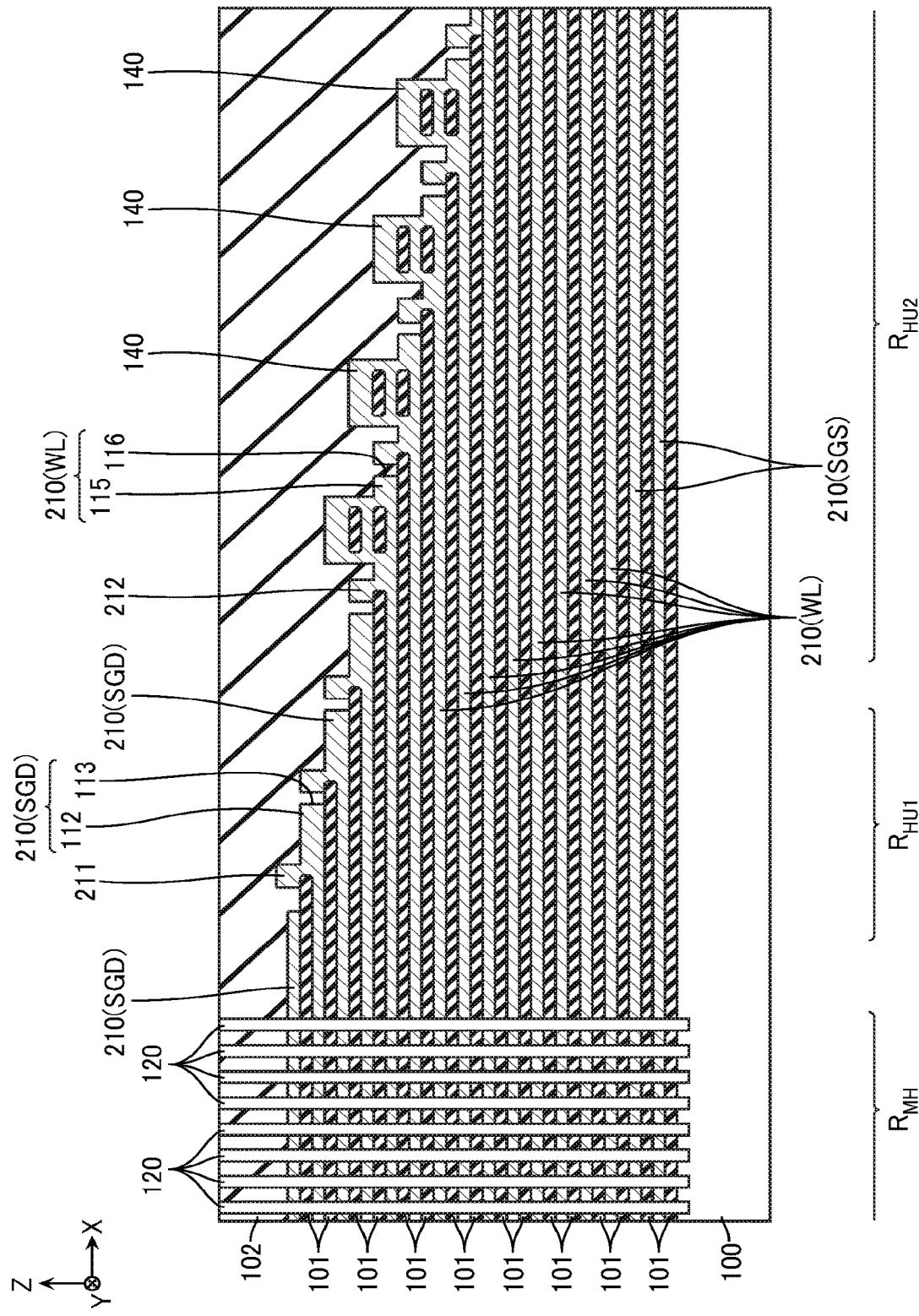
FIG. 66 is a schematic cross-sectional view illustrating the manufacturing method.

Next, the processes described with reference to, for example, FIG. 42 to FIG. 49 are performed. Thus, the structure as illustrated in FIG. 66 is formed.

Then, in the method for manufacturing the semiconductor memory device according to the first embodiment, the process described with reference to FIG. 50 and the following processes are performed.

[Effects of Semiconductor Memory Device According to Second Embodiment]

According to the semiconductor memory device according to the second embodiment, similarly to the semiconductor memory device according to the first embodiment, the conductive layer 210 can be appropriately connected to the peripheral circuit PC, and short-circuiting between the two conductive layers 210 mutually adjacent in the Z-direction can be suppressed.

In the manufacture of the semiconductor memory device according to the first embodiment, in the process described with reference to FIG. 38 and FIG. 39, not only a part of the sacrifice layer 141A, but also parts of the sacrifice layers 110A corresponding to the end portions in the memory hole region $R_{MH}$ side of the terrace portions T of the conductive layers 110 are etched in some cases. In this case, in the manufactured semiconductor memory device, the length in the Z-direction of the end portion in the memory hole region $R_{MH}$ side of the terrace portion T of the conductive layer 110 is possibly decreased. In this structure, a resistance value between the part of the conductive layers 110 disposed in the memory hole region $R_{MH}$ and the contact CC possibly increases. A current density increases at the end portion of the terrace portion T, thus possibly causing electromigration to progress.

Meanwhile, in the manufacture of the semiconductor memory device according to the second embodiment, the process described with reference to FIG. 38 and FIG. 39 is not performed. Therefore, the parts of the sacrifice layers 110A corresponding to the end portions of the terrace portions T of the conductive layers 210 in the memory hole region $R_{MH}$ side are not etched. Accordingly, the increase of the resistance value and the progress of the electromigration as described above can be suppressed.

Other Embodiments

The semiconductor memory devices according to the first embodiment and the second embodiment have been described above. However, the semiconductor memory devices according to these embodiments are merely examples, and specific configuration, operation, and the like are adjustable as necessary.

For example, in the first embodiment and the second embodiment, as described with reference to FIG. 4 and FIG. 6, the structure 140 includes the approximately plate-shaped conductive portions 141, 142, the pair of conductive portions 143 (FIG. 4) connected to respective both end portions of the conductive portions 141, 142 in the X-direction, and the pair of conductive portions 144 (FIG. 6) connected to respective both end portions of the conductive portions 141, 142 in the Y-direction.

However, this configuration is merely an example, and the specific configuration is adjustable as necessary. FIG. 67 to FIG. 74 are schematic cross-sectional views illustrating configurations of semiconductor memory devices according to other embodiments.

Figure 67:
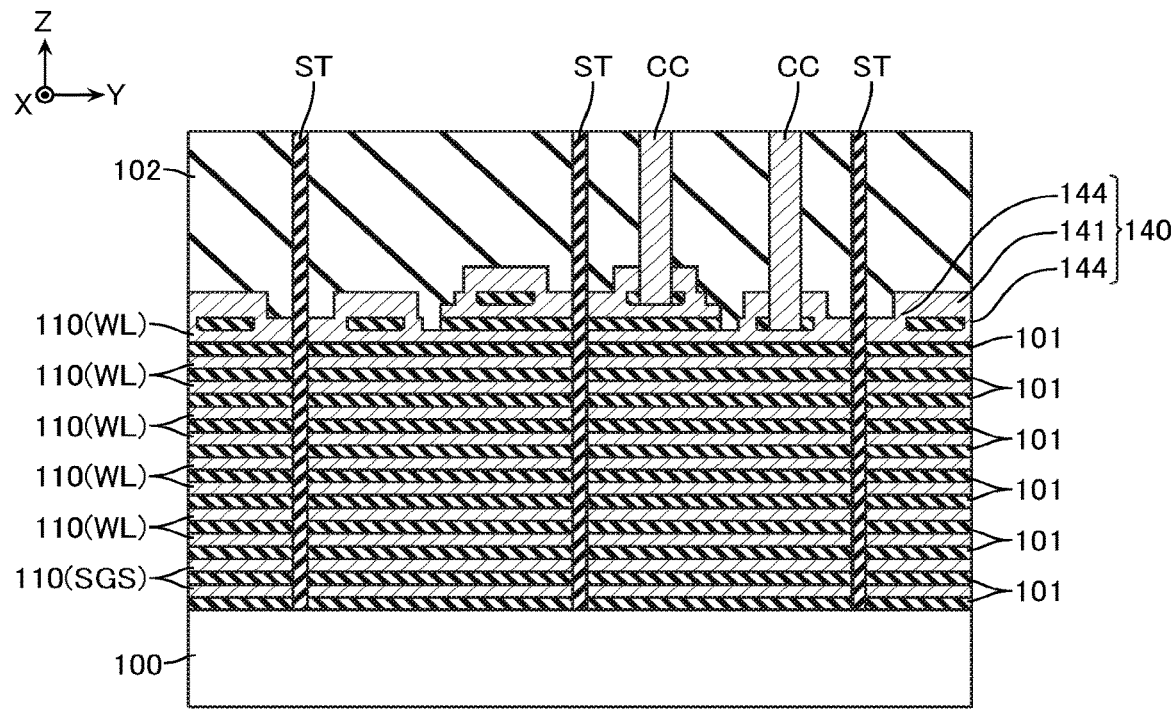
FIG. 67 is a schematic cross-sectional view illustrating a part of a configuration of a semiconductor memory device according to another embodiment.
Figure 68:
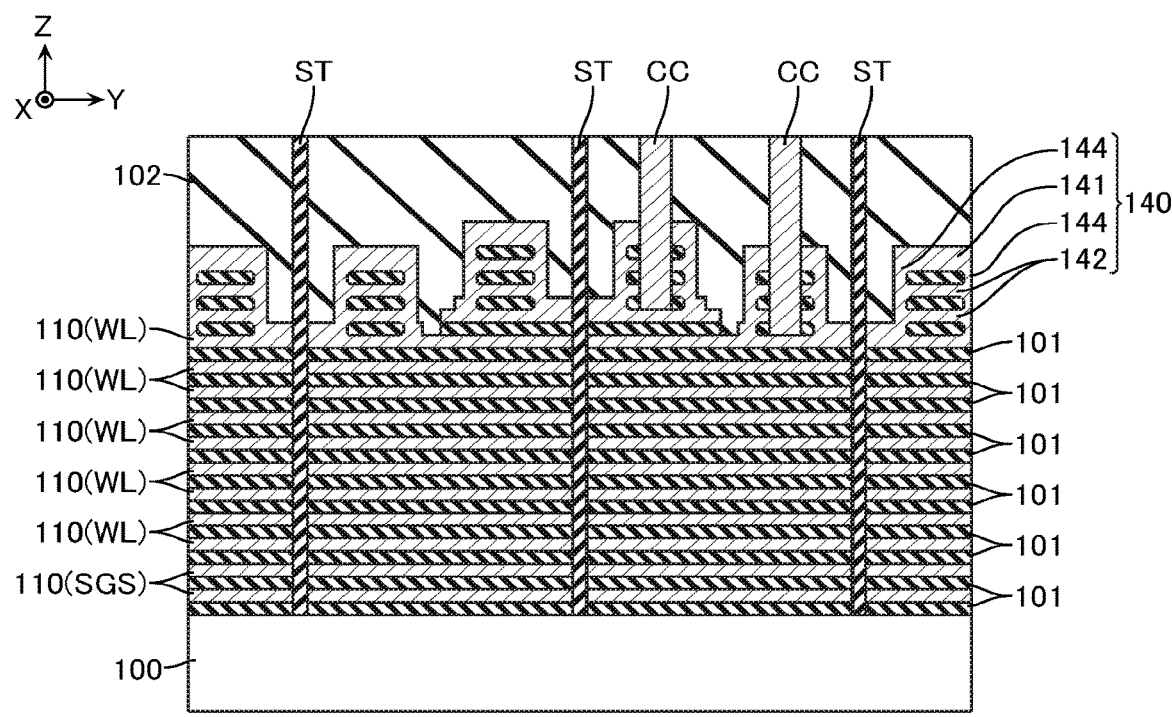
FIG. 68 is a schematic cross-sectional view illustrating a part of a configuration of a semiconductor memory device according to another embodiment.

For example, as illustrated in FIG. 67, the structure 140 does not need to include the conductive portion 142. For example, as illustrated in FIG. 68, the structure 140 may include two or more conductive portions 142 arranged in the Z-direction. In this case, each of these two or more conductive portions 142 may be disposed at a height position corresponding to any of the conductive layers 110.

Figure 69:
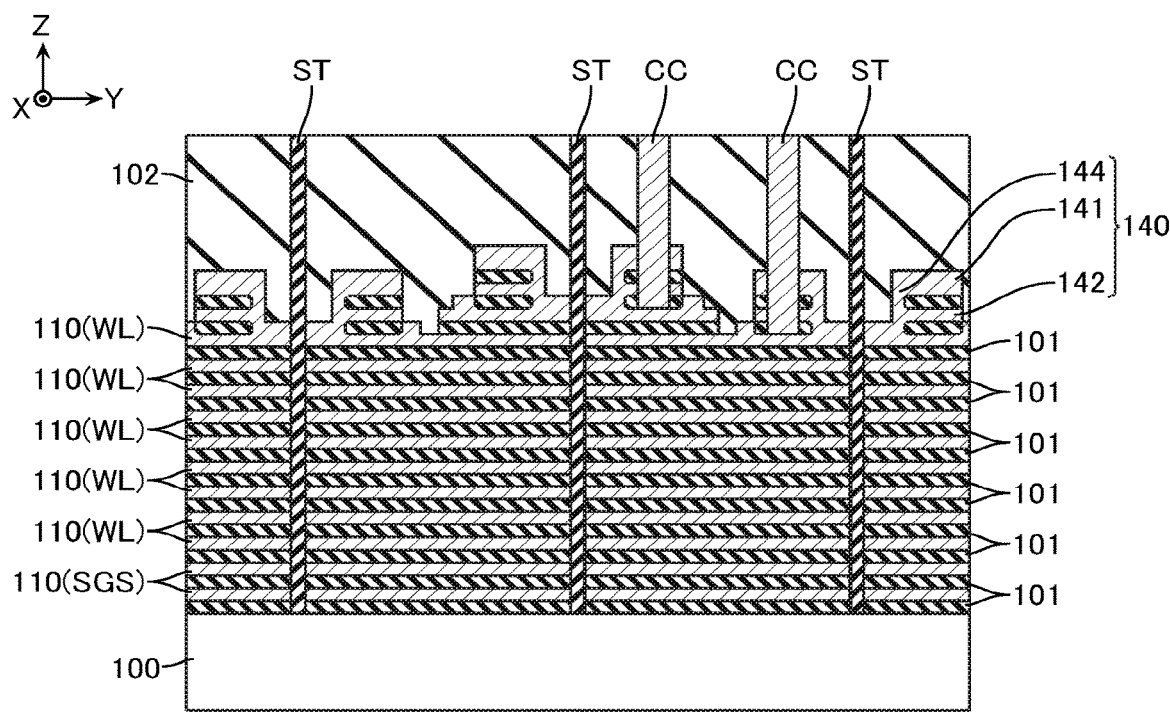
FIG. 69 is a schematic cross-sectional view illustrating a part of a configuration of a semiconductor memory device according to another embodiment.

For example, as illustrated in FIG. 69, one or both of the pair of conductive portions 144 connected to respective both end portions of the conductive portions 141, 142 in the Y-direction can be omitted. In the example of FIG. 69, in the two conductive portions 144 in the structure 140, one positioned in the opening 152B side (one positioned in the opposite side of the inter-finger structure ST) in the process described with reference to FIG. 37 is partially omitted. In the manufacture of this structure, for example, a part of the structure 140F is exposed from the opening 152B in the process described with reference to FIG. 37. Parts of the sacrifice layer 141A including the parts corresponding to the exposed portions of the structures 140F are removed in the process described with reference to FIG. 39.

Figure 70:
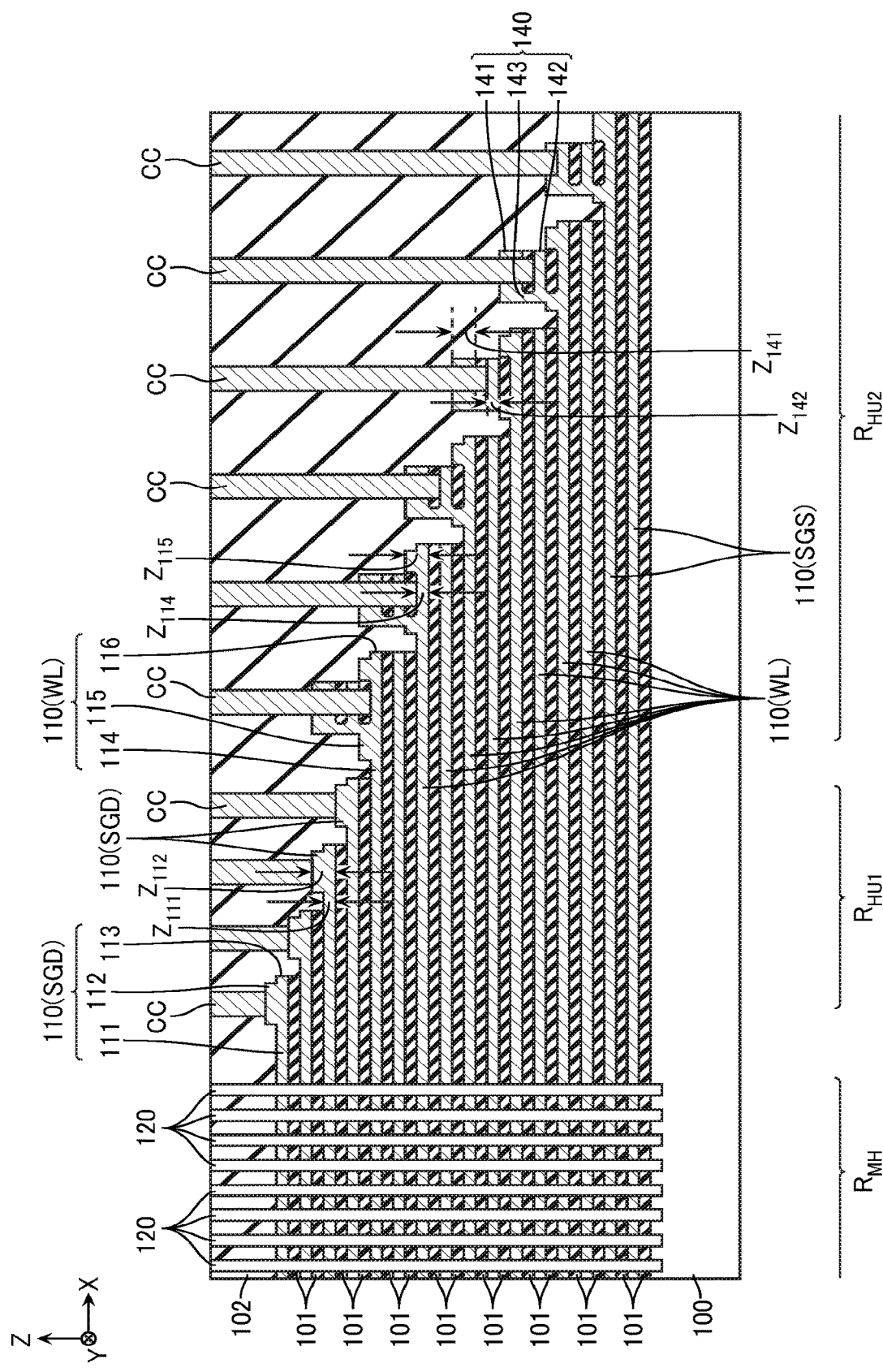
FIG. 70 is a schematic cross-sectional view illustrating a part of a configuration of a semiconductor memory device according to another embodiment.

For example, as illustrated in FIG. 70, one or both of the pair of conductive portions 143 connected to respective both end portions of the conductive portions 141, 142 in the X-direction can be omitted. In the example of FIG. 70, in the two conductive portions 143 in the structure 140, one positioned in the edge portion 116 side of the corresponding conductive layer 110 is omitted. In the manufacture of this structure, for example, a part of the structure 140F is exposed from the opening 152A in the process described with reference to FIG. 36. Parts of the sacrifice layer 141A including the parts corresponding to the exposed portions of the structures 140F are removed in the process described with reference to FIG. 38.

For example, in the first embodiment, as described with reference to FIG. 3, FIG. 4, and FIG. 6, the structures 140 are disposed corresponding to all of the conductive layers 110 (WL) and all of the conductive layers 110 (SGS).

However, this configuration is merely an example, and the specific configuration is adjustable as necessary.

Figure 71:
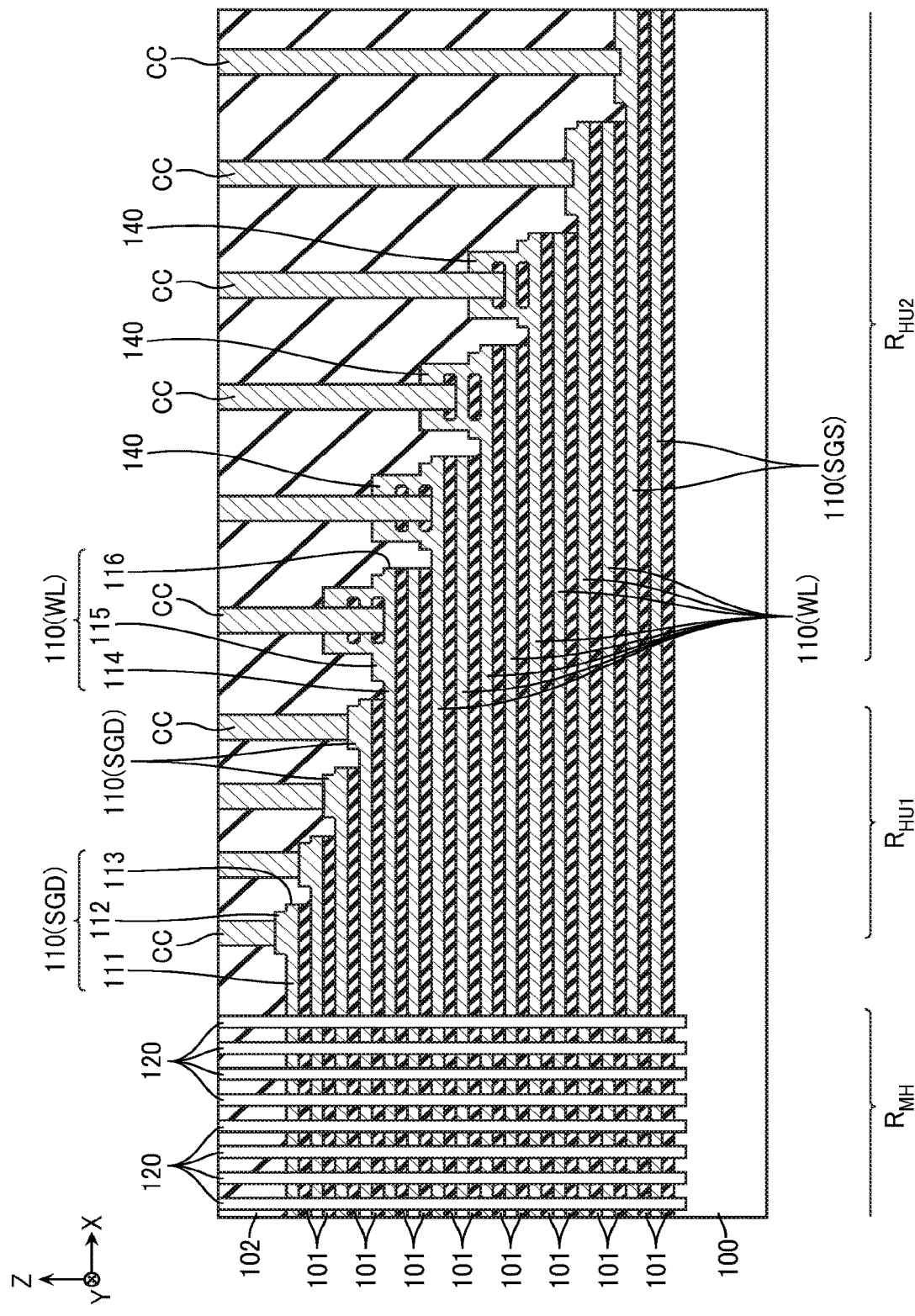
FIG. 71 is a schematic cross-sectional view illustrating a part of a configuration of a semiconductor memory device according to another embodiment.

For example, as illustrated in FIG. 71, the structures 140 corresponding to a part of the conductive layers 110 (WL) may be left, and the structures 140 corresponding to the other conductive layers 110 (WL) may be omitted. The structures 140 corresponding to the conductive layers 110 (SGS) may be omitted. While the illustration is omitted, the structures 140 may be disposed corresponding to a part of the conductive layers 110 (SGD).

In the first embodiment and the second embodiment, as described with reference to FIG. 2, the two first hook-up regions $R_{HU1}$ arranged in the X-direction are disposed between the two second hook-up regions $R_{HU2}$ arranged in the X-direction. Furthermore, the memory hole region $R_{MH}$ is disposed between the two first hook-up regions $R_{HU1}$ arranged in the X-direction.

However, this configuration is merely an example, and the specific configuration is adjustable as necessary.

Figure 72:
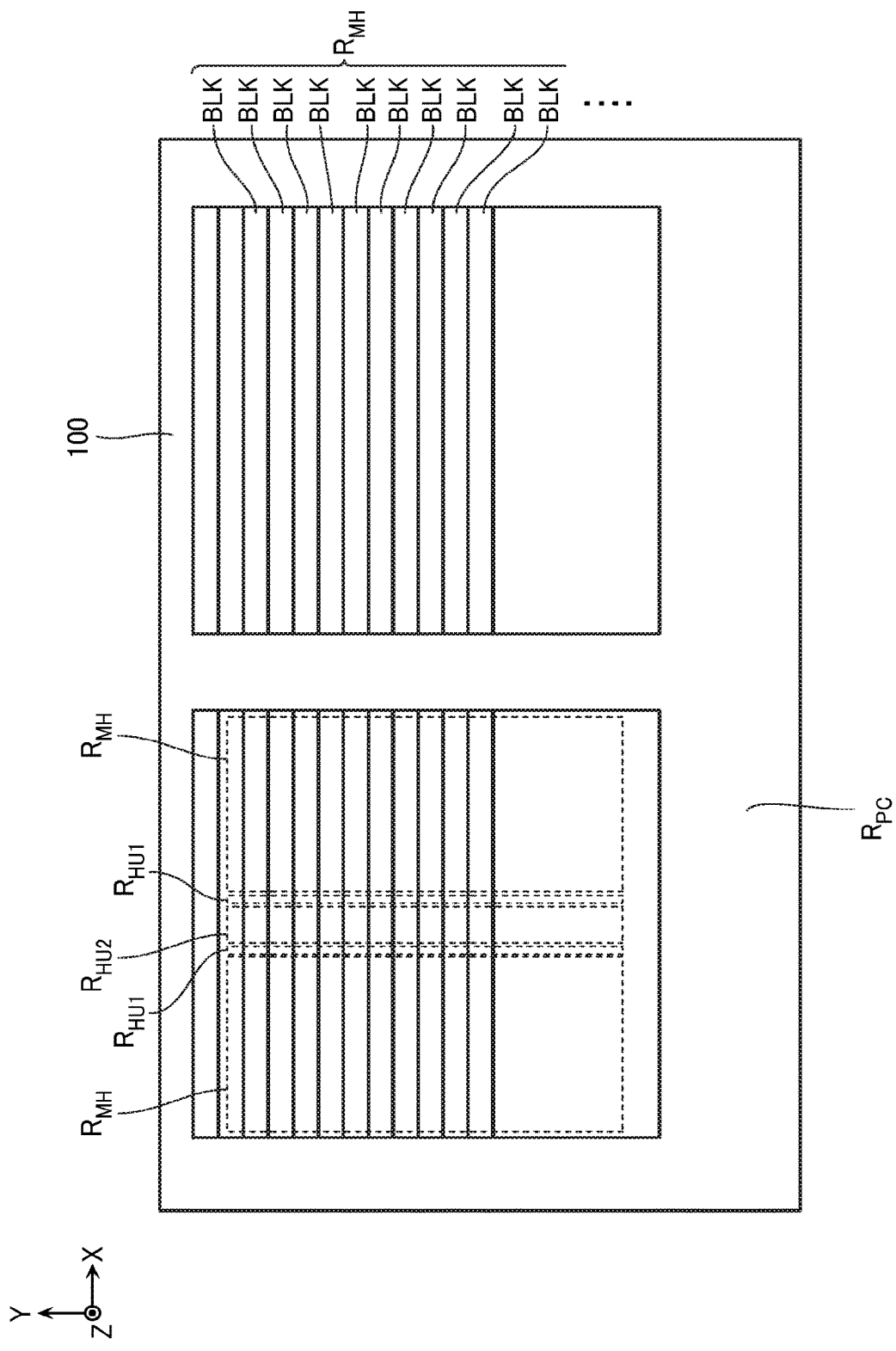
FIG. 72 is a schematic plan view illustrating a part of a configuration of a semiconductor memory device according to another embodiment.

For example, as illustrated in FIG. 72, the two first hook-up regions $R_{HU1}$ arranged in the X-direction may be disposed between the two memory hole regions $R_{MH}$ arranged in the X-direction. The second hook-up region $R_{HU2}$ may be disposed between the two first hook-up regions $R_{HU1}$ arranged in the X-direction.

Figure 73:
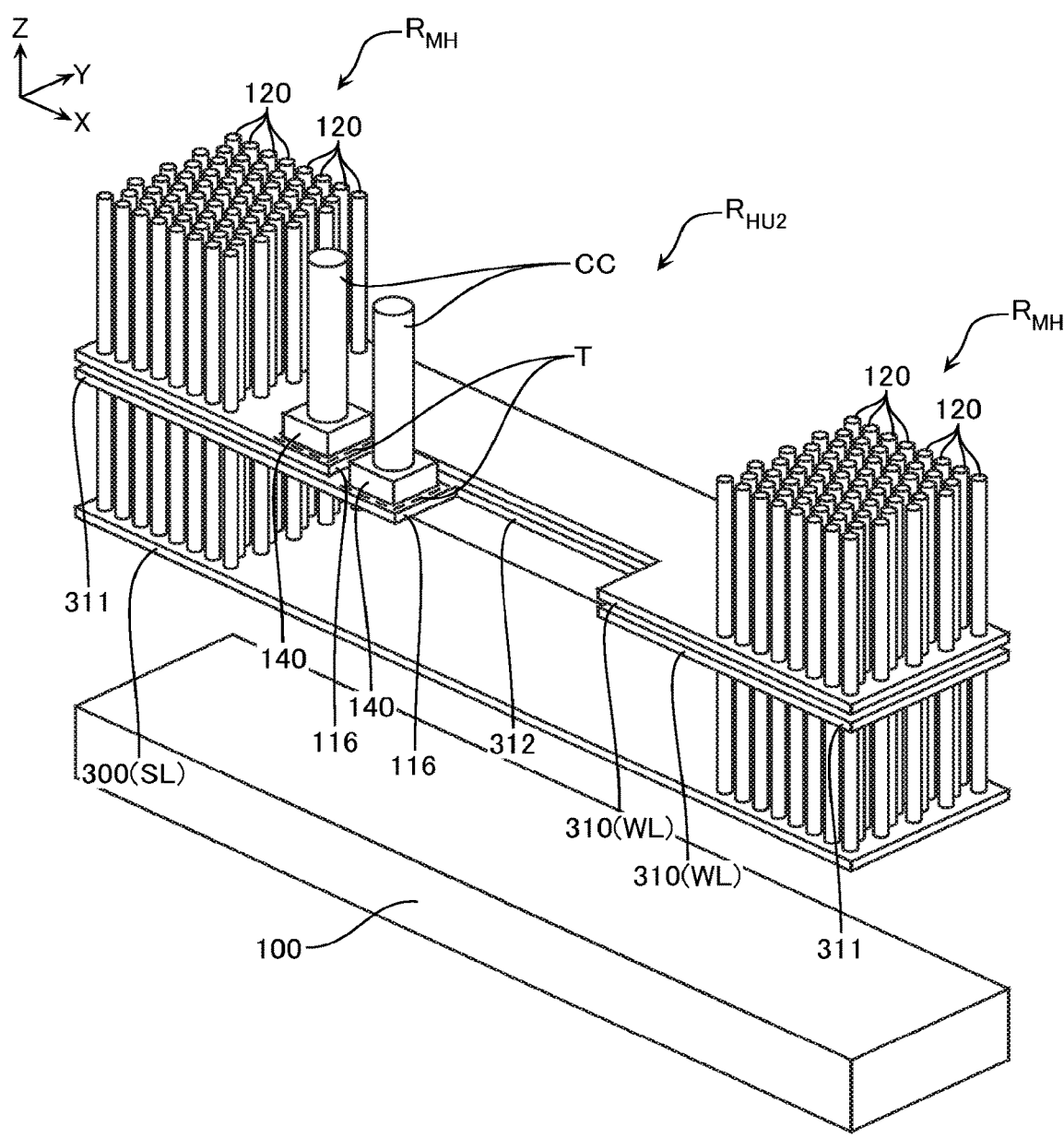
FIG. 73 is a schematic perspective view illustrating a part of a configuration of a semiconductor memory device according to another embodiment.

In this case, for example, as illustrated in FIG. 73, the finger structure FS may include a plurality of conductive layers 310 arranged in the Z-direction instead of the plurality of conductive layers 110 arranged in the Z-direction. FIG. 73 illustrates only a part of the conductive layers 310.

The conductive layer 310 may include two parts 311 corresponding to the two memory hole regions $R_{MH}$ and a part 312 connected to these two parts 311. The part 312 may include the terrace portion T. In the illustrated example, the two contacts CC are arranged in the X-direction via the edge portion 116 of the conductive layer 310. The structure 140 is disposed at the terrace portion T of the corresponding conductive layer 310. The edge portion 116 of the conductive layer 310 is disposed between the two parts 311 arranged in the X-direction, and does not match the end portion of the conductive layer 310 in the X-direction.

In the example of FIG. 73, a conductive layer 300 that functions as the source line SL is disposed above the semiconductor substrate 100. The lower end portions of the semiconductor layers 120 are connected to this conductive layer 300.

In the above description, the terrace portions T are disposed on the upper surfaces of the conductive layers 110, 210, 310, and the contacts CC extend in the Z-direction above the terrace portions T. The structures 140 are connected to the terrace portions T and the lower end portions of the contacts CC.

However, this configuration is merely an example, and the specific configuration is adjustable as necessary.

Figure 74:
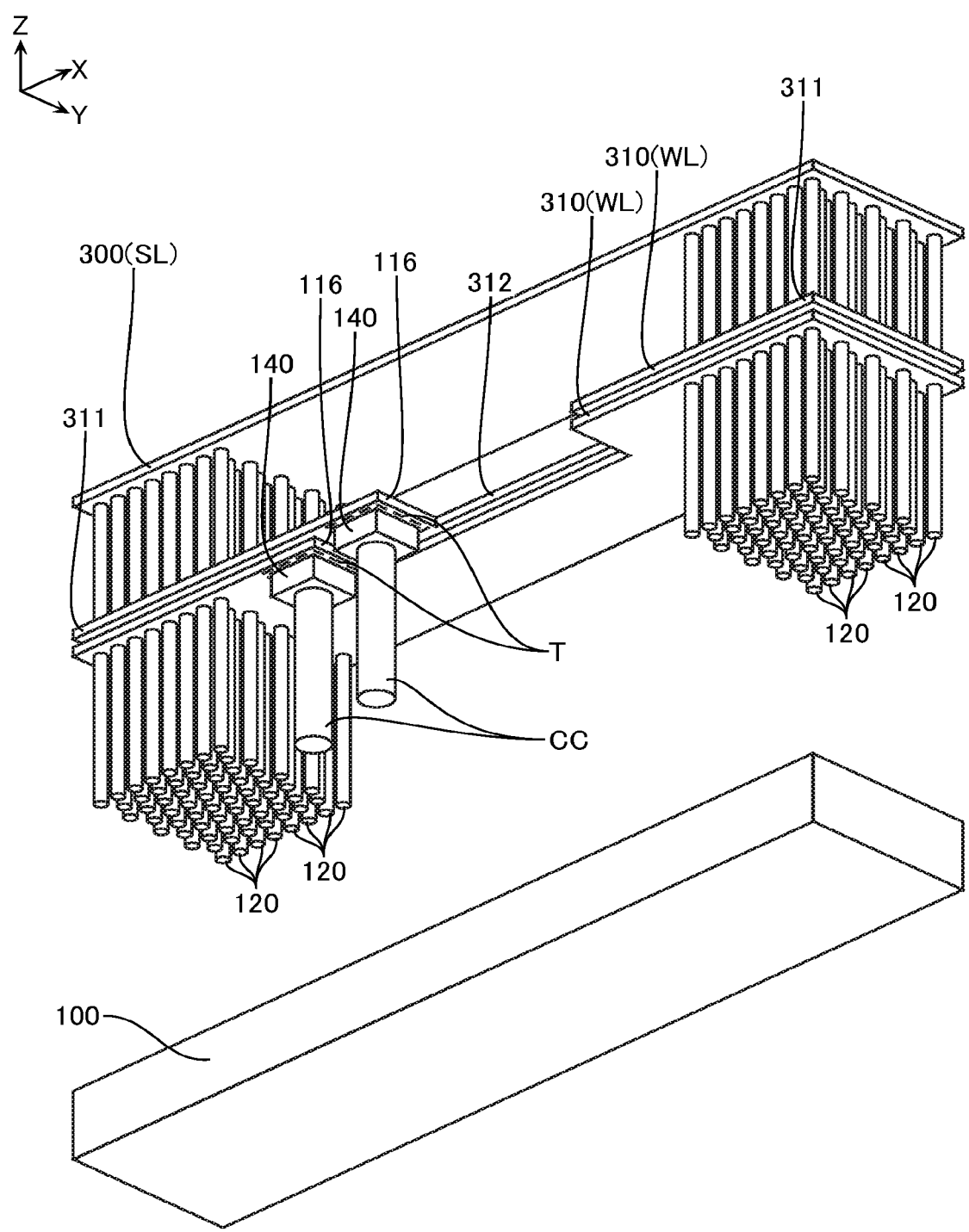
FIG. 74 is a schematic perspective view illustrating a part of a configuration of a semiconductor memory device according to another embodiment.

For example, in the example of FIG. 74, the terrace portions T are disposed on the lower surfaces of the conductive layers 310, and the contacts CC extend in the Z-direction below the terrace portions T. The structures 140 are connected to the terrace portions T and the upper end portions of the contacts CC. In this case, the terrace portions T are portions in the lower surfaces of the conductive layers 310 not overlapping with the other conductive layers 310 viewed from below.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate including a first region and a second region arranged in a first direction;
   a plurality of conductive layers and a plurality of insulating layers alternately arranged in a second direction intersecting with a surface of the substrate and extending in the first direction across the first region and the second region;
   a semiconductor layer disposed in the first region, extending in the second direction, and opposed to the plurality of conductive layers;
   an electric charge accumulating film disposed between the plurality of conductive layers and the semiconductor layer;
   a plurality of contact electrodes disposed in the second region, extending in the second direction, and electrically connected to the plurality of conductive layers; and
   a first structure connected to one end portion in the second direction of a first contact electrode which is one of the plurality of contact electrodes and connected to a terrace portion of a first conductive layer which is one of the plurality of conductive layers, wherein
   the first structure includes:
      a first conductive portion extending in the first direction;
      an intermediate conductive portion disposed between the first conductive layer and the first conductive portion and extending in the first direction;
      a second conductive portion extending in the second direction and connected to one end portion of the first conductive portion in the first direction, one end portion of the intermediate conductive portion in the first direction, and the first conductive layer; and a third conductive portion extending in the second direction and connected to the other end portion of the first conductive portion in the first direction, the other end portion of the intermediate conductive portion in the first direction, and the first conductive layer, and the intermediate conductive portion is disposed at a position corresponding to a second conductive layer in the second direction, the second conductive layer being another one of the plurality of conductive layers positioned closer to the other end portion of the first contact electrode than the first conductive layer in the second direction, the second conductive layer being adjacent to the first conductive layer in the second direction.

2. The semiconductor memory device according to claim 1, wherein
a length of the first conductive portion in the second direction is larger than a length of the second conductive portion in the first direction.

3. The semiconductor memory device according to claim 1, wherein
the first structure further includes a fourth conductive portion extending in the second direction and connected to one end portion of the first conductive portion in a third direction intersecting with the first direction and the second direction, one end portion of the intermediate conductive portion in the third direction, and the first conductive layer.

4. The semiconductor memory device according to claim 3, wherein
a length of the first conductive portion in the second direction is larger than a length of the fourth conductive portion in the third direction.

5. The semiconductor memory device according to claim 1, wherein
a length of the first conductive portion in the second direction is larger than a length of the intermediate conductive portion in the second direction.

6. The semiconductor memory device according to claim 1, wherein
the plurality of conductive layers further include a third conductive layer positioned closer to the other end portion of the first contact electrode than the second conductive layer in the second direction, and
a surface of the first conductive portion in the first conductive layer side in the second direction is disposed at a position corresponding to a surface of the third conductive layer in the first conductive layer side in the second direction.

7. The semiconductor memory device according to claim 1, wherein
a length of the first conductive portion in the second direction is larger than a length of the first conductive layer in the second direction.

8. The semiconductor memory device according to claim 1, wherein
a fifth conductive portion is disposed at a position corresponding to a terrace portion of the second conductive layer in the second direction, the fifth conductive portion being separated from the second conductive layer while being connected to the first conductive layer between the second conductive layer and the first contact electrode in the first direction.

9. The semiconductor memory device according to claim 1, further comprising:
a second structure disposed in the second region, extending in the second direction, and having an outer peripheral surface connected to the first conductive layer, the first conductive portion, and the intermediate conductive portion.

10. A semiconductor memory device comprising:
a substrate including a first region and a second region arranged in a first direction;
a plurality of conductive layers and a plurality of insulating layers alternately arranged in a second direction intersecting with a surface of the substrate and extending in the first direction across the first region and the second region;
a semiconductor layer disposed in the first region, extending in the second direction, and opposed to the plurality of conductive layers;
an electric charge accumulating film disposed between the plurality of conductive layers and the semiconductor layer;
a plurality of contact electrodes disposed in the second region, extending in the second direction, and electrically connected to the plurality of conductive layers; and
a first structure connected to one end portion in the second direction of a first contact electrode which is one of the plurality of contact electrodes and a terrace portion of a first conductive layer which is one of the plurality of conductive layers, wherein
the first structure includes:
a first conductive portion extending in the first direction;
an intermediate conductive portion disposed between the first conductive layer and the first conductive portion and extending in the first direction; and
a second conductive portion extending in the second direction and connected to the first conductive portion, the intermediate conductive portion, and the first conductive layer,
both end portions of the first structure in a third direction intersecting with the first direction and the second direction are disposed between both end portions of the terrace portion of the first conductive layer in the third direction viewed in the second direction, and
the intermediate conductive portion is disposed at a position corresponding to a second conductive layer in the second direction, the second conductive layer being another one of the plurality of conductive layers positioned closer to the other end portion of the first contact electrode than the first conductive layer in the second direction, the second conductive layer being adjacent to the first conductive layer in the second direction.

11. The semiconductor memory device according to claim 10, wherein
both end portions of the first structure in the first direction are disposed between both end portions of the terrace portion of the first conductive layer in the first direction viewed in the second direction.

12. The semiconductor memory device according to claim 10, wherein
the first structure further includes a third conductive portion extending in the second direction and connected to the first conductive portion, the intermediate conductive portion, and the first conductive layer,
the second conductive portion is connected to one end portion of the first conductive portion in the third direction, one end portion of the intermediate conductive portion in the third direction, and the first conductive layer, and the third conductive portion is connected to the other end portion of the first conductive portion in the third direction, the other end portion of the intermediate conductive portion in the third direction, and the first conductive layer.

13. The semiconductor memory device according to claim 10, wherein
the plurality of conductive layers further include a third conductive layer positioned closer to the other end portion of the first contact electrode than the second conductive layer in the second direction, and
a surface of the first conductive portion in the first conductive layer side in the second direction is disposed at a position corresponding to a surface of the third conductive layer in the first conductive layer side in the second direction.

14. The semiconductor memory device according to claim 10, wherein
a length of the first conductive portion in the second direction is larger than a length of the first conductive layer in the second direction.

15. The semiconductor memory device according to claim 10, wherein
a fourth conductive portion is disposed at a position corresponding to a terrace portion of the second conductive layer in the second direction, the fourth conductive portion being separated from the second conductive layer while being connected to the first conductive layer between the second conductive layer and the first contact electrode in the first direction.

16. The semiconductor memory device according to claim 10, further comprising:
a second structure disposed in the second region, extending in the second direction, and having an outer peripheral surface connected to the first conductive layer, first conductive portion, and the intermediate conductive portion.

17. The semiconductor memory device according to claim 1, wherein
a length of the intermediate conductive portion in the second direction is substantially same as a length of the second conductive layer in the second direction.

18. The semiconductor memory device according to claim 10, wherein
a length of the intermediate conductive portion in the second direction is substantially same as a length of the second conductive layer in the second direction.

19. The semiconductor memory device according to claim 1, wherein
the plurality of insulating layers include:
a first insulating layer disposed on one surface in the second direction of the second conductive layer; and
a second insulating layer disposed on the other surface in the second direction of the second conductive layer,
a part of the first insulating layer is disposed between the first conductive layer and the intermediate conductive portion, and
a part of the second insulating layer is disposed between the intermediate conductive portion and the first conductive portion.

20. The semiconductor memory device according to claim 10, wherein
the plurality of insulating layers include:
a first insulating layer disposed on one surface in the second direction of the second conductive layer; and
a second insulating layer disposed on the other surface in the second direction of the second conductive layer,
a part of the first insulating layer is disposed between the first conductive layer and the intermediate conductive portion, and
a part of the second insulating layer is disposed between the intermediate conductive portion and the first conductive portion.

\* \* \* \* \*